(12) United States Patent
Ioannidis

(10) Patent No.: US 8,625,283 B2
(45) Date of Patent: Jan. 7, 2014

(54) SYSTEM AND METHODS FOR IMPROVING POWER HANDLING OF AN ELECTRONIC DEVICE

(75) Inventor: Dimitrios Ioannidis, Erie, PA (US)

(73) Assignee: General Electric Company, Schenectady, NY (US)

( * ) Notice: Subject to any disclaimer, the term of this patent is extended or adjusted under 35 U.S.C. 154(b) by 298 days.

(21) Appl. No.: 13/037,300

(22) Filed: Feb. 28, 2011

(65) Prior Publication Data
US 2012/0218710 A1    Aug. 30, 2012

(51) Int. Cl.
*H05K 7/20*    (2006.01)
(52) U.S. Cl.
USPC ........... 361/709; 361/694; 361/695; 361/697; 700/300
(58) Field of Classification Search
USPC .................. 361/694, 695, 697, 709; 327/513; 700/300; 702/132
See application file for complete search history.

(56) References Cited

U.S. PATENT DOCUMENTS

| | | | | |
|---|---|---|---|---|
| 6,160,696 A * | 12/2000 | Bailey et al. | ................... | 361/115 |
| 6,601,168 B1 * | 7/2003 | Stancil et al. | ................. | 713/100 |
| 7,334,418 B2 * | 2/2008 | Henry et al. | ..................... | 62/186 |
| 7,826,216 B2 * | 11/2010 | Moss | ........................ | 361/679.49 |

| | | | |
|---|---|---|---|
| 2006/0119177 A1 | 6/2006 | Kumar et al. | |
| 2008/0238195 A1 | 10/2008 | Shaver et al. | |
| 2009/0072770 A1 | 3/2009 | Son et al. | |
| 2009/0315328 A1 | 12/2009 | Kumar | |

FOREIGN PATENT DOCUMENTS

| | | |
|---|---|---|
| EP | 1826897 A2 | 8/2007 |
| JP | 2007215250 A | 8/2007 |

OTHER PUBLICATIONS

Search Report and Written Opinion from corresponding PCT Application No. PCT/US2012/025463 dated Aug. 29, 2012.
Search Report and Written Opinion from corresponding PCT Application No. PCT/US2012/025452 dated Apr. 10, 2013.

* cited by examiner

*Primary Examiner* — Anatoly Vortman
(74) *Attorney, Agent, or Firm* — GE Global Patent Operation; John A. Kramer

(57) ABSTRACT

There is provided an electronic device that includes a heatsink, a first dual IGBT coupled to the heatsink and configured to provide electrical power to a field exciter, a second dual IGBT coupled to the heatsink and configured to provide electrical power to a battery, a third dual IGBT coupled to the heatsink and common to the field exciter and the battery. The electronic device also includes a temperature sensor disposed in the heatsink, a cooling unit comprising a plenum and a variable source of air flow, and a controller. The controller is configured to receive a temperature reading from the temperature sensor and, based on the temperature reading, determine a desired level of cooling for at least one of the dual IGBTs, wherein an air flow rate provided by the cooling unit is determined based on the desired level of cooling.

14 Claims, 38 Drawing Sheets

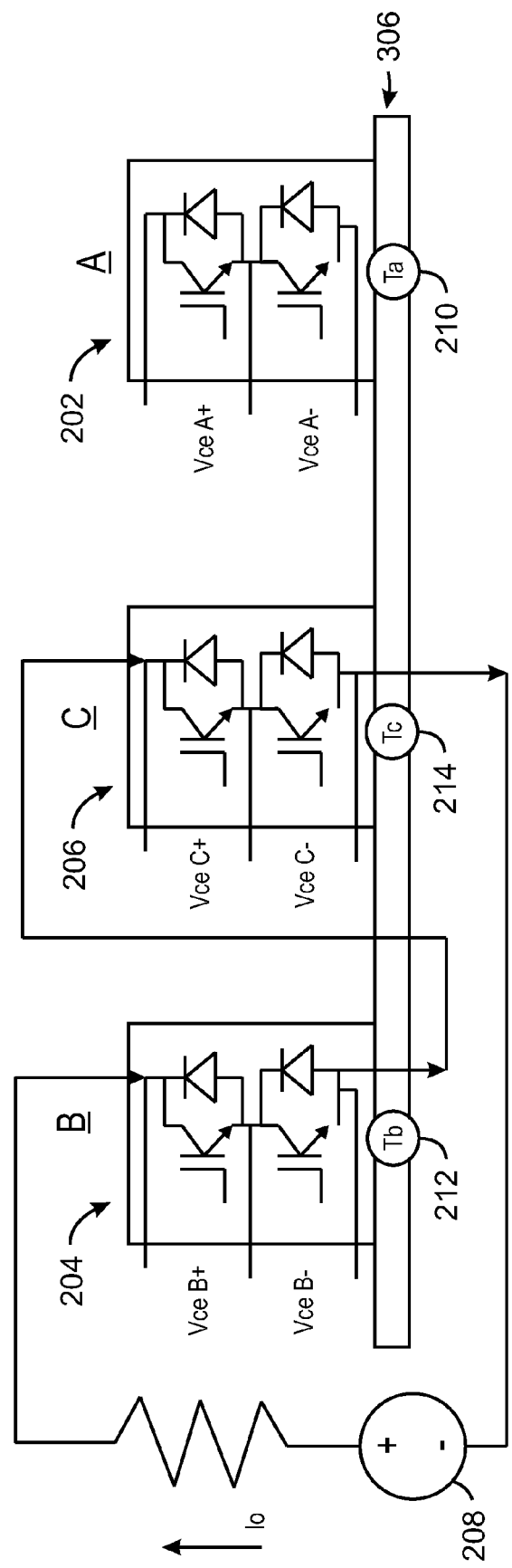

SYSTEM AND METHODS FOR IMPROVING POWER HANDLING OF AN ELECTRONIC DEVICE

BACKGROUND

Exemplary embodiments of the invention relate generally to a system and method for improving the power handling capabilities of an electronic device, such as insulated gate bipolar transistor (IGBT) inverters. Moreover, such exemplary embodiments may relate to modeling, monitoring, and reducing the temperature of insulated gate bipolar transistor (IGBT) inverters.

Traction vehicles, such as, for example, locomotives, employ electric traction motors for driving wheels of the vehicles. In some of these vehicles, the motors are alternating current (AC) motors whose speed and power are controlled by varying the frequency and the voltage of AC electric power supplied to the field windings of the motors. Commonly, the electric power is supplied at some point in the vehicle system as DC power and is thereafter converted to AC power of controlled frequency and voltage amplitude by a circuit such an inverter, which includes a set of switches such as IGBTs. In some systems, the electric power may be derived from a bank of electrical batteries coupled to a leg of the inverter. The inverter may be configured to operate in a battery-charge mode and a battery-discharge mode. During the battery-charge mode, electrical energy from the field winding is used to charge the batteries. During the battery-discharge mode, electrical energy stored to the batteries is used to energize the field windings of the motors. The power handling capability of the inverter is limited, at least in part, by the ability of the IGBTs to dissipate the heat generated by the current in the IGBTs. Accordingly, it would be beneficial to have improved systems and methods for modeling the temperature of the IGBTs in the inverter. Improved temperature modeling techniques may be used to improve the power handling capability of inverters by improving heat dissipation. Improved temperature modeling techniques may also be used to provide techniques for monitoring IGBT temperature during operation.

SUMMARY

Briefly, in accordance with an exemplary embodiment of the invention, there is provided an electronic device that includes a heatsink, a first dual IGBT coupled to the heatsink and configured to provide electrical power to a field exciter, a second dual IGBT coupled to the heatsink and configured to provide electrical power to a battery, a third dual IGBT coupled to the heatsink and common to the field exciter and the battery. The electronic device also includes a temperature sensor disposed in the heatsink, a cooling unit comprising a plenum and a variable source of air flow, and a controller. The controller is configured to receive a temperature reading from the temperature sensor and, based on the temperature reading, determine a desired level of cooling for at least one of the dual IGBTs, wherein an air flow rate provided by the cooling unit is determined based on the desired level of cooling.

Another exemplary embodiment provides a power system for a vehicle. The power system includes a double H-bridge comprising a heatsink, a first dual IGBT coupled to the heatsink and configured to provide electrical power to a field exciter, a second dual IGBT coupled to the heatsink configured to provide electrical power to a battery, and a third dual IGBT coupled to the heatsink and common to the field exciter and the battery charger. The power system also includes a temperature sensor disposed in the heatsink, a cooling unit comprising a plenum and a variable source of air flow, and a controller. The controller is configured to receive a temperature reading from the temperature sensor and, based on the temperature reading, determine a desired level of cooling for at least one of the dual IGBTs, wherein an air flow rate provided by the cooling unit is determined based on the desired level of cooling.

Another exemplary embodiment provides a method of cooling an electronic device. The method includes receiving a temperature reading from a temperature sensor disposed in a heatsink. The method also includes, based on the temperature reading, determining a desired level of cooling for at least one of a first dual IGBT coupled to the heatsink and configured to provide electrical power to a battery and a second dual IGBT coupled to the heatsink and common to a field exciter and the battery. The method also includes controlling an air flow rate of a cooling unit disposed in relation to the heatsink based on the desired level of cooling.

DRAWINGS

These and other features, aspects, and advantages of the invention will become better understood when the following detailed description is read with reference to the accompanying drawings in which like characters represent like parts throughout the drawings, wherein.

Figure 4A:
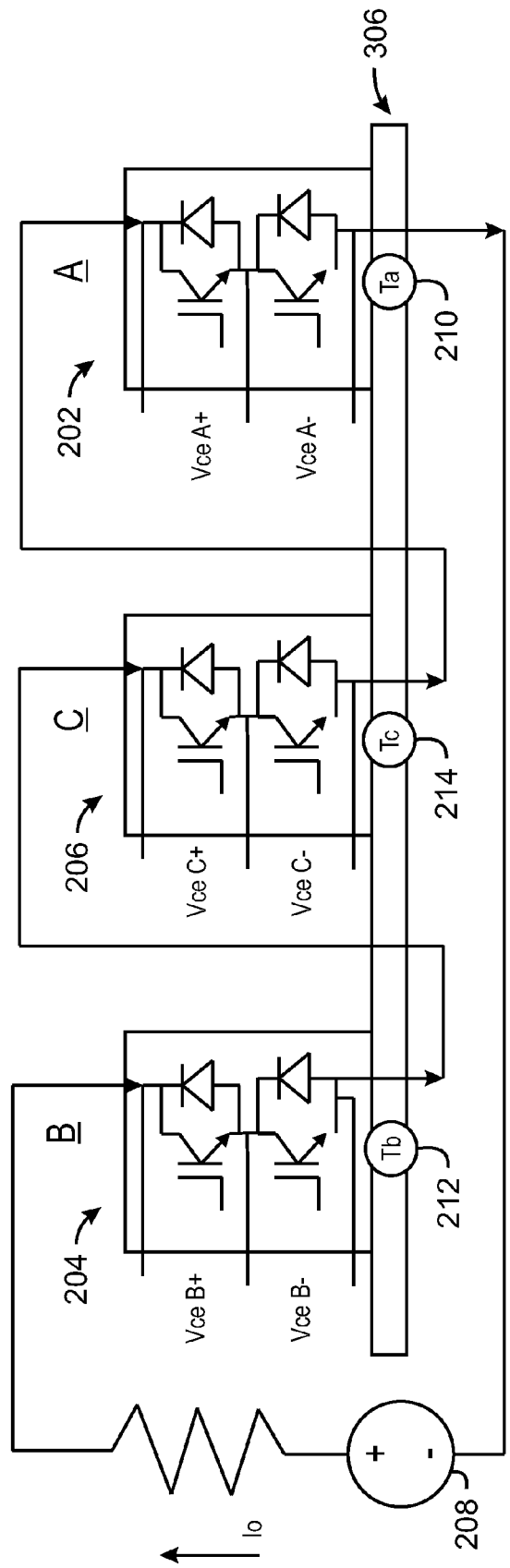
Figure 4C:
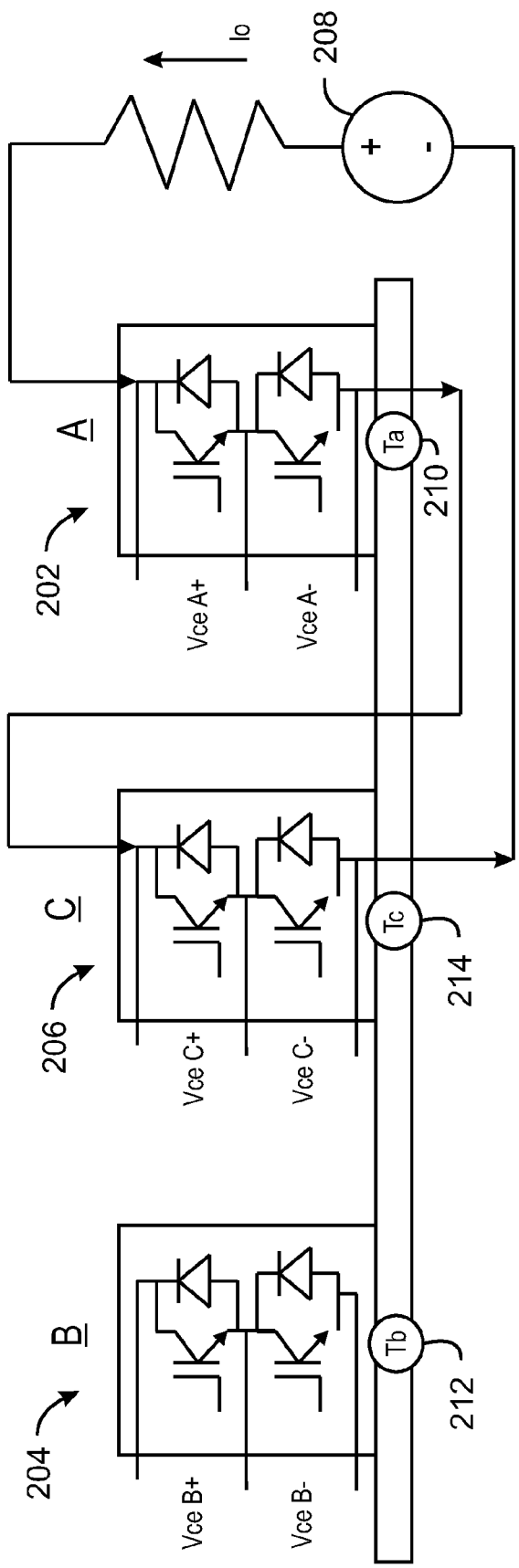
Figure 4D:
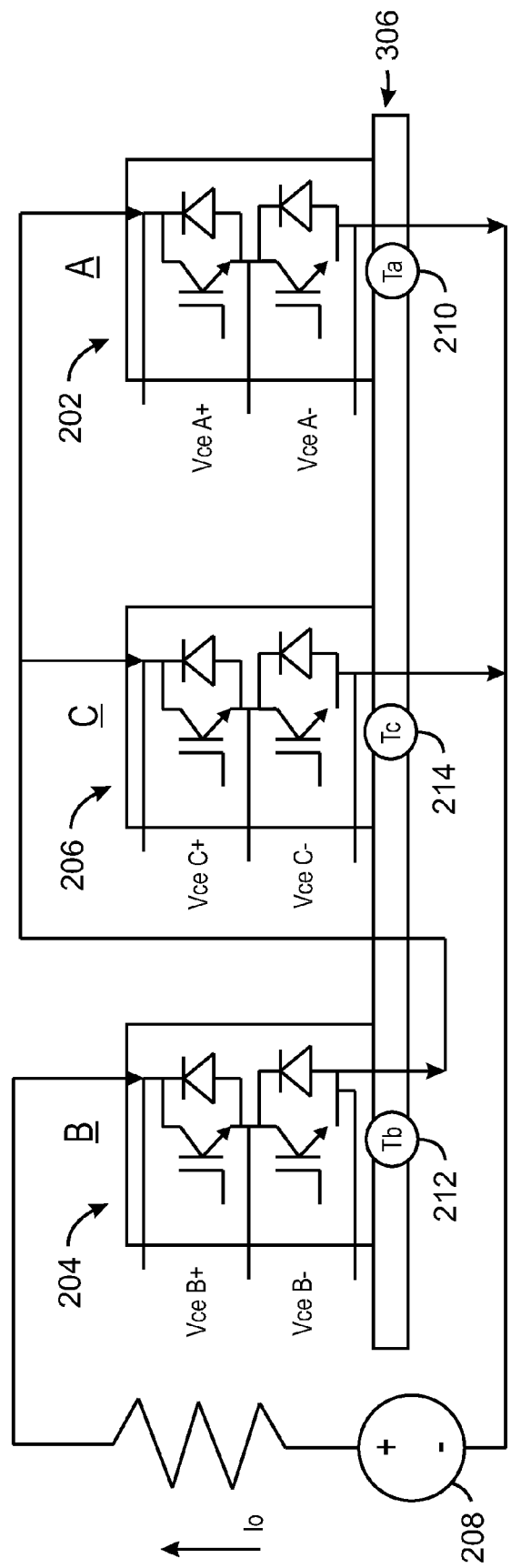
Figure 5:
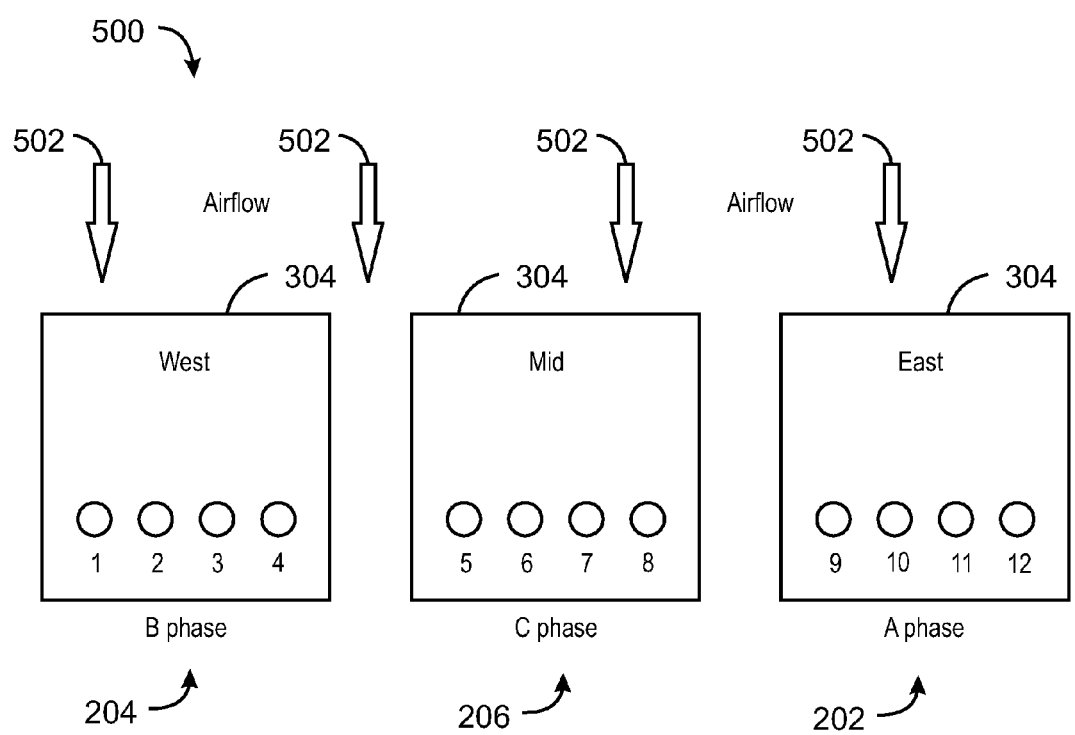
Figure 7A:
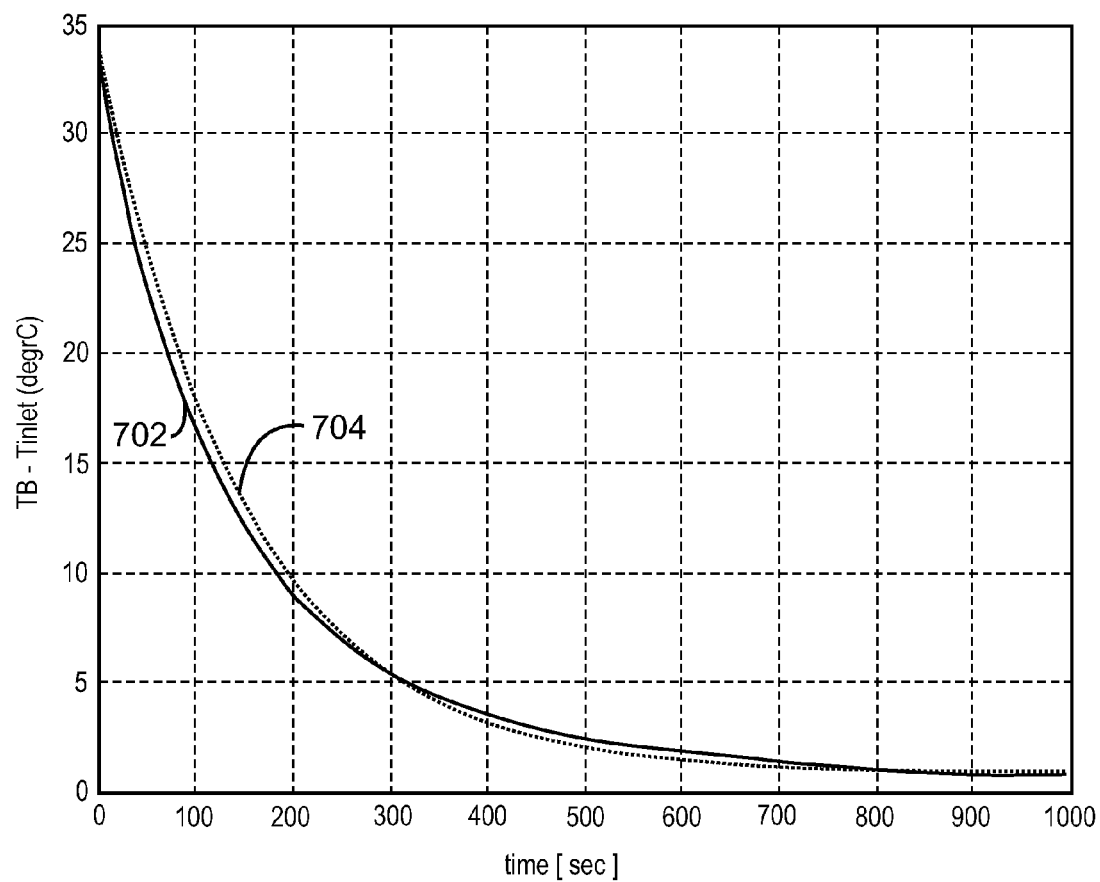
Figure 8:
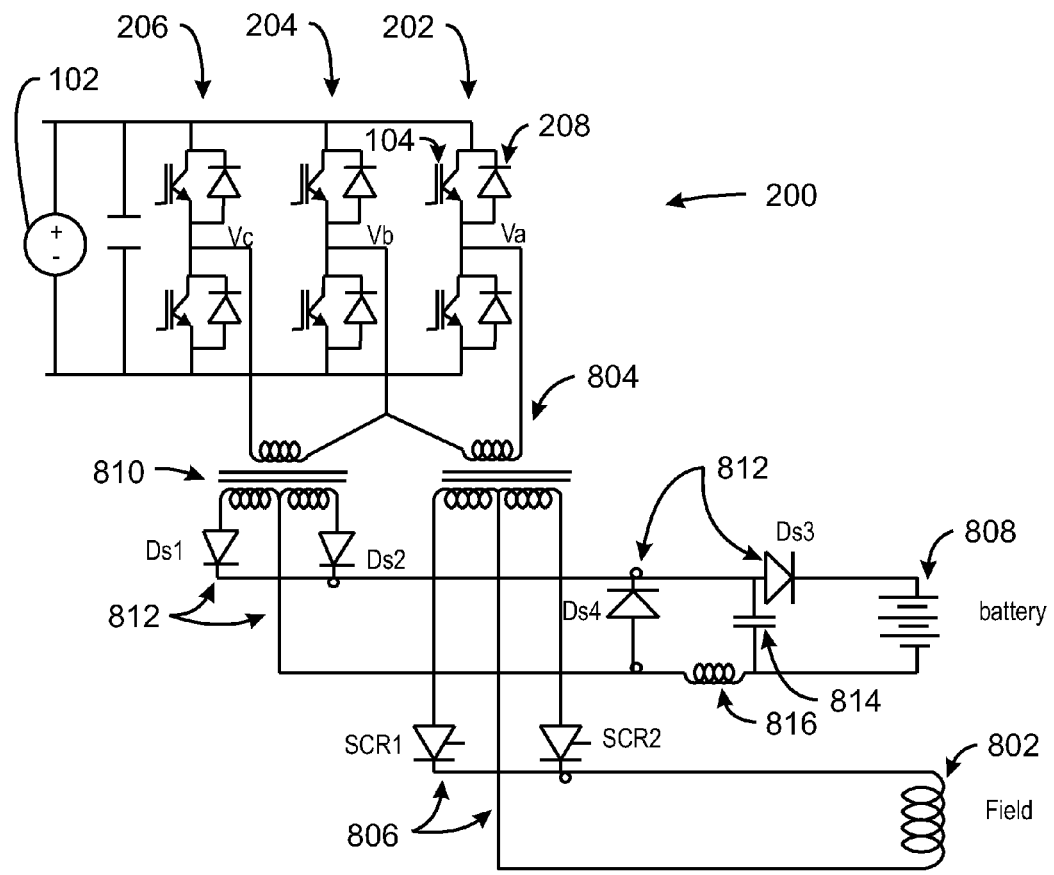
Figure 9:
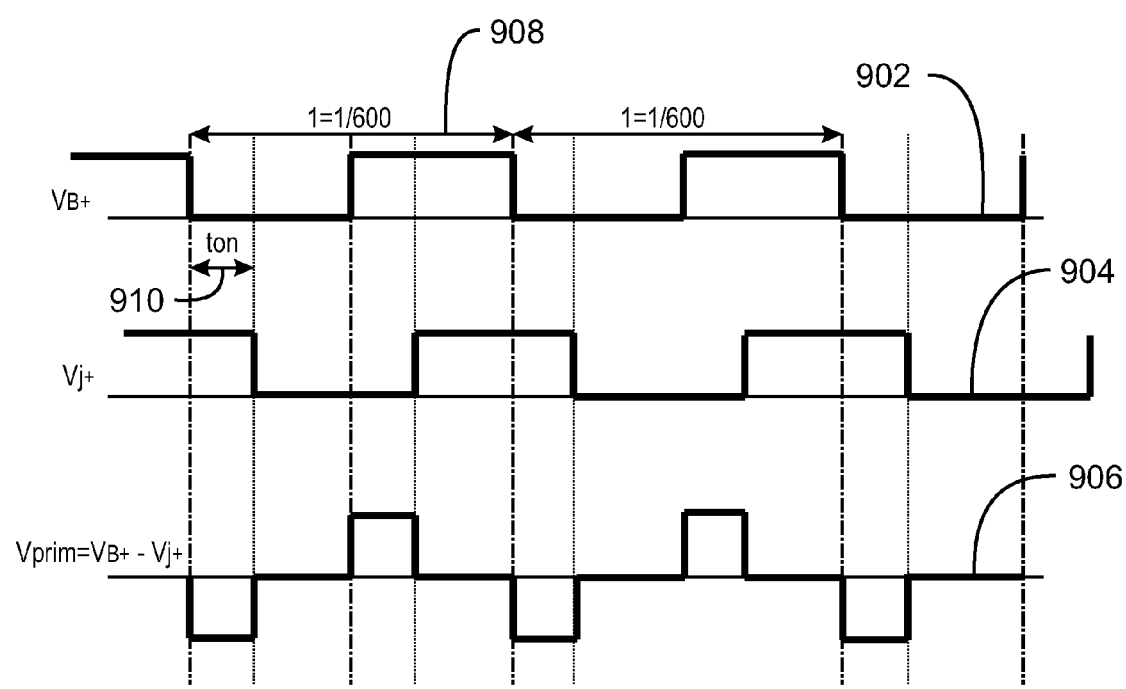
Figure 10:
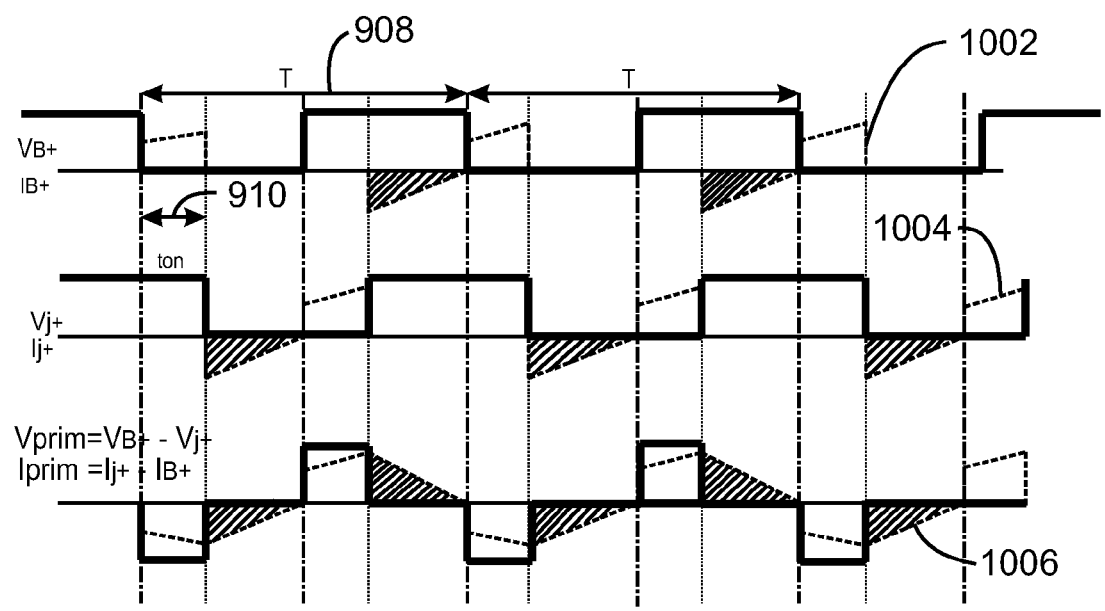
Figure 11:
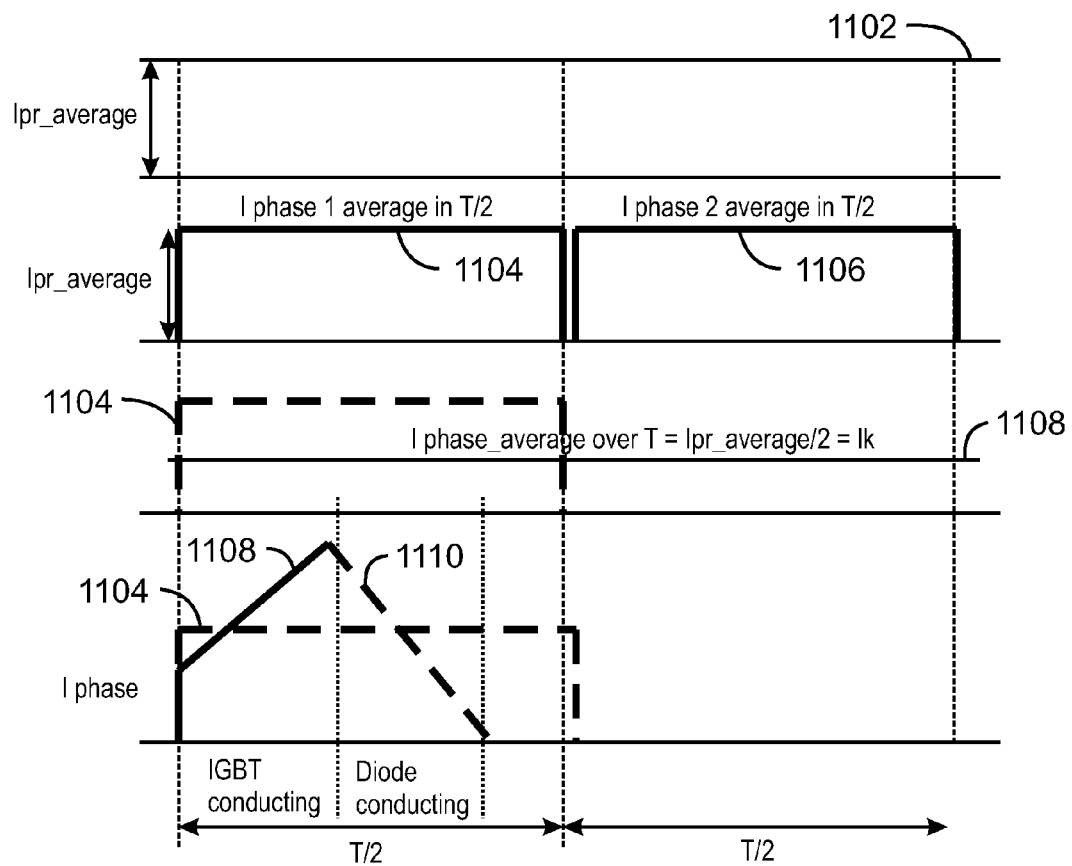
Figure 12A:
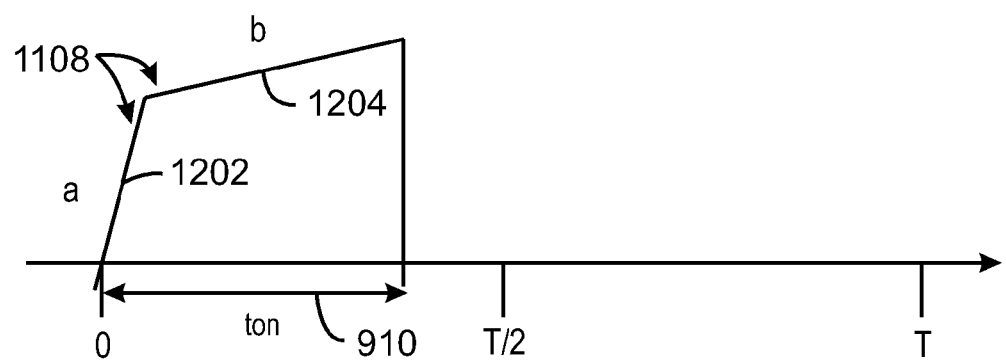
Figure 13A:
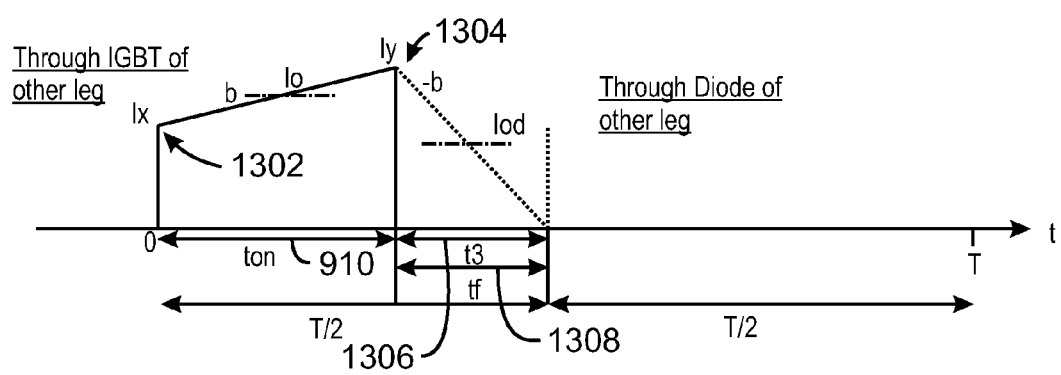
Figure 13B:
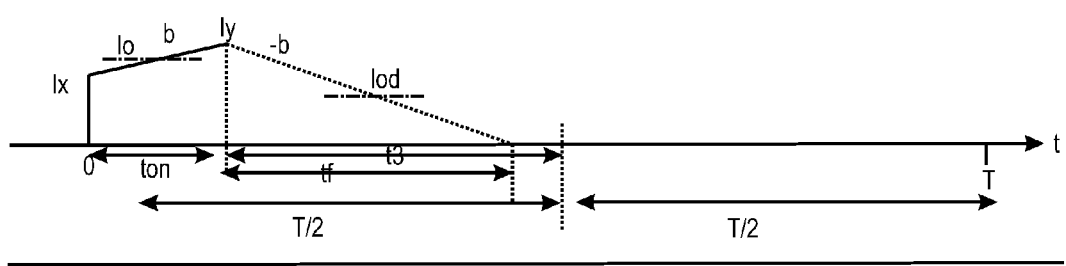
Figure 13C:
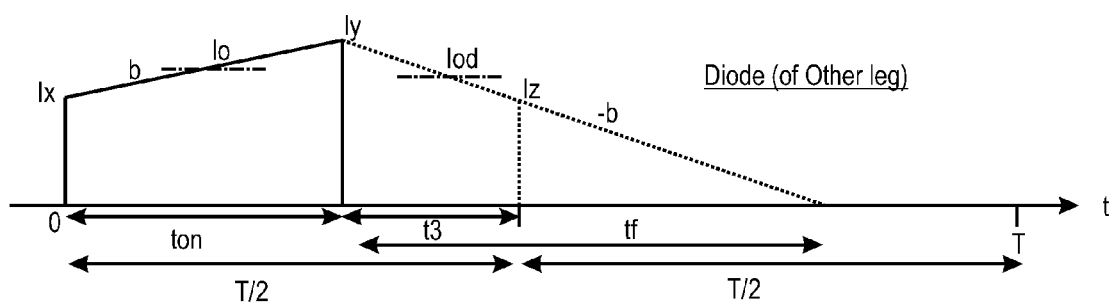
Figure 14:
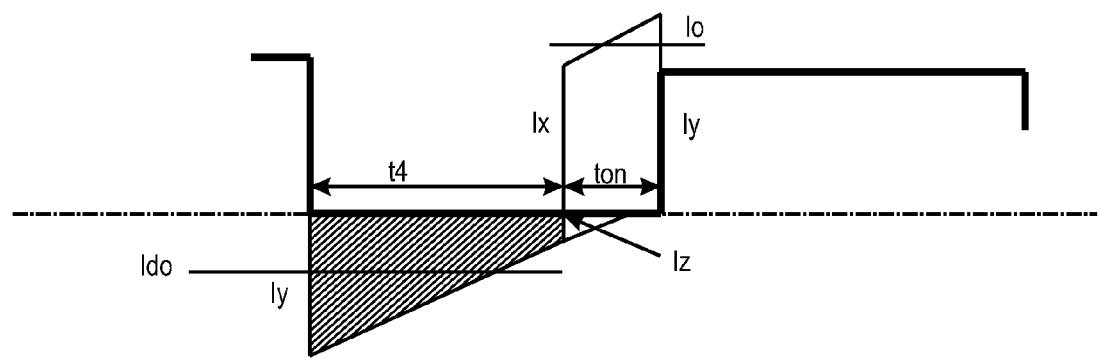
Figure 15:
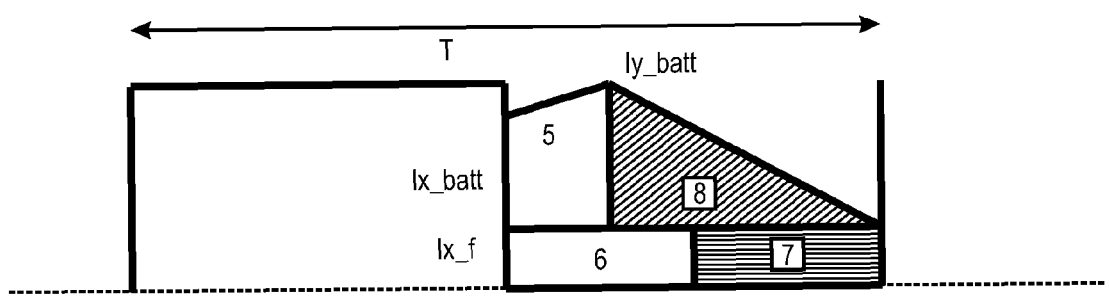
Figure 16:
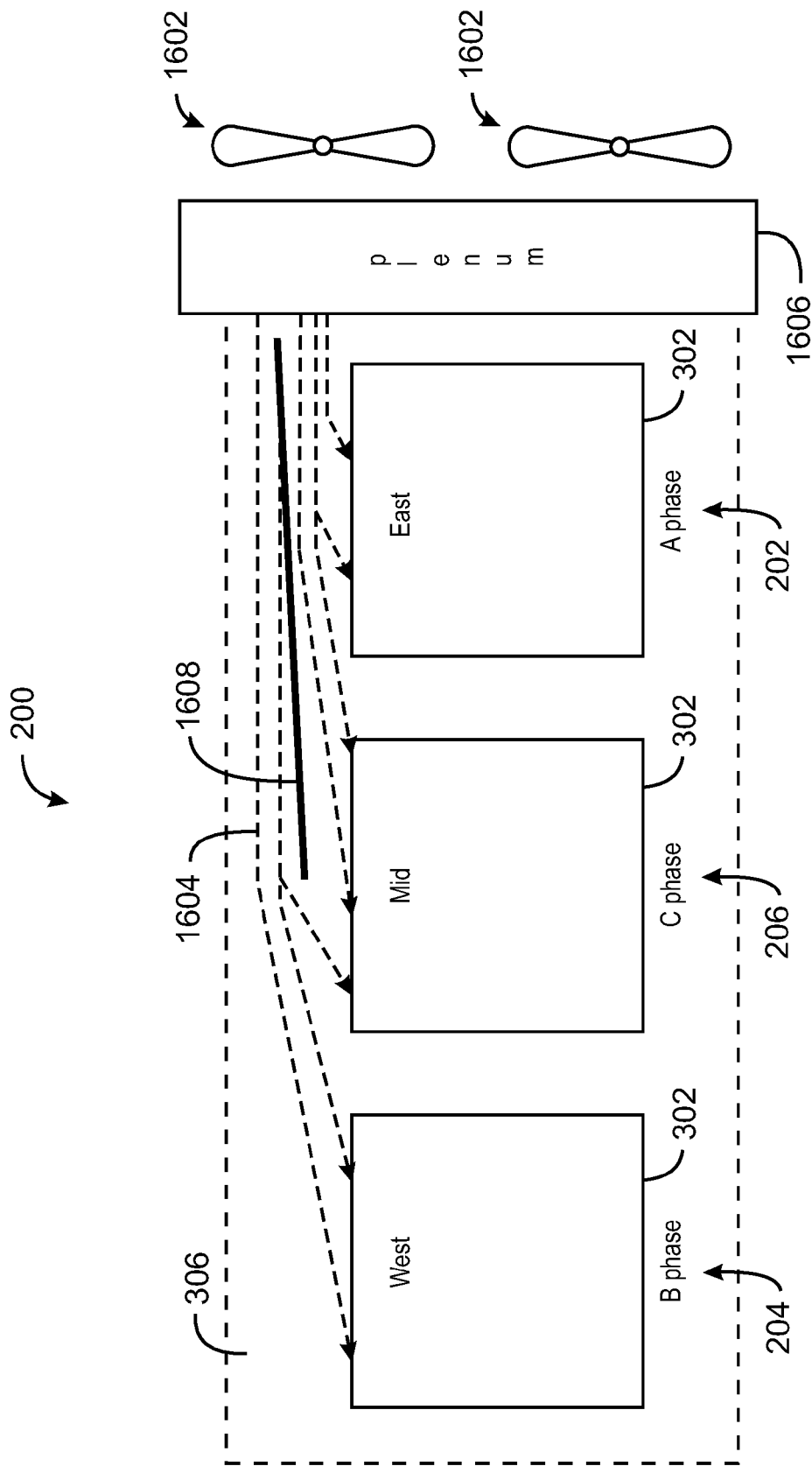
Figure 17:
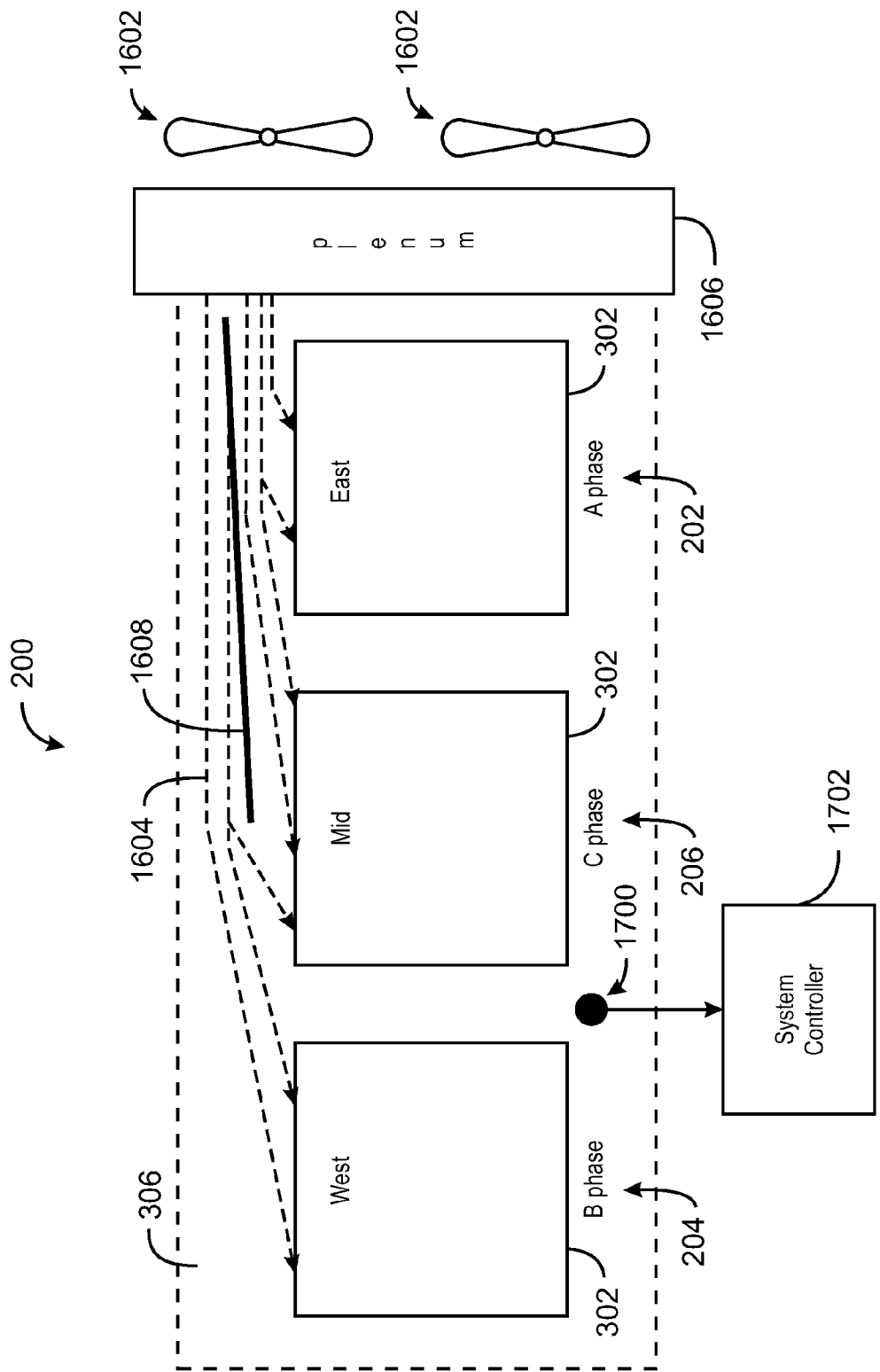
Figure 18:
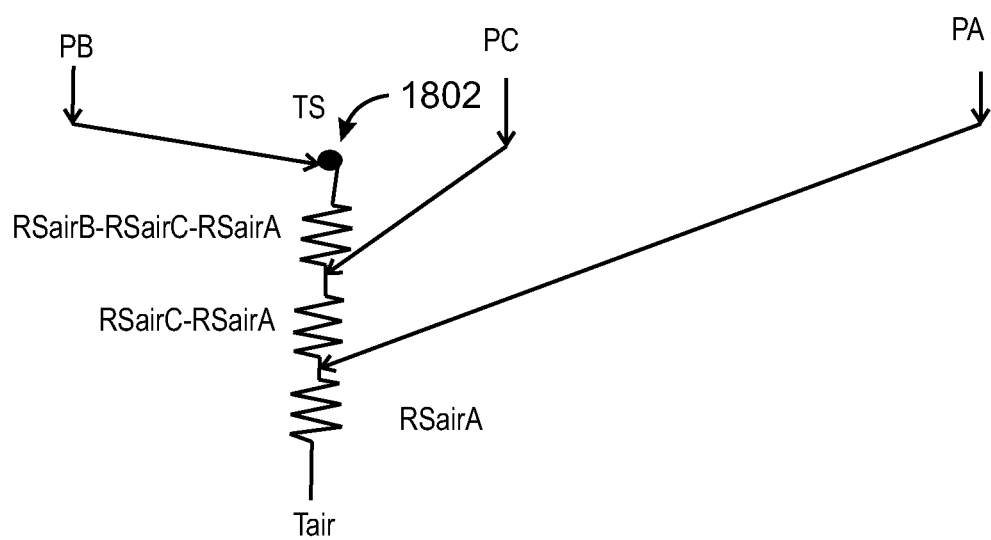
Figure 19A:
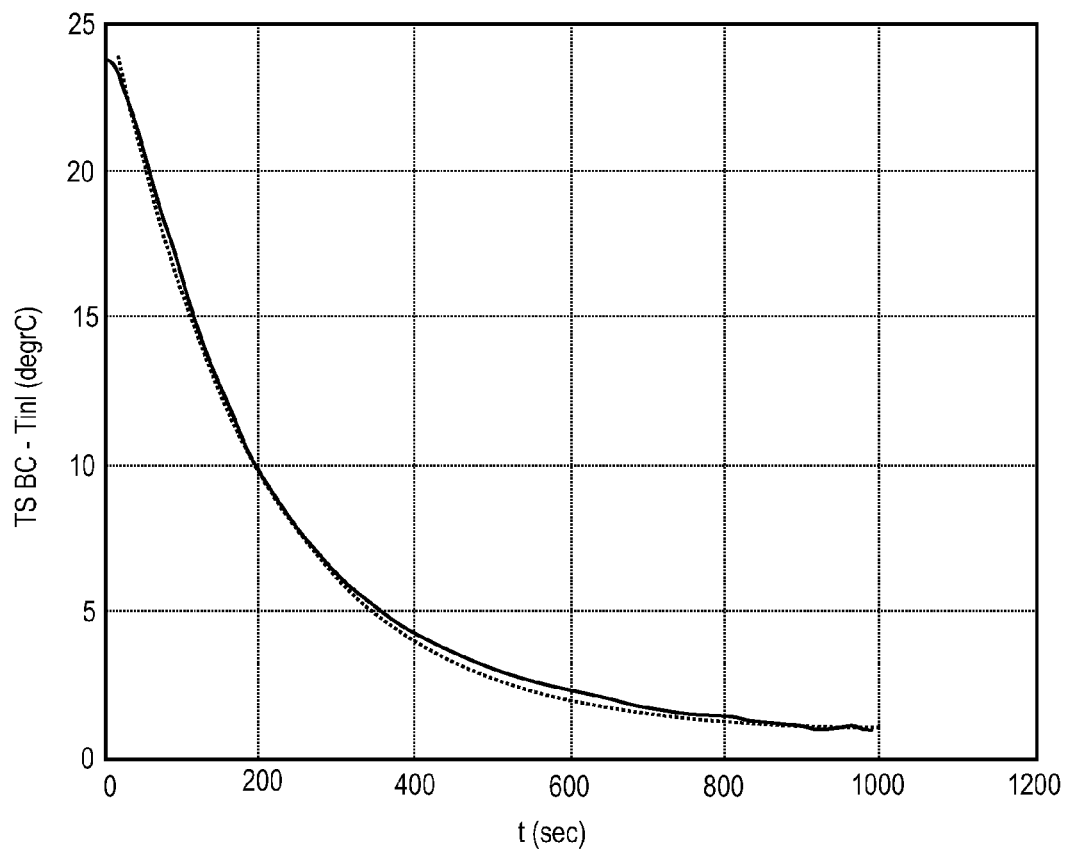
Figure 19B:
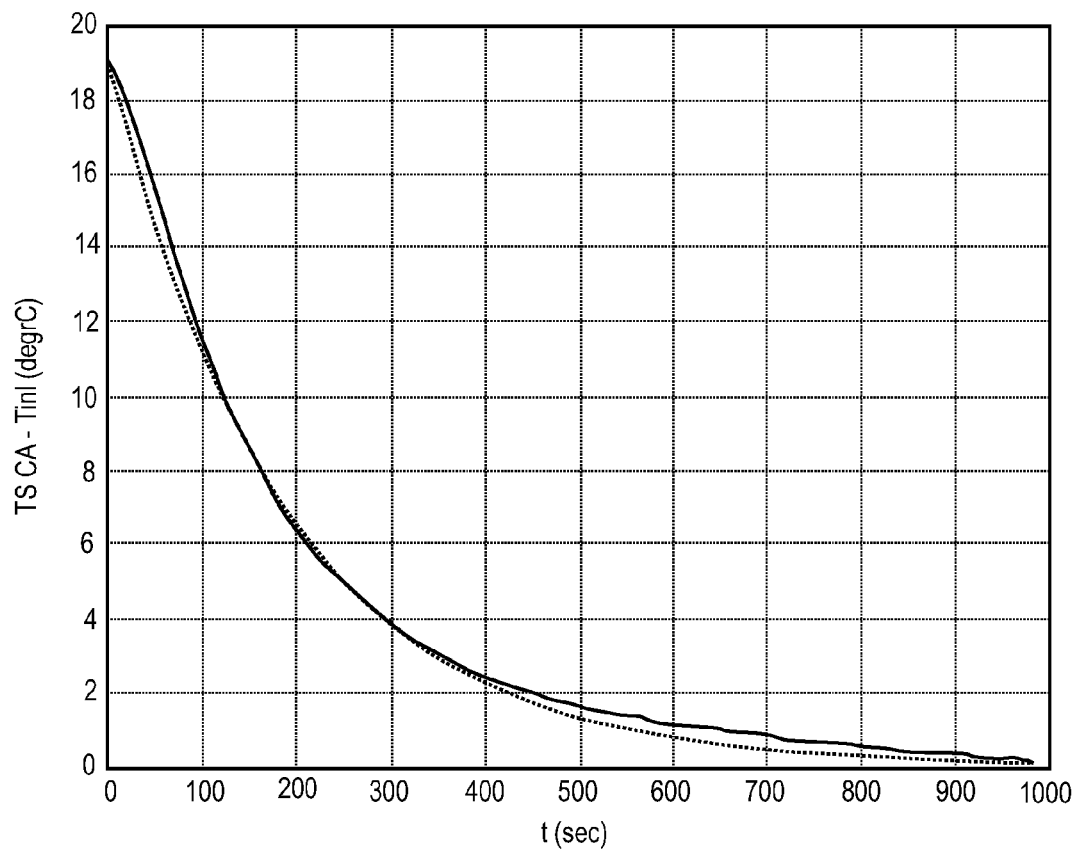
Figure 19C:
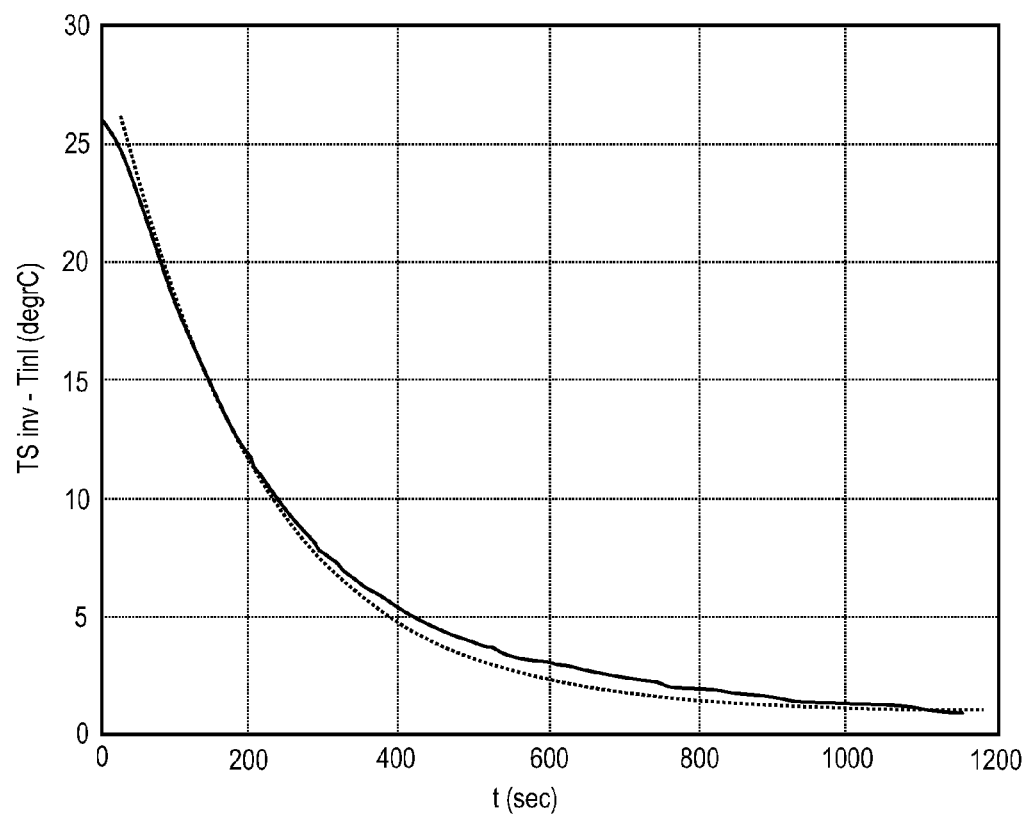
Figure 20:
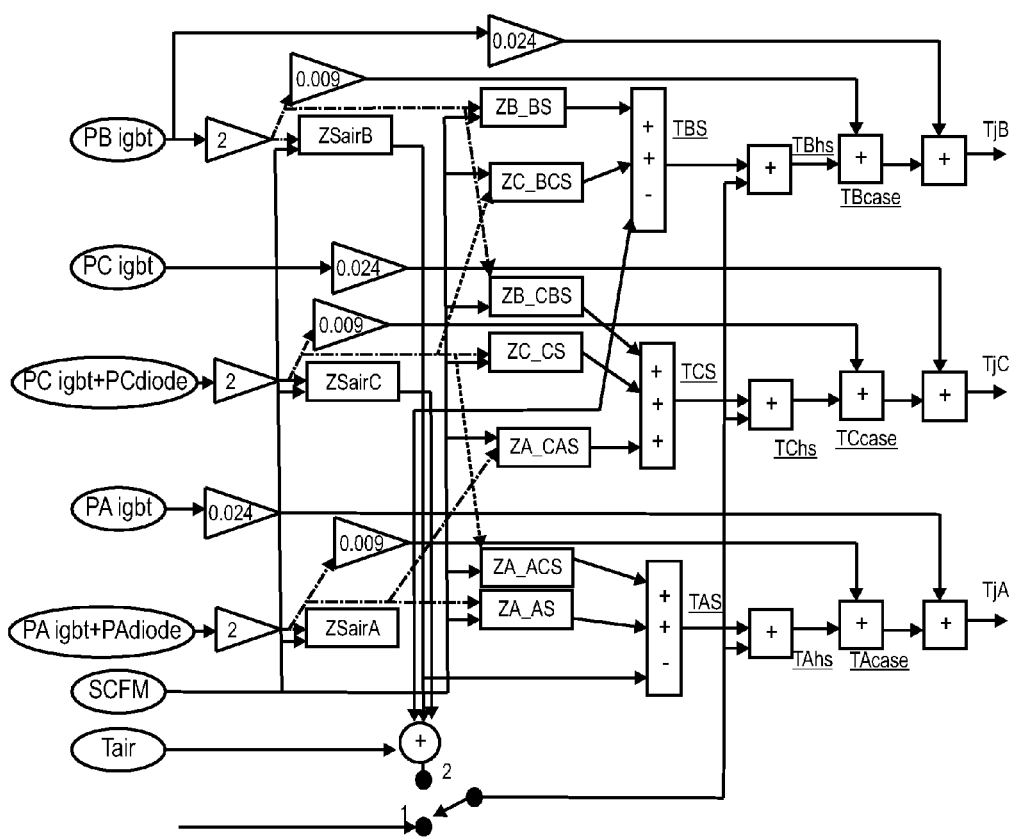
Figure 21:
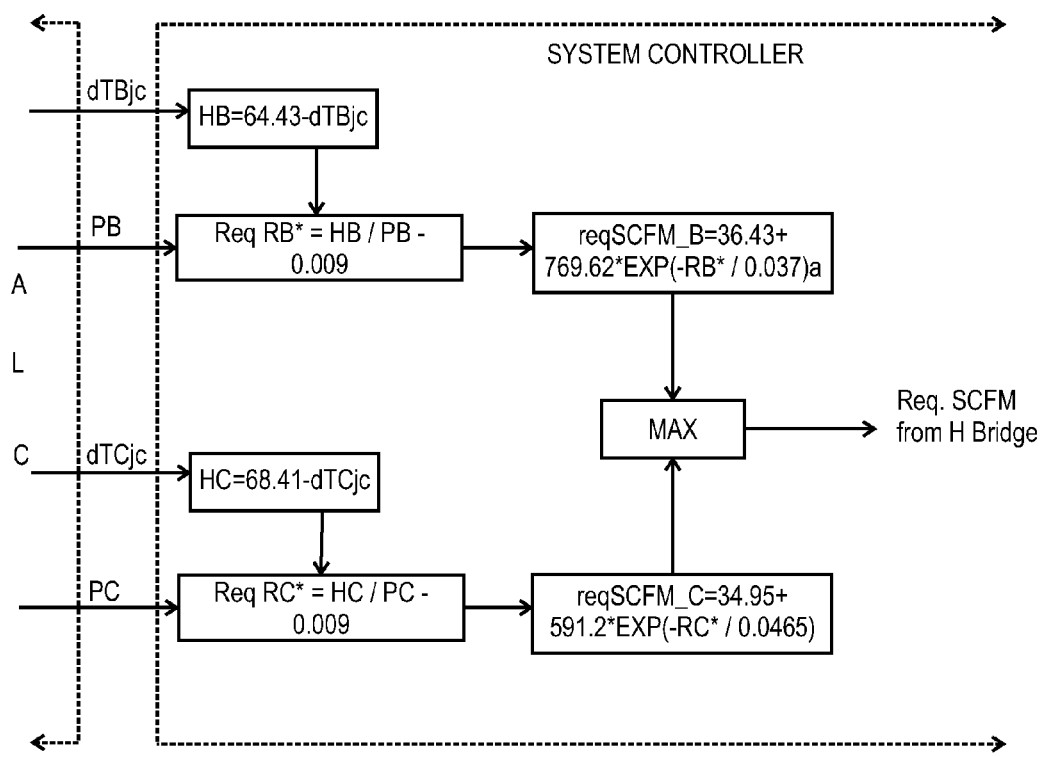
Figure 22:
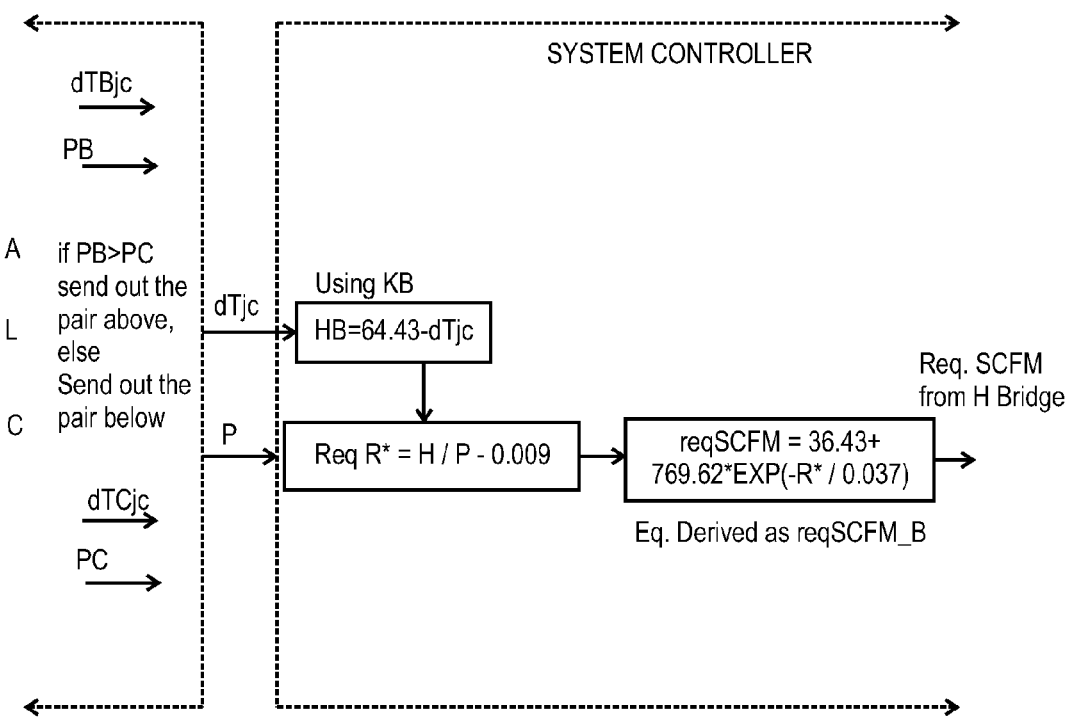
Figure 23:
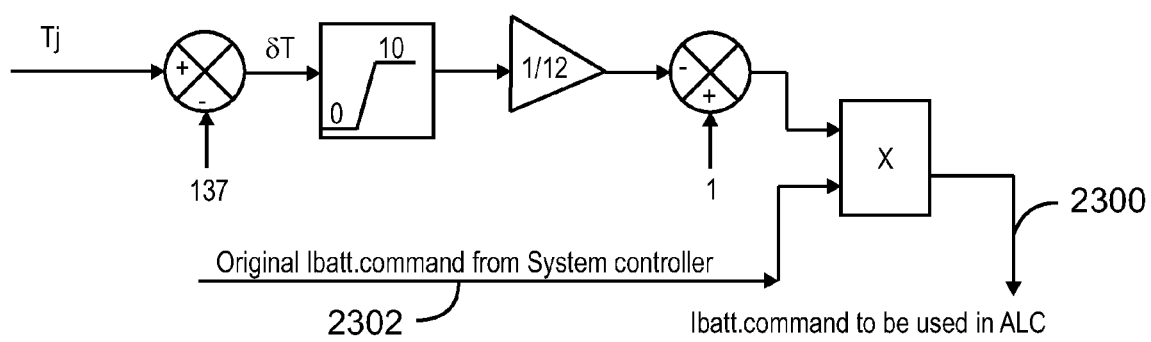
Figure 24:
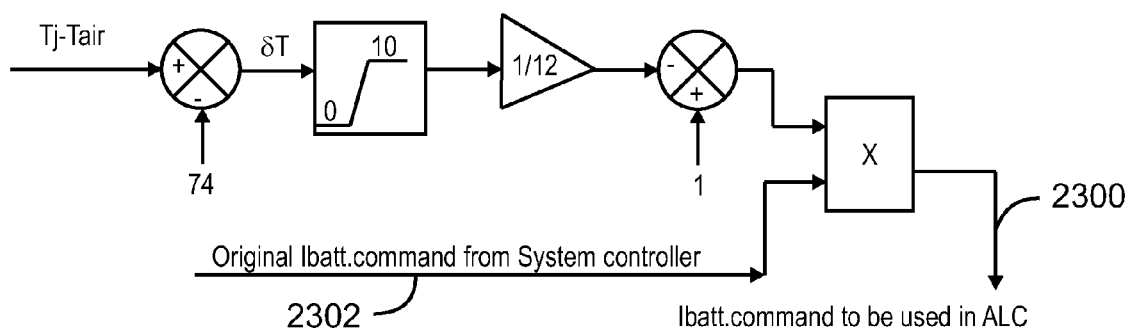
Figure 25:
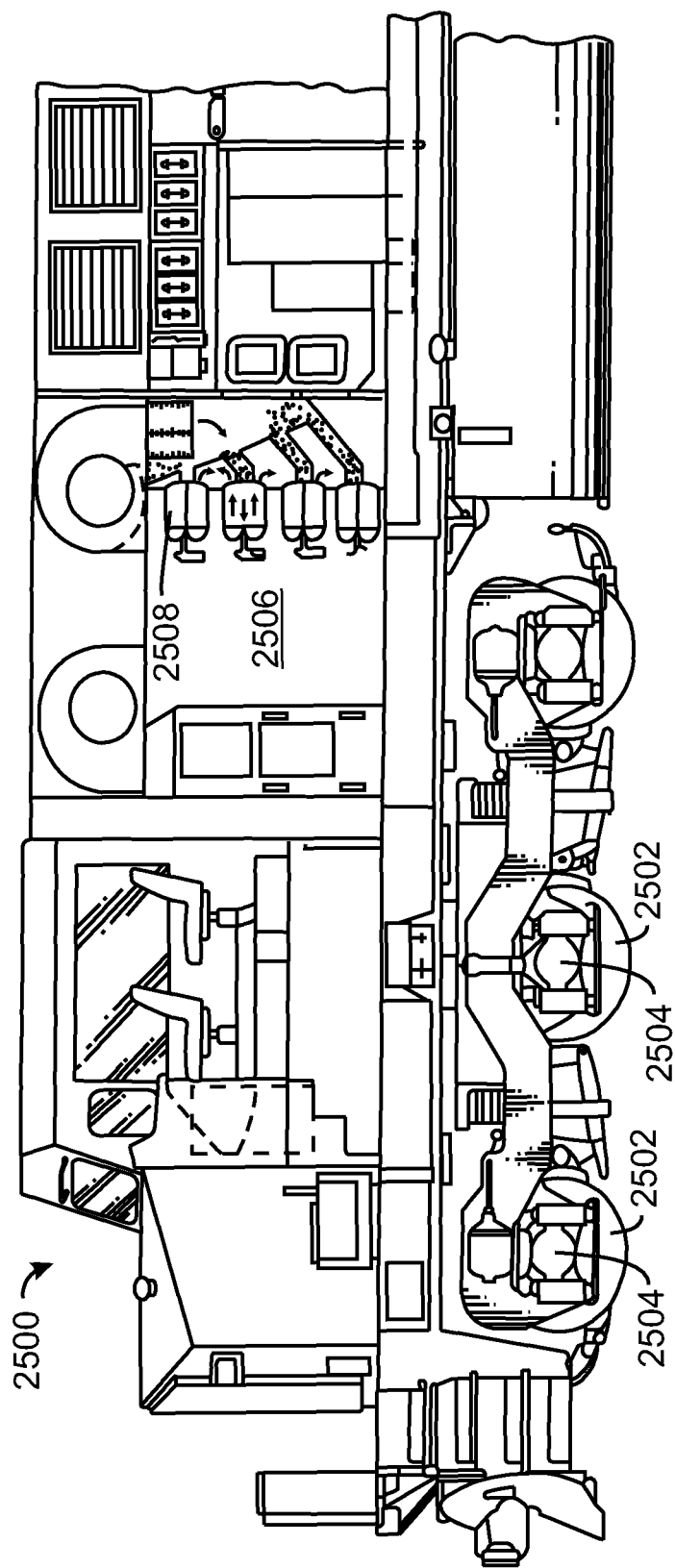

FIGS. 4A-D are block diagrams showing test configurations for developing data used to derive thermal impedance models for the double H-bridge;

FIG. 5 is a block diagram showing the thermocouple configuration for measuring the temperatures discussed in relation to FIGS. 4 and 7;

FIGS. 6A-F are graphs showing the comparison of measured temperatures and the computer modeled temperatures over time, using the test configuration shown in FIG. 4D;

FIGS. 7A and B are graphs comparing the estimated cooling curves to the measured cooling curves;

FIG. 8 is a block diagram of a system that uses a double H-bridge, in accordance with embodiments;

FIG. 9 is a graph of the output voltages of the Phase A, Phase B, and Phase C IGBTs;

FIG. 10 is a graph of the expected output current superimposed over the output voltages of FIG. 9;

FIG. 11 is a graph of the output current from a single H-bridge;

FIGS. 12A and B are a graphs of the current waveform for a phase A or phase C IGBT;

FIGS. 13A-C are graphs showing current waveforms for the IGBTs 104 and diodes 208 of a phase B;

FIG. 14 is a graph of the current and voltage waveform used to estimate power losses in the phase A and phase C IGBTs and diodes;

FIG. 15 is a graph of the current and voltage waveform used to estimate power losses in the phase B (common) IGBTs and diodes;

FIG. 16 is a block diagram of a double H-bridge with a cooling unit;

FIG. 17 is a block diagram of a double H-bridge configured to providing real-time heatsink temperature readings;

FIG. 18 is a flow diagram of the heat flow in the double H-bridge during operation;

FIGS. 19A-C are graphs of the estimated TS_XX–Tinl and the actual measured TS_XX–Tinl over time for various testing configurations;

FIG. 20 is a block diagram of a circuit for estimating junction temperatures of the IGBTs in a double H-bridge;

FIG. 21 is a block diagram of a system controller for a double H-bridge that controls the airflow rate based on an estimated amount of desired cooling;

FIG. 22 is a block diagram of a system controller for a double H-bridge that controls the airflow rate based on an estimated amount of desired cooling;

FIG. 23 is a block diagram of a control loop used to de-rate the load current, in accordance with embodiments;

FIG. 24 is a block diagram of a control loop used to de-rate the load current, in accordance with embodiments; and FIG. 25 is a block diagram of a diesel-electric locomotive that may employ an inverter control circuit according to an exemplary embodiment of the invention.

DETAILED DESCRIPTION

Figure 1:
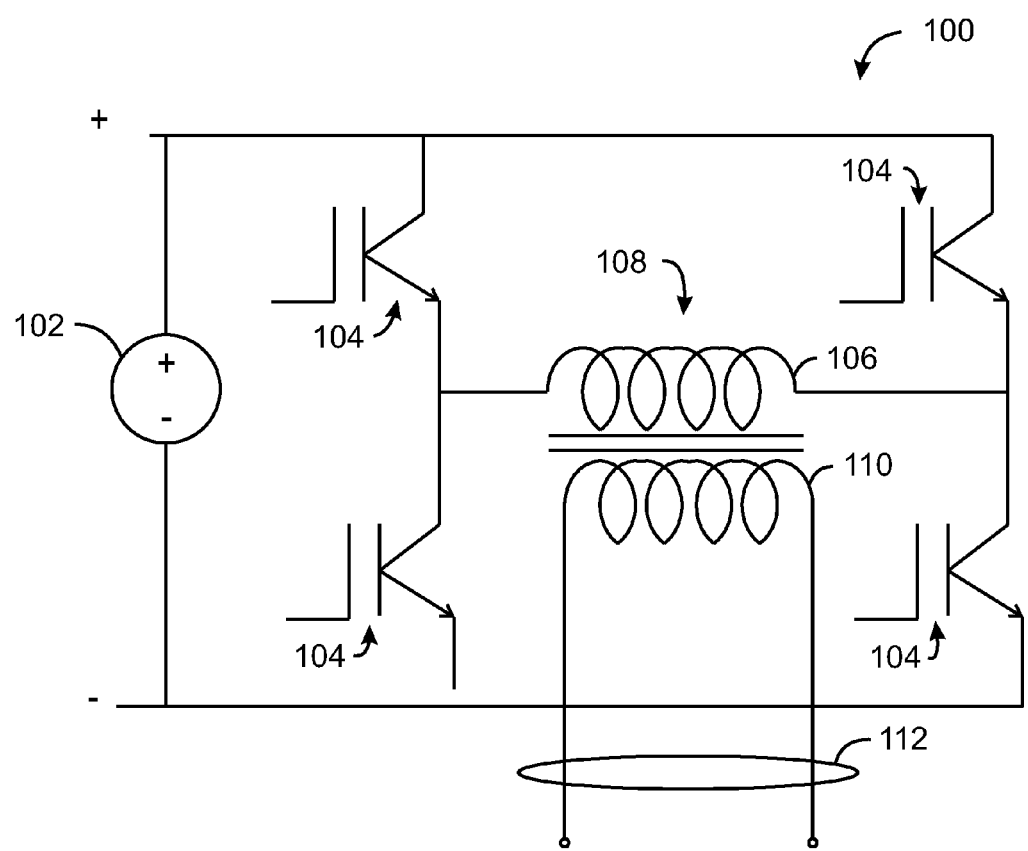
FIG. 1 is a block diagram of an H-bridge converter.

FIG. 1 is a block diagram of an H-bridge converter. The H-bridge converter 100 may be used to convert a direct current (DC) voltage to a square alternating current (AC) waveform and has a variety of applications in the power electronic industry. The H-bridge converter 100 is widely employed when the power is supplied from a DC line and transformers are used for voltage reduction and/or isolation in a circuit. As shown in FIG. 1, an input voltage 102 is fed to a group of four electronic switches 104 such as IGBTs. The output of the switches 104 is fed to a primary winding 106 of a transformer 108. The switches 104 of the H-bridge converter 100 chop the given input DC voltage 102 to generate a square waveform, which is fed to the primary winding 106 of the transformer 108. The generated square waveform has a peak voltage equal to the input DC voltage 102. Due to the inductance of the transformer 108, the output 112 of the secondary winding 110 of the transformer 108 has a nearly AC waveform and a peak voltage equal to the input DC voltage 102 multiplied by the turns ratio of the transformer 108. Normally, there is a rectifier in the secondary winding 110 of the transformer 108 rectifying the nearly AC waveform of the secondary to a DC waveform of reduced amplitude compared to the input DC voltage.

Figure 2:
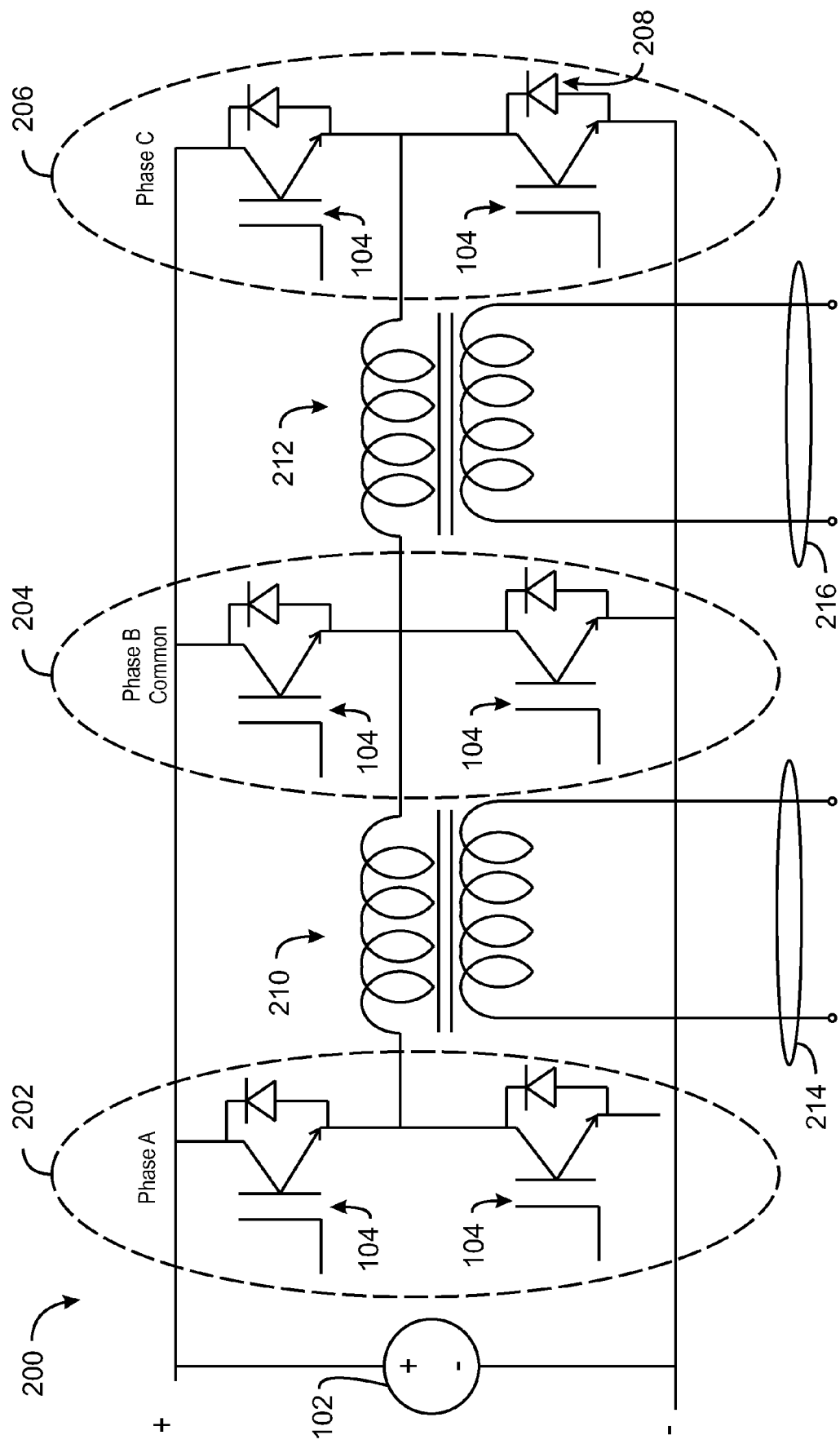
FIG. 2 is a block diagram of a double H-bridge, in accordance with embodiments.

FIG. 2 is a block diagram of a double H-bridge, in accordance with embodiments. The double H-bridge 200 may be a converter that includes two H-bridges with one leg common and provides the functionality of two separate H-bridges. In the double H-bridge 200, a common input voltage 102 is fed to a group of six electronic switches 104 such as IGBTs. The switches 104 include a first leg, referred to herein as "phase A" 202, a second leg referred to herein as "phase B" or "common" 204, and a third leg referred to herein as "phase C" 206. Each leg includes a pair of switches 104. In an embodiment, a diode 208, referred to as a "freewheeling" or "flyback" diode, may be disposed in parallel with each switch. The output of the phase A 202 and Phase B 204 switches is fed to a first transformer 210. The output of the phase B 204 and Phase C 206 switches is fed to a second transformer 212. In an embodiment, the output 214 of the first transformer 210 is used to power a battery charging circuit and the output 216 of the second transformer 212 is used to power a field exciter. The coupling of the double H-bridge to the battery charging circuit and the field exciter is discussed further below in relation to FIG. 8.

Since three legs 202, 204, and 204 corresponding to the three phases are used in the double H-bridge, the hardware of a three phase inverter is employed. The double H-bridge may be implemented in a single housing which uses a single heat sink to provide heat dissipation for the switches 104. In embodiments, the heat sink is cooled by forcing air over the heatsink. Due to double H-bridge topology, the power loss exhibited in each leg has a different power loss. Furthermore, the forced air cooling of the common heatsink can result in uneven cooling air flow about the three legs of the double H-bridge, making the thermal resistance related to each of the three phases non-uniform. The power handling capability of the double H-bridge will generally be limited by the hottest leg. Thus, the uneven power distribution and uneven cooling of the three phases may reduce the overall power handling capability of the double H-bridge. According to embodiments, a model for analyzing the thermal response of the double H-bridge is developed.

Thermal Impedance Models

Figure 3:
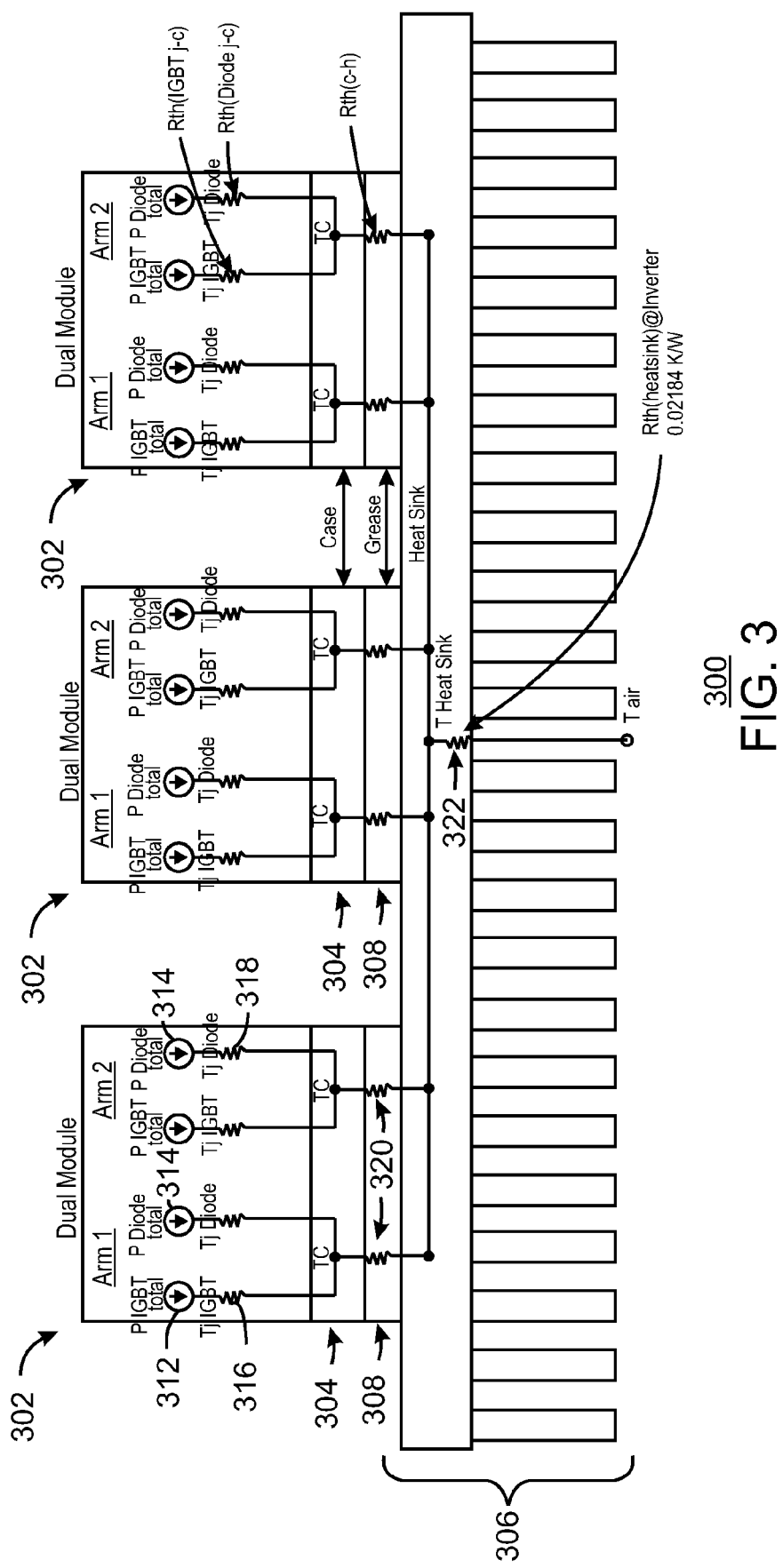
FIG. 3 is a block diagram showing a thermal network of a double H-bridge, in accordance with embodiments.

FIG. 3 is a block diagram showing a thermal network of a double H-bridge, in accordance with embodiments. As shown in FIG. 3, the thermal network 300 includes three pairs of IGBT encased in a dual module 302, wherein each dual module 302 is enclosed in a case 304 which may be, for example, a metal matrix composite consisting of aluminum matrix with silicon carbide particles. Each case 304 may be coupled to a heatsink 306 with a layer of thermally conductive grease 308. The heatsink 306 may be in contact with a flow of cooling air, for example, through fins 310.

Each dual module may include a pair of IGBTs, each IGBT coupled in parallel with its respective diode. As shown in FIG. 3, P IGBT 312 represents the total power converted to heat in each respective IGBT, and P Diode 314 represents the total power converted to heat in each respective diode. The junction-to-case thermal resistance of each IGBT, "Rth (IGBT j-c)," is represented by thermal resistance 316, and may be approximately 0.024 Kelvins per Watt (K/W). The junction-to-case thermal resistance of each diode, "Rth (Diode j-c)," is represented by thermal resistance 318, and may be approximately 0.048 K/W. The thermal resistance of the junction between the heat sink and the case, "Rth (c-h)," is represented by the thermal resistance 320 and may be approximately 0.018 K/W. The thermal resistance of the heat sink, "Rth (heatsink)," is represented by the thermal resistance 322 and may be approximately 0.0218 K/W for a specific airflow. Using the thermal network 300, the thermal behavior of the unevenly cooled heatsink 306 can be analyzed to derive thermal impedance models that describe the difference in temperature between the hottest spot underneath each phase to the temperature of the cooling air as a function of airflow. The resulting can be used in real time in the locomotives.

FIGS. 4A-D are block diagrams showing test configurations for developing data used to derive thermal impedance models for the double H-bridge. As shown in FIGS. 4A-D, phase B of the double H-bridge is on the left, phase C of the double H-bridge is in the middle, and phase A of the double H-bridge is on the right. A voltage source 208 is used to provide a steady state current, Io, to the IGBTs of each phase in the different combinations, used for thermal testing purposes, shown in FIGS. 4A-D. As described above, each of the three phases 202, 204, and 206 are thermally coupled to the same heatsink 306.

FIG. 4A shows a test configuration in which all six of the IGBTs are powered with the same level of current, Io. Specifically, all three phases are electrically coupled together in series. FIG. 4B shows a test configuration in which only phase B and phase C are series coupled and powered by the current, Io. FIG. 4C shows a test configuration in which only phase C and phase A are series coupled and powered by the current, Io.

FIG. 4D shows a test configuration is which phase B is powered by the current, Io, and each of Phase C and phase A are powered by Io/2 or half the current used to power Phase B.

For each test configuration of FIGS. 4A-D, the IGBTs are fully ON and are not switching, therefore, no current is flowing through the diodes. The temperature, Ta, represents the temperature at the hottest point in the case 304 under phase A 202, as indicated by the reference number 210. The temperature, Tb, represents the temperature at the hottest point in the case 304 under phase B 204, as indicated by the reference number 212. The temperature, Tc, represents the temperature at the hottest point in the case 304 under phase C 206, as indicated by the reference number 214. Further, Vce A+ equals the collector-to-emitter voltage across the first IGBT in phase A 202, Vce A− equals the collector-to-emitter voltage across the second IGBT in phase A 204, and so one for each of the phases.

Considering the model described above, it is possible to determine the thermal effect that current in one of the phases has on the temperature under the hottest spot of each of the phases in the double H-bridge 200. Assuming that the current, Io, is applied to the dual IGBTs of phase B with both IGBTs switched on, the power dissipated by the pair of IGBTs can be computed according to the equation PB=Io*(VceB++VceB−). The temperature under the hottest spot of the dual IGBT of phase B due to the power dissipated by phase B is referred to as TB1. A temperature difference, δTB1, can be computed as TB1 minus the temperature of the air, Tair. If the current, Io, is applied to phase C the power dissipated by the phase C IGBTs can be computed according to the equation PC=Io*(VceC++VceC−) and the temperature at the hottest spot under phase B, TB 212, due to the power in phase C is referred to as TB2. Similarly, if the current, Io, is applied to phase A the power dissipated by the phase A IGBTs can be computed according to the equation PA=Io*(VceA++VceA−) and the temperature at the hottest spot under phase B, TB 212, due to the power in phase A is referred to as TB3.

The thermal resistances raising the temperature underneath phase B due to current in phases B, C, and A can then be calculated according to the following equations:

$$\delta TB1=RB*PB$$

$$\delta TB2=RBC*PC$$

$$\delta TB3=RBA*PA$$

In the above equations, RB is the thermal resistance raising the temperature underneath phase B due to the power in phase B, PB. RBC is the thermal resistance raising the temperature underneath phase B due to the power in phase C, PC. RBA is the thermal resistance raising the temperature underneath phase B due to the power in phase A, PA. Accordingly, the total temperature difference under phase B, δTB, can be computed according to the following equation:

$$\delta TB=RB*PB+RBC*PC+RBA*PA \qquad \text{eq. 3.1}$$

Repeating the same analysis for phase A and phase B yields:

$$\delta TC=RC*PC+RBC*PB+RCA* \qquad \text{eq. 3.2}$$

$$\delta TA=RA*PA+RBA*PC+RBA*PB \qquad \text{eq. 3.3}$$

In the above equations it is considered that RCB=RBC, RBA=RAB, and RCA=RAC. Further, thermal resistance may generally be expressed as the temperature difference divided by the power, as shown in the equation 3.4 below, wherein X can equal A, B, or C.

$$RXt=\delta TX/PX; \text{ where } X=A,B \text{ or } C \qquad \text{eq. 3.4}$$

Substituting equation 3.4 into equations 3.1, 3.2 and 3.3 yields:

$$RAt=\delta TA/PA=RA+RCA*(PC/PA)+RBA*(PB/PA) \qquad \text{eq. 3.5}$$

$$RBt=\delta TB/PB=RB+RBA*(PA/PB)+RBC*(PC/PB) \qquad \text{eq. 3.6}$$

$$RCt=\delta TC/PC=RC+RBC*(PB/PC)+RCA*(PA/PC) \qquad \text{eq. 3.7}$$

In the above equations, RAt represents an effective thermal resistance for phase A which if multiplied by the total power of phase A (PA) will result in the same δTA as the one in eq. 3.3 where the power through the three phases is different. Similar definitions apply for RBt and RCt. Using the equations described above, thermal tests can be conducted using the test configurations shown in FIGS. 4A-C. For the analysis of the test results, it is assumed that part to part variation of the IGBTs has a negligible effect on Vce_sat. Therefore, it is considered that the power dissipated in each of the phases due to the current, Io, will be approximately the same and is referred to herein as Pphase. Further, Pphase is a known value determined by the current, Io. To determine the temperatures, δTA, δTB, δTC, temperature measurements may be taken using the test configuration shown below in relation to FIG. 5.

FIG. 5 is a block diagram showing the thermocouple configuration for measuring the temperatures discussed in relation to FIGS. 4 and 7. As shown in FIG. 5, thermocouples 500 may be attached to the case 304 under each of the IGBT modules corresponding to phase A 202, Phase B 204, and Phase C 206. The thermocouples 500 are labeled 1-12. In the tests described below, the cooling airflow was evenly distributed across all three of the dual IGBTs, as indicated by the arrows 502. Using the thermocouple configuration of FIG. 5, thermal data may be gathered for each of the test configurations shown in FIGS. 4A-C. In an embodiment, four thermocouples are disposed under each dual IGBT in order to identify the hottest spot under the phase. For each dual IGBT, the hottest temperature measured by the four thermocouples may be used in the analysis.

In the test configuration shown in FIG. 4A, the current, Io, is applied to all three phases. Accordingly, PA=PB=PC=Pphase. After reaching a steady state, the temperature of the case 304 at the hottest points under each of the phases can be measured, and the temperature of the air flowing through the heatsink can be controlled at a pre-selected level. Using the power data and measured temperature data, the thermal resistances RAt, RBt, RCt can be computed using equations 3.5, 3.6, and 3.7, which simplify to:

$$RAt\_inv\_TEST=\delta TA/P\text{phase}=RA+RBA+RCA \qquad \text{eq. 3.8}$$

$$RBt\_inv\_TEST=\delta TB/P\text{phase}=RB+RBA+RBC \qquad \text{eq. 3.9}$$

$$RCt\_inv\_TEST=\delta TC/P\text{phase}=RC+RBC+RCA \qquad \text{eq. 3.10}$$

In the above equations, RAt_inv_TEST, RBt_inv_TEST, and RCt_inv_TEST are the thermal resistances, RAt, RBt, and RCt computed for the data collected using the test configuration shown in FIG. 4A. The test results for RAt_inv_TEST, RBt_inv_TEST are shown in Tables 1 and 2. As shown in tables 1 and 2, the test may be repeated at different current levels and different air flow rates.

TABLE 1

| | RAt_inv_TEST | | | |
|---|---|---|---|---|
| SCFM | 200 | 100 | 50 | AVERAGE |
| 200 | 0.064074 | 0.065422 | 0.062862 | 0.0641194 |
| 150 | 0.073421 | 0.074865 | 0.07686 | 0.0750485 |
| 100 | 0.094100 | 0.098478 | 0.098324 | 0.0969674 |

TABLE 1-continued

RAt_inv_TEST

| SCFM | 200 | 100 | 50 | AVERAGE |
|---|---|---|---|---|
| 60 |  | 0.126707 | 0.128355 | 0.1275309 |
| 35 |  | 0.165805 | 0.17413 | 0.1699673 |
| 0 |  | not equalized | 0.911476 | 0.9114758 |

TABLE 2

RBt_inv_TEST

| SCFM | 200 | 100 | 50 | AVERAGE |
|---|---|---|---|---|
| 200 | 0.057676 | 0.057225 | 0.053517 | 0.0561395 |
| 150 | 0.067774 | 0.066499 | 0.06803 | 0.0674342 |
| 100 | 0.085742 | 0.083852 | 0.083204 | 0.0842659 |
| 60 |  | 0.11603 | 0.112868 | 0.1144491 |
| 35 |  | 0.166233 | 0.164161 | 0.1651971 |
| 0 |  | not equalized | 0.916598 | 0.9165984 |

In the test configuration shown in FIG. 4B, the current, Io, is applied to phase B 204 and phase C 206. Accordingly, PB=PC=Pphase and PA=0. After reaching a steady state, the temperature of the case 304 at the hottest points under each of the phases can be measured, and the temperature of the air flowing through the heatsink 306 (FIG. 3) can be measured. Using the power data and measured temperature data, the thermal resistances RBt and RCt can be computed using equations 3.6 and 3.7, which simplify to:

$$RBt\_hb\_CB = \delta TB/P\text{phase} = RB + RBA + RBC \qquad \text{eq. 3.11}$$

$$RCt\_hb\_CB = \delta TC/P\text{phase} = RC + RBC + RCA \qquad \text{eq. 3.12}$$

In the above equations, RBt_hb_CB, and RCt_hb_CB are the thermal resistances, RBt and RCt computed for the data collected using the test configuration shown in FIG. 4B. The test results for RBt_hb_CB are shown in Table 3. As shown in tables 3, the test may be repeated at the same current levels and air flow rates as in the test configuration of FIG. 4A.

TABLE 3

RBt_hb_BC

| SCFM | 200 A | 100 A | 50 A | AVERAGE |
|---|---|---|---|---|
| 200 | 0.059254 | 0.058382 | 0.058485 | 0.0587068 |
| 150 | 0.068631 | 0.067352 | 0.067621 | 0.067868 |
| 100 | 0.085433 | 0.08414 | 0.083709 | 0.0844272 |
| 60 |  | 0.112475 | 0.109937 | 0.1112061 |
| 35 |  | 0.157045 | 0.154595 | 0.1558199 |
| 0 |  |  | 0.755702 | 0.7557021 |

In the test configuration shown in FIG. 4C, the current, Io, is applied to phase A 202 and phase C 206. Accordingly, PA=PC=Pphase and PB=0. After reaching a steady state, the temperature of the heatsink 306 at the hottest points under each of the phases can be measured, and the temperature of the air flowing through the heatsink 306 can be measured. Using the power data and measured temperature data, the thermal resistances RAt and RCt can be computed using equations 3.5 and 3.7, which simplify to:

$$RAt\_hb\_CA = \delta TA/P\text{phase} = RA + RBA + RBA \qquad \text{eq. 3.13}$$

$$RCt\_hb\_CA = \delta TC/P\text{phase} = RC + RBC + RCA \qquad \text{eq. 3.14}$$

In the above equations, RAt_hb_CA, and RCt_hb_CA are the thermal resistances, RAt and RCt computed for the data collected using the test configuration shown in FIG. 4C. The test results for RAt_hb_CA are shown in Table 4. As shown in tables 4, the test may be repeated at the same current levels and air flow rates as in the test configuration of FIGS. 4A and 4B.

TABLE 4

RAt_hb_CA

| SCFM | 200 A | 100 A | 50 A | AVERAGE |
|---|---|---|---|---|
| 200 | 0.065646 | 0.066067 | 0.062899 | 0.0648705 |
| 150 | 0.075237 | 0.074923 | 0.074800 | 0.0749867 |
| 100 | 0.095842 | 0.097946 | 0.094780 | 0.0961895 |
| 60 |  | 0.125517 | 0.123958 | 0.1247371 |
| 35 |  | 0.164856 | 0.164629 | 0.1647427 |
| 0 |  |  | 0.643924 | 0.6439242 |

Based on the test data described in Tables 1-4, it will be appreciated that the power in Phase A does not significantly affect the Phase B measurements, because RBt_inv_TEST is approximately equal to RBt_hb_CB. Similarly, the power in Phase B does not significantly affect the Phase A measurements, because RAt_inv_TEST is approximately equal to RAt_hb_CA. Therefore, RAB=RBA=0. Thus, equations 3.8 to 3.14 can be simplified to:

$$RAt\_inv = \delta TA/P\text{phase} = RA + RCA \qquad \text{eq. 3.15}$$

$$RBt\_inv = \delta TB/P\text{phase} = RB + RBC \qquad \text{eq. 3.16}$$

$$RCt\_inv = \delta TC/P\text{phase} = RC + RBC + RCA \qquad \text{eq. 3.17}$$

$$RBt\_hb\_CB = \delta TB/P\text{phase} = RB + RBC \qquad \text{eq. 3.18}$$

$$RCt\_hb\_CB = \delta TC/P\text{phase} = RC + RBC \qquad \text{eq. 3.19}$$

$$RAt\_hb\_CA = \delta TA/P\text{phase} = RA + RCA \qquad \text{eq. 3.20}$$

$$RCt\_hb\_CA = \delta TC/P\text{phase} = RC + RCA \qquad \text{eq. 3.21}$$

Using equations 3.15 to 3.21, the following equations 3.22 to 3.27 can be derived. Specifically, combining equations 3.17 and 3.19 provides:

$$RCt\_inv - RCt\_hb\_BC = RCA \qquad \text{eq.3.22}$$

Combining equations 3.20 and 3.22 provides:

$$RAt\_hb\_CA - RAC = RA \qquad \text{eq.3.23}$$

Combining equations 3.21 and 3.22 provides:

$$RCt\_hb\_CA - RAC = RC \qquad \text{eq.3.24}$$

Combining equations 3.17 and 3.21 provides:

$$RCt\_inv - RCt\_hb\_CA = RCB \qquad \text{eq.3.25}$$

Combining equations 3.18 and 3.25 provides:

$$RBt\_hb\_BC - RBC = RB \qquad \text{eq.3.26}$$

Also, for a validation check, equations 3.19 and 3.25 can be combined to provide:

$$RCt\_hb\_BC - RCB = RC \qquad \text{eq.3.27}$$

Equations 3.22 to 3.25 can be used to derive the parameters RA, RB, RC, RCB and RCA from the thermal test results. For each of the above thermal tests, a correction factor may be applied to the computed thermal resistances to account for the thermal grease 308 between the case 304 of the IGBT modules 302 and the heatsink 306 (FIG. 3) since the measurements (thermocouples) were situated on the case of the dual IGBT's and not on the heatsink. Specifically, as stated above, RXt_TEST (the thermal resistance computed from the test data) equals the case temperature of hottest spot underneath phase X, T_TEST, minus the inlet air temperature, Tair, divided by the power in phase X, PX, where X can be A, B, or C. Thus, if Po is the power dissipation of 1 IGBT and 1 diode, where Pdiode=0, then the case temperature, T_TEST, can be expressed according to the following formula:

$$T\_TEST=Tcase=Tair+Po*Rth\_ch+PX*RXt$$

In the above formula, Rth_ch represents the case to heat-sink thermal resistance and Po equals Pphase/2. Substituting 2*Po for PX and solving for T_TEST−Tair yields:

$$T\_TEST-Tair=2*Po*[(Rth\_ch/2)+RXt]$$

Thus, $$[T\_TEST-Tair]/Pphase=RXt\_TEST=(Rth\_ch/2)+RXt$$

As noted above in reference to FIG. 3, Rth_ch may be approximately equal to 0.018 degrees C. per Watt (Deg. C./W). Thus, based on the above formula, RXt may be determined according to the following formula, in which X Can be A, B, or C:

$$RXt=RXt\_TEST-0.009 \qquad \text{eq. 3.28}$$

In equation 3.28, RXt_TEST can be determined using the following equation, where MaxTcaseX represents the maximum temperature taken from the thermocouples 500 (FIG. 5) of case X:

$$RXt\_TEST=(maxTcaseX-Tair)/(Vce1X+Vce2X)*Io \qquad \text{eq. 3.29}$$

The correction factor described above may be applied to the thermal resistances computed from the test data. A summary of those results are provided in Tables 5 and 6 below.

TABLE 5

| SCFM/AMPs | RCt_inv | RCt_hb_CA | RAt_hb_CA | RBt_hb_BC | RCt_hb_BC |
|---|---|---|---|---|---|
| 200/200 | 0.048233 | 0.045197405 | 0.056646 | 0.050254 | 0.041742 |
| 60/100 | 0.105912 | 0.090516506 | 0.120405 | 0.103475 | 0.086043 |

TABLE 6

| SCFM/AMPs | RCt_inv − RCt_hb_BC RCA | RCt_inv − RCt_hb_CA RCB | RCt_hb_CA − RCA RC | RCt_hb_BC − RCB RC2 | RBt_hb_BC − RBC RB | RAt_hb_CA − RAC RA |
|---|---|---|---|---|---|---|
| 200 | 0.006491 | 0.003035 | 0.038707 | 0.038707 | 0.047219 | 0.050155 |
| 60 | 0.019869 | 0.015395 | 0.070647 | 0.070647 | 0.088079 | 0.100536 |

Table 5 show the thermal resistances computed from the test data with the correction factor applied. Applying equations 3.22 to 3.25 the values of table 5 yields the thermal resistances shown in Table 6. To validate the values shown in Table 6, the thermal resistances RCA, RCB, RC, RB, and RA may be used to compute estimated temperature readings for the test configuration shown in FIG. 4D. The estimated temperature readings may then be compared to measured temperature readings for the test configuration shown in FIG. 4D. Estimated temperature readings may be computer modeled using, for example, a Matlab® computer model programmed according to equations 3.1 to 3.3 using the test values from the table 6. The results of the validation are discussed in relation to FIGS. 6A-F below.

FIGS. 6A-F are graphs showing the comparison of measured temperatures and the computer modeled temperatures over time, using the test configuration shown in FIG. 4D. In FIGS. 6A-F, the computer modeled temperatures were computed using the actual (not averaged) test values for the thermal resistances from table 6 and test data for the Vice's. Additionally, thermal capacitances of the above thermal impedances (ZX=RX in parallel with CX) were set to the following values: CA=2288 joules/degree C., CB=2565 joules/degree C., CC=3077 joules/degree C., CCA=17,388 joules/degree C., CCB=30,573 joules/degree C. The thermal capacitances are described further below in relation to FIGS. 7A and 7B.

Figure 6A:
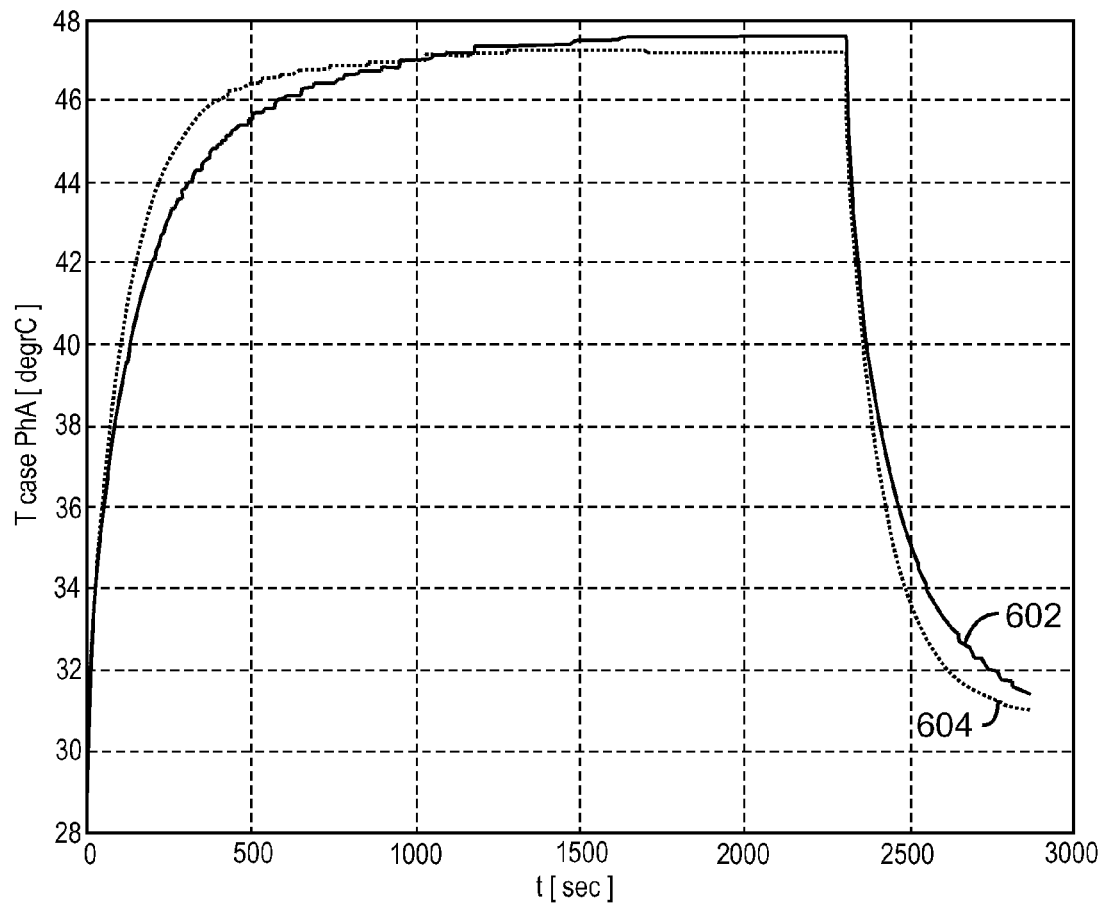
Figure 6B:
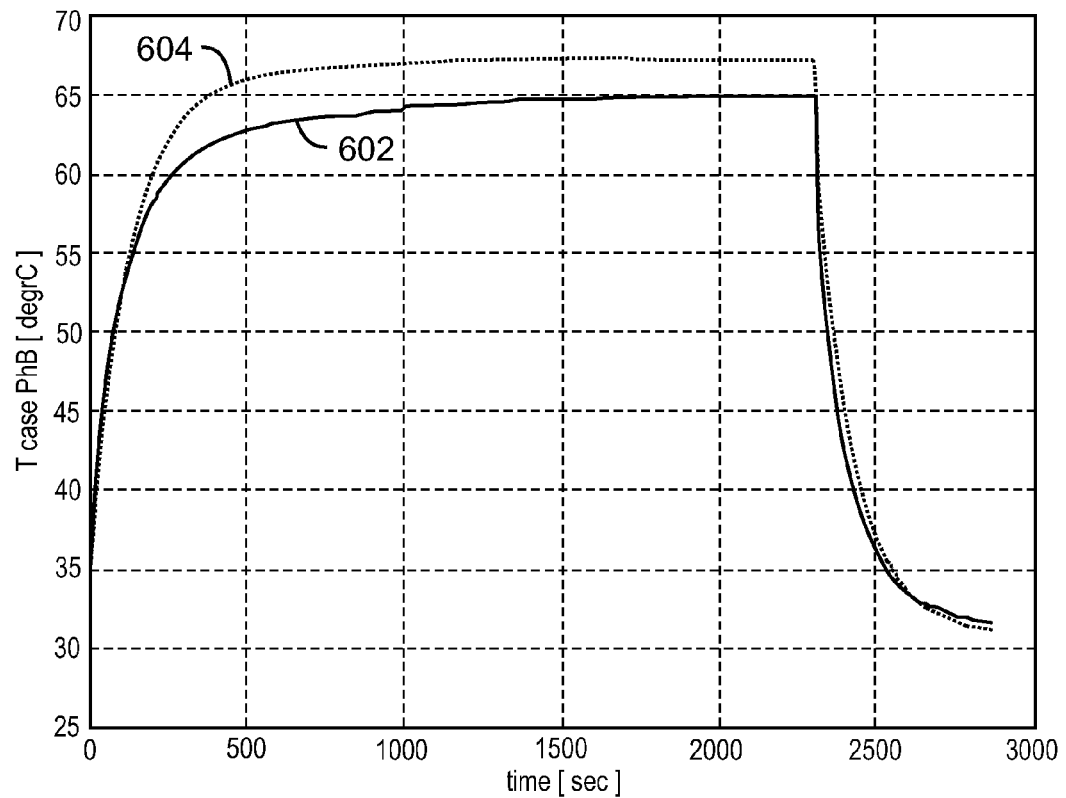
Figure 6C:
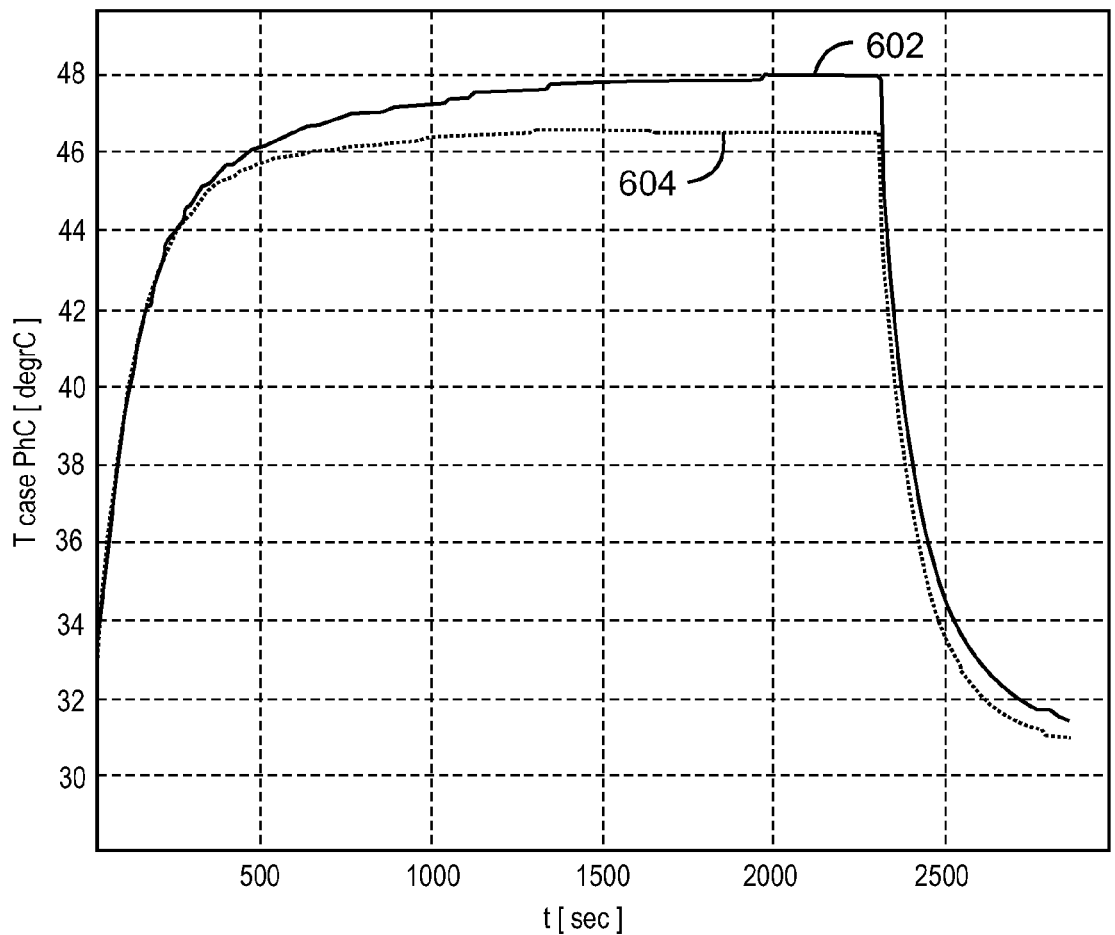
Figure 6D:
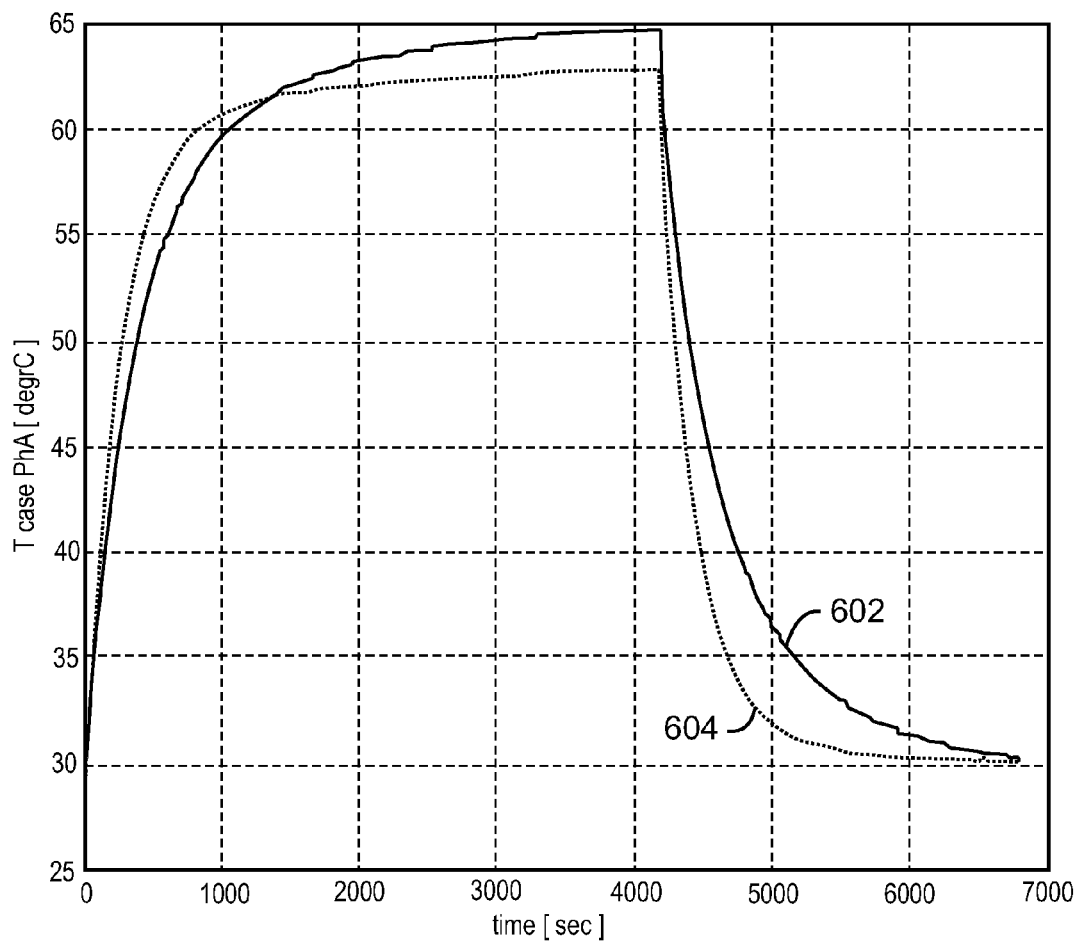
Figure 6E:
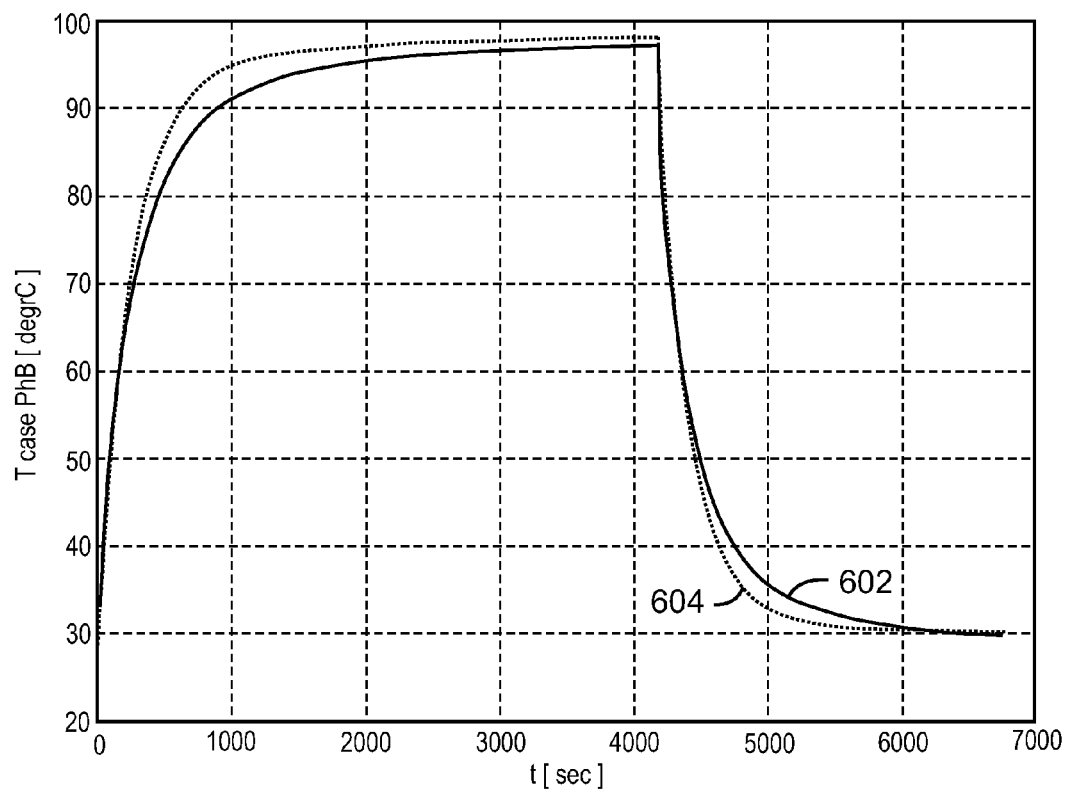
Figure 6F:
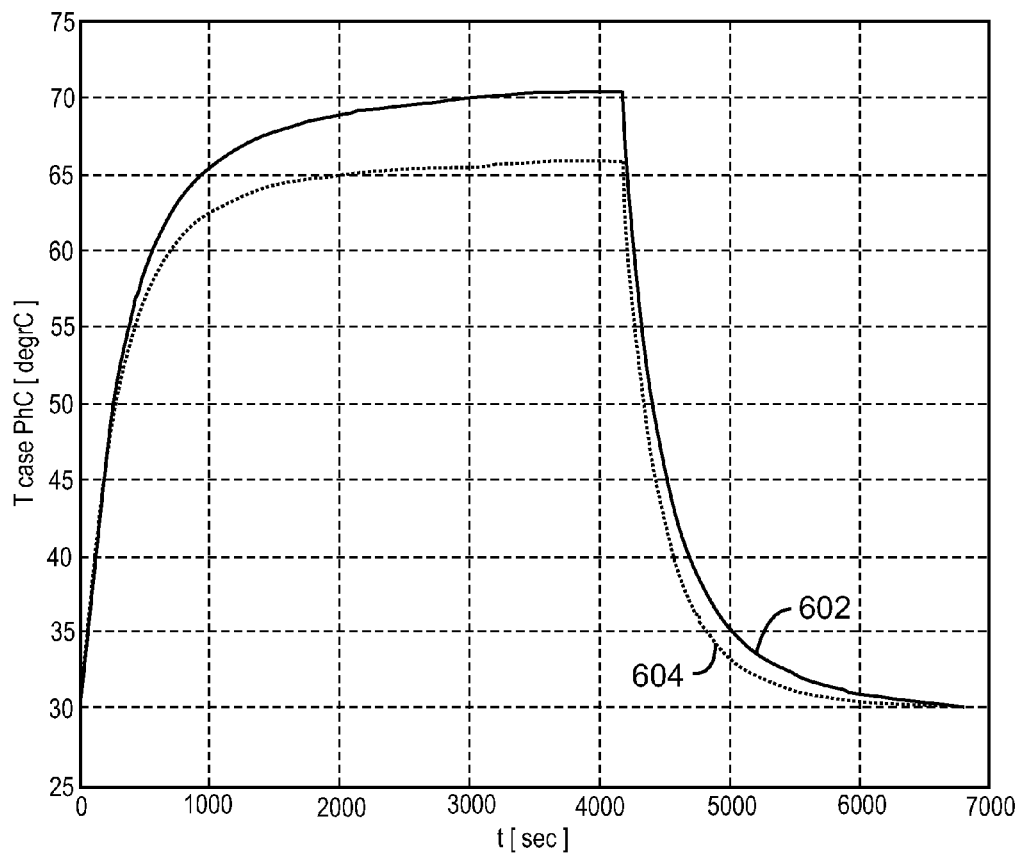

FIGS. 6A-C compare the measured temperatures and the computer modeled temperatures determined for an air flow of 200 SCFM and current, Io, of 200 amperes. FIG. 6A shows a graph of the case temperature, Tcase, at the hottest spot under phase A. FIG. 6B shows a graph of the case temperature, Tcase, at the hottest spot under phase B. FIG. 6C shows a graph of the case temperature, Tcase, at the hottest spot under phase A. Similarly, FIGS. 6D-F compare the measured temperatures and the computer modeled temperatures determined for an air flow of 60 SCFM and current, Io, of 100 amperes. FIG. 6D shows a graph of the case temperature, Tcase, at the hottest spot under phase A. FIG. 6E shows a graph of the case temperature, Tcase, at the hottest spot under phase B. FIG. 6F shows a graph of the case temperature, Tcase, at the hottest spot under phase A.

In each of FIGS. 6A-F, the measured temperatures are represented by the solid line 602 and the computer modeled temperatures are represented by the dashed line 604. As shown in FIGS. 6A-F, the measured temperatures and the computer modeled temperatures are very close. Specifically, the difference between the measured and computer modeled temperatures varies between approximately 0.4 to 4.4 degrees Celsius (Degr C.). Thus, it will be appreciated the thermal resistances and the thermal model described above, provides a suitable method for modeling temperatures in the double H-bridge 200.

In an embodiment, regression techniques may be used to derive equations for the thermal resistances RCA, RA, RC, RBC, and RB as a function of the flow rate of the cooling air. Test data can be collected for each of the test configurations shown in FIGS. 4A-C. For each test configuration, thermal tests may be performed at airflows of 200, 150, 100, 60, 35 and 0 SCFM and current, Io, of 200 A, 100 A and 50 A. Also, to find the part-to-part variation between different double H-bridges, five additional double H-bridge modules have been tested at airflow 200 SCFM and 200 A, 100 A and 50 A. The data gathered from these tests is shown below in tables 1 through 14. In tables 8, 10, 12, 14, 16, 18, and 20, the labels S1, S2, S3, S4, S5, and S6 represent the data gathered for the different modules used in the tests.

TABLE 7

RBt_inv

| RBt_inv SCFM | 200 | 100 | 50 | AVERAGE | minus 0.009 RBt_inv |
|---|---|---|---|---|---|
| 200 | 0.0576757 | 0.05722534 | 0.0535175 | 0.05614 | 0.04714 |
| 150 | 0.0677738 | 0.06649913 | 0.0680296 | 0.06743 | 0.05843 |
| 100 | 0.085742 | 0.0838515 | 0.0832042 | 0.08427 | 0.07527 |
| 60 | | 0.11603032 | 0.1128681 | 0.11445 | 0.10545 |
| 35 | | 0.16623343 | 0.1641608 | 0.16520 | 0.15620 |
| 0 | | not equalized | 0.9165984 | 0.91660 | 0.90760 |

TABLE 8

RCt_inv at 200 SCFM

| | 200 | 100 | 50 | AVERAGE | minus 0.009 RCt_inv |
|---|---|---|---|---|---|
| S1 | 0.05723 | 0.05750 | 0.05404 | 0.05626 | 0.04726 |
| S2 | 0.05751 | 0.05782 | 0.05530 | 0.05688 | 0.04788 |
| S3 | 0.05764 | 0.05502 | 0.05351 | 0.05539 | 0.04639 |
| S4 | 0.05838 | 0.05850 | 0.05419 | 0.05702 | 0.04802 |
| S5 | 0.05793 | 0.05769 | 0.05613 | 0.05725 | 0.04825 |
| S6 | 0.05874 | 0.05647 | 0.05686 | 0.05736 | 0.04836 |

TABLE 9

RCt_inv

| RCt_inv SCFM | 200 | 100 | 50 | AVERAGE | minus 0.009 RCt_inv |
|---|---|---|---|---|---|
| 200 | 0.057232732 | 0.057501876 | 0.054042963 | 0.05626 | 0.04726 |
| 150 | 0.06649584 | 0.065972495 | 0.067532177 | 0.06667 | 0.05767 |
| 100 | 0.082823 | 0.082282327 | 0.081988819 | 0.08236 | 0.07336 |
| 60 | | 0.114911991 | 0.11265315 | 0.11378 | 0.10478 |
| 35 | | 0.164402984 | 0.164444504 | 0.16442 | 0.15542 |
| 0 | | not equalized | 0.923550337 | 0.92355 | 0.91455 |

TABLE 10

RAt_inv at 200 SCFM

| | 200 | 100 | 50 | AVERAGE | minus 0.009 RAt_inv |
|---|---|---|---|---|---|
| S1 | 0.064074 | 0.065422 | 0.062862 | 0.064120 | 0.05512 |
| S2 | 0.063884 | 0.065484 | 0.064512 | 0.064627 | 0.05563 |
| S3 | 0.064531 | 0.0634 | 0.062545 | 0.063491 | 0.05449 |
| S4 | 0.064364 | 0.065815 | 0.062237 | 0.064138 | 0.05514 |
| S5 | 0.063778 | 0.064906 | 0.064362 | 0.064349 | 0.05535 |
| S6 | 0.058187 | 0.064651 | 0.066080 | 0.062972 | 0.05397 |

TABLE 11

RAt_inv

| RAt_inv SCFM | 200 | 100 | 50 | AVERAGE | minus 0.009 RAt_inv |
|---|---|---|---|---|---|
| 200 | 0.0640738 | 0.06542199 | 0.0628625 | 0.06412 | 0.05512 |
| 150 | 0.073421 | 0.07486458 | 0.0768599 | 0.07505 | 0.06605 |
| 100 | 0.094100 | 0.09847793 | 0.0983238 | 0.09697 | 0.08797 |
| 60 | | 0.12670651 | 0.1283553 | 0.12753 | 0.11853 |
| 35 | | 0.16580480 | 0.1741297 | 0.16997 | 0.16097 |
| 0 | | not equalized | 0.9114758 | 0.91148 | 0.90248 |

TABLE 12

RBt_inv at 200 SCFM

| | 200 | 100 | 50 | AVERAGE | minus 0.009 RAt_inv |
|---|---|---|---|---|---|
| S1 | 0.057676 | 0.05723 | 0.05352 | 0.05614 | 0.04714 |
| S2 | 0.058040 | 0.05731 | 0.05472 | 0.056691 | 0.04769 |
| S3 | 0.057548 | 0.05484 | 0.05309 | 0.055158 | 0.04616 |
| S4 | 0.057223 | 0.05602 | 0.05363 | 0.055625 | 0.04662 |
| S5 | 0.056408 | 0.05525 | 0.05449 | 0.055385 | 0.04638 |
| S6 | 0.058187 | 0.05633 | 0.05616 | 0.056892 | 0.04789 |

TABLE 13

RCt_hb_CA-TEST

| SCFM | 200 A | 100 A | 50 A | AVERAGE | minus 0.009 RCt_hb_CA |
|---|---|---|---|---|---|
| 200 | 0.05420 | 0.05406 | 0.05202 | 0.05342 | 0.04442 |
| 150 | 0.06156 | 0.06087 | 0.06010 | 0.06084 | 0.05184 |
| 100 | 0.07443 | 0.07423 | 0.07122 | 0.07329 | 0.06429 |
| 60 | | 0.09952 | 0.09764 | 0.09858 | 0.08958 |
| 35 | | 0.13827 | 0.13349 | 0.13588 | 0.12688 |
| 0 | | 0.59907 | 0.59907 | 0.59007 | |

TABLE 14

RCt_hb_CA_TEST at 200 SCFM

| | 200 A | 100 A | 50 A | AVERAGE | minus 0.009 RCt_hb_CA__ |
|---|---|---|---|---|---|
| S1 | 0.05420 | 0.05406 | 0.05202 | 0.05342 | 0.04442 |
| S2 | 0.05531 | 0.05546 | 0.05319 | 0.05466 | 0.04566 |
| S3 | 0.05287 | 0.05273 | 0.05320 | 0.05293 | 0.04393 |
| S4 | 0.05511 | 0.05552 | 0.05324 | 0.05462 | 0.04562 |
| S5 | 0.05585 | 0.05612 | 0.05679 | 0.05625 | 0.04725 |
| S6 | 0.05471 | 0.05474 | 0.05453 | 0.05466 | 0.04566 |

From equations 3.22 to 3.77, the parameters used to calculate RA, RB, RC, RBC, and RCA are RCt_inv, RBt_hb_BC, RCt_hb_BC, RAt_hb_CA & RCt_hb_CA. The part-to-part variation of these parameters between different double H-bridges can be described using statistical analysis. For example, the data shown in tables 8, 10, 12, 14, 16, 18, and 20 can be input into a statistical modeling package, such as Minitab®. The statistical data for these parameters is shown below in table 21.

TABLE 21

| Parameter | N | Mean | Median | TrMean | StDev | SE Mean |
|---|---|---|---|---|---|---|
| RCt_inv | 6 | 0.04769 | 0.04795 | 0.04769 | 0.00075 | 0.00030 |
| RBt_hb_BC | 6 | 0.04627 | 0.04552 | 0.04627 | 0.00186 | 0.00076 |
| RCt_hb_BC | 6 | 0.04174 | 0.04190 | 0.04174 | 0.00065 | 0.00026 |

TABLE 21-continued

| Parameter | N | Mean | Median | TrMean | StDev | SE Mean |
|---|---|---|---|---|---|---|
| RAt_hb_CA | 6 | 0.05671 | 0.05628 | 0.05671 | 0.00117 | 0.00048 |
| RCt_hb_CA | 6 | 0.04542 | 0.04564 | 0.04542 | 0.00116 | 0.00047 |

The statistical data can be used to determine the upper specification limits (USL) for each for each of the parameters RCt_inv, RBt_hb_BC, RCt_hb_BC, RAt_hb_CA & RCt_hb_CA and the upper specification limits for the resulting thermal resistances RA, RB, RC, RBC, and RCA. For example, using equations 3.22 to 3.27 and the mean and standard deviations computed for the thermal resistance parameters shown in table 21, a statistical analysis, such as a Monte Carlo analysis, can be applied to obtain the mean ($\mu$) and standard deviation ($\sigma$) for RA, RB, RC, RBC, RCA at 200 SCFM. The mean and standard deviation for each thermal resistance RA, RB, RC, RBC, RCA at 200 SCFM can be used to compute the USL for each of the thermal resistances at 200 SCFM using the following equation:

$$Z = (USL - \mu)/\sigma$$

In the equation above, Z represents the number of standard deviations that can fit between the upper specification limit and the mean value, and USL, $\mu o$, and $\sigma o$ represent the upper specification limit, mean, and standard deviation for a specific thermal resistance parameter RA, RB, RC, RBC, RCA at 200 SCFM. Using Z=3 and solving for the USL provides:

$$USL = \sigma * 3 + \mu$$

Using a Z value of three ensures that the double H-bridge design will be robust enough to accommodate a large part to part variation. In table 21, the mean ($\mu o$) and standard deviation ($\sigma o$) of each thermal resistance (RA, RCA, RC, etc.) have been identified for 200 SCFM cooling. Using these values and Z=3, USLRXX__200 SCFM can be identified. Then, the ratios of K1=$\mu o$/RXX200 SCFM, K2=USLRXX200 SCFM/RXX200 SCFM and K3=$\sigma o$/RXX200 SCFM can be identified. Using these ratios, equations 3.22 to 3.27 and data from tables 7, 9, 11, 13 and 21 the USLRXX at all tested cooling conditions can be identified. An example calculation of the thermal resistance value RCA is shown below in tables 22 and 23. In this example, the statistical analysis for the thermal resistance RCA, using the data from table 21, provided a mean ($\mu o$) at 200 SCFM of 0.05092 and a standard deviation ($\sigma o$) at 200 SCFM of 0.00153. These values were used in the example calculations shown below in tables 22 and 23.

TABLE 22

| statistical results from the 6 samples | | | | | |
|---|---|---|---|---|---|
| $\mu o$ | $\sigma o$ | $Z * \sigma o + \mu o$ USL for Z = 3 | $\mu o$/ RCA200 SCFM K1 | USL/ RCA200 SCFM K2 | $\sigma o$/RCA200 SCFM K3 |
| 0.00578 | 0.00099 | 0.00875 | 0.890996 | 1.348825786 | 0.152610003 |

TABLE 23

| SCFM | RCt_inv | RCt_hb_CB | RCA | RCA * K1 $\mu$ | RCA * K2 USLRCA | RCA * K3 $\sigma$ | (USL − $\mu$)/$\sigma$ Z |
|---|---|---|---|---|---|---|---|
| 200 | 0.047259 | 0.040772 | 0.006487 | 0.00578 | 0.008750 | 0.0009900 | 3 |
| 150 | 0.057667 | 0.049078 | 0.008588 | 0.00765 | 0.011584 | 0.0013107 | 3 |
| 100 | 0.073365 | 0.061302 | 0.012063 | 0.01075 | 0.016271 | 0.0018409 | 3 |
| 60 | 0.104783 | 0.085042 | 0.019740 | 0.01759 | 0.026626 | 0.0030126 | 3 |
| 35 | 0.155424 | 0.123927 | 0.031496 | 0.02806 | 0.042483 | 0.0048067 | 3 |
| 0 | 0.914550 | 0.704386 | 0.210164 | 0.18726 | 0.283475 | 0.0320732 | 3 |

Using the same method described above for each of the thermal resistances, RA, RB, RC, RBC, and RCA, provides the USL values shown below in table 24.

TABLE 24

| SCFM | RCA | RA | RC | RBC | RB |
|---|---|---|---|---|---|
| 200 | 0.008750 | 0.055510 | 0.044130 | 0.006450 | 0.050850 |
| 150 | 0.011584 | 0.064519 | 0.051292 | 0.013248 | 0.057547 |
| 100 | 0.016271 | 0.084447 | 0.067135 | 0.020643 | 0.071985 |
| 60 | 0.026626 | 0.112248 | 0.085785 | 0.034592 | 0.094386 |
| 35 | 0.042483 | 0.139661 | 0.111029 | 0.064947 | 0.128310 |
| 0 | 0.283475 | 0.477457 | 0.379574 | 0.738187 | 0.458063 |

The USL values obtained for each thermal resistance, RA, RB, RC, RBC, and RCA, can then be used to derive regression equations for each of the thermal resistances. For example, regression techniques may be applied to the USL values to derive equations for computing the USL of each thermal resistance as a function of the air flow rate used to cool the heatsink. Applying regression techniques to the example data of table 24 provided the following regression equations:

$$RCA = -0.02328 + 0.30685/(1+((SCFM/2.216)^{0.487})) \quad \text{eq. 3.30}$$

$$RA = -0.05826 + 0.5357/(1+((SCFM/10.98)^{0.46})) \quad \text{eq. 3.31}$$

$$RC = -0.0145 + 0.394/(1+((SCFM/9.158)^{0.568})) \quad \text{eq. 3.32}$$

$$RBC = -0.01547 + 0.7537/(1+((SCFM/2.198)^{0.779})) \quad \text{eq. 3.33}$$

$$RB = 0.045607 + 0.12515 * \exp(-SCFM/65.1) + 0.291 * \exp(-SCFM/10.6) \quad \text{eq. 3.34}$$

In an embodiment, thermal capacitances for each of the phases may be determined. To determine the thermal capacitances of each phase, thermal test temperatures may be obtained using the test configuration described in FIGS. 4B and 5. Specifically, the current, Io, may be applied to the phase B and phase C dual IGBT modules as described in relation to FIG. 4B. Temperature measurements can be taken after the current, Io, is turned off while continuing to supply air flow to the heatsink. In an embodiment, the air flow rate during the thermal cooling test may be set to 150 SCFM and Io=200 A. The thermal test measurements define a set of thermal cooling curves. Using the thermal cooling curves for 150 SCFM and Io=200 A tests, it was identified that the thermal time constant, Tau, of the heatsink was 151 sec for the thermal impedance of phase B. The thermal capacitance, CB, situated in parallel to RBt, can then be determined using the following formula:

$$Tau=RBt*CB$$

Applying the average RBt value at 150 SCFM (RBt_hb_BC_TEST−0.009) of 0.058868 degrees C./W and solving for CB yields:

$$CB=151/0.058868=2565 \text{ joules/Degree C.}$$

Note that in the above equation, the value of RBt is not the USL value, but rather the measured test data as shown in table 17. Further, an equation describing the test cooling curve as a function of time may be expressed as follows:

$$deltaTB=(33.8-0.8)*exp(-t/151)+0.8$$

In the above formula, t is time, and deltaTB represents the change in temperature under phase B for a given time, t. Taken from the test data, 33.8 degr C. is the starting temperature at t=0 and 0.8 degr C. is the final temperature (offset) of the cooling curve. The formula is based on the assumption that the cooling curve has an exponential form. The equation above can be used to compute an estimated cooling curve that represents the estimates temperature of phase B, TB, minus the temperature of the inlet air, Tinlet, over time, t. The resulting curve can be compared to the measured cooling curve in order to prove its assumed exponential behavior, as shown in FIG. 7A.

FIG. 7A is a graph comparing the estimated phase B cooling curve to the measured phase B cooling curve. Specifically, the y-axis represents the temperature of phase B, TB, minus the temperature of the inlet air, Tinlet, in degrees C. The x-axis represents time, t, in seconds. In the graph of FIG. 7A, the measured cooling curve for TB-Tinlet is represented by the solid line 702 and the estimated cooling curve for TB-Tinlet is shown by the dashed line 704. Based on the graph of FIG. 7A, it will be appreciated that the estimated cooling curve is a close fit to the measured cooling curve. The same time constant, tau, may also be applied to compute an estimated cooling curve for phase C, as shown in FIG. 7B.

Figure 7B:
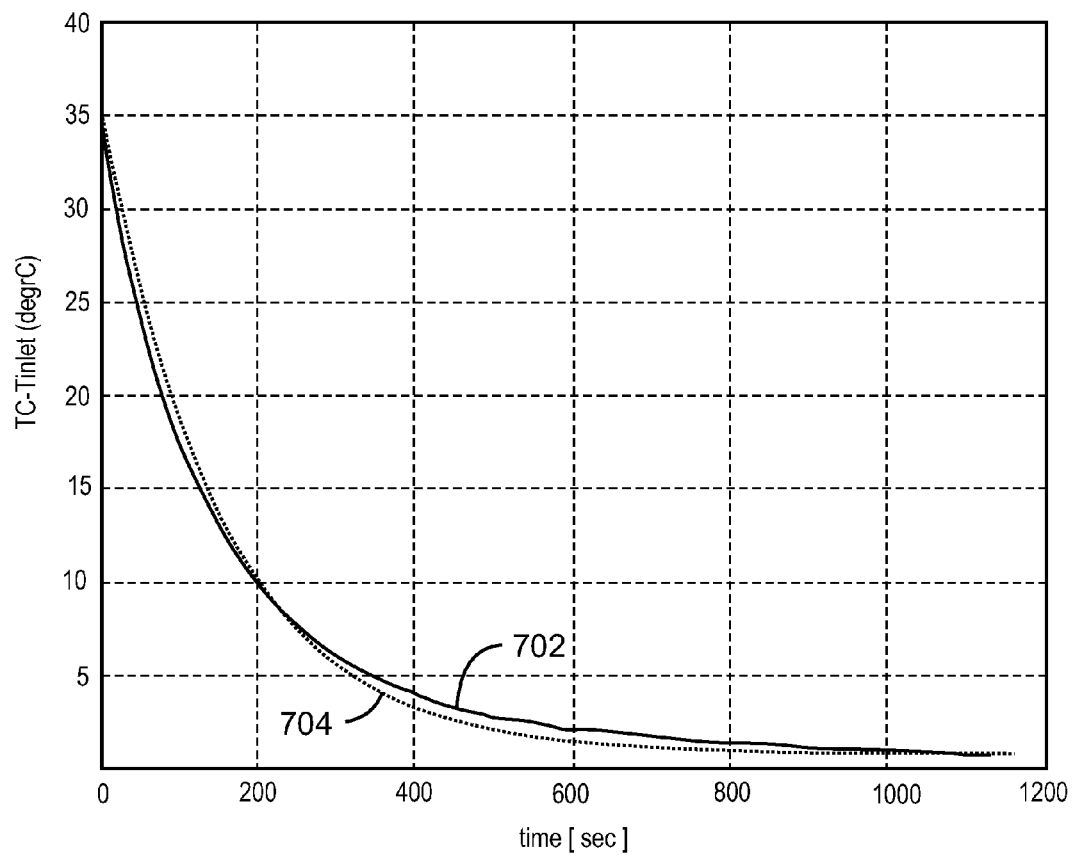

FIG. 7B is a graph comparing the estimated phase C cooling curve to the measured phase B cooling curve. Specifically, the y-axis represents the temperature of phase C, TC, minus the temperature of the inlet air, Tinlet, in degrees C. The x-axis represents time, t, in seconds. In the graph of FIG. 7B, the measured cooling curve for TB-Tinlet is represented by the solid line 702 and the estimated cooling curve for TB-Tinlet is shown by the dashed line 704. Based on the graph of FIG. 7B, it will be appreciated that the estimated cooling curve is a close fit to the measured cooling curve. Thus, the same time constant, Tau, derived for phase B may also be applied to predict the cooling of phase C. It is reasonable that the thermal time constant, Tau, is the same for all phases, because all three phases are coupled to the same heatsink which provides the same thermal mass for each phase.

Based on the above description, it will be appreciated that the thermal time constant, Tau, at a given air flow rate will be the same for each phase. Additionally, Tau may be determine according to the following formula, wherein Rth represents the thermal resistance and Cth represents the thermal capacitance:

$$Tau=Rth*Cth$$

Solving for the thermal capacitance, Cth, yields:

$$Cth=Tau/Rth$$

If the double H-bridge is operated with a different air flow rate, the thermal capacitance, Cth, of each phase will remain constant, but Tau and Rth will change. Thus, CB will equal 2565 J/degr C. for any air flow rate, but RBt will change from RBt(150 SCFM) and therefore Tau will change from 151 sec. For different phases at an air flow rate of 150 SCFM, it was shown that Tau remained 151 sec. Since RAt is different from RBt which is different from RCt, then CB will be different from CC which will different from CA. Solving for the phase C and phase A thermal capacitances, CC and CA, yields:

$$CC=Tau/RCt\_hb\_BC\_TEST-0.009=151/0.049078=3077 \text{ J/degr C.}$$

$$CA=Tau/RAt\_hb\_CA\_TEST-0.009=151/0.065987=2288 \text{ J/degr C.}$$

Using the thermal impedance models developed above, values can be determined for the thermal resistances and thermal capacitances applicable to each of the phases of the double H-bridge under various loading conditions and air flow rates. These values may then be used to predict the thermal behavior of the double H-bridge during normal operation. Being able to predict the thermal behavior of the double H-bridge during operation can enable a number of useful improvements to the double H-bridge, and associated control circuitry. For example, improved ventilation and overtemperature protection techniques may be developed, as described further below in reference to FIGS. 21-24. Having identified the equations for estimating the various relevant thermal impedances, we will develop a process to estimate the power dissipation in each phase and, combining the two, estimate the junction temperature of the IGBT's in each phase.

Junction Temperature Estimation Models

FIG. 8 is a block diagram of a system that uses a double H-bridge, in accordance with embodiments. As shown in FIG. 8, the output of phase A 202 of the double H-bridge is coupled to a field winding 802, through a transformer 804 and a pair of silicon controlled rectifiers (SCRs) 806. The output of phase C 206 of the double H-bridge is coupled to a battery 808, through a transformer 810 and battery charging circuitry such as diodes 812, capacitor 814, and inductor 816. The phase B output is common to both the battery 808 and the field winding 802 and is coupled to both transformers 804 and 810. The output voltage of the phase A IGBTs is referred to herein as Va, the output voltage of the phase B IGBTs is referred to herein as Vb, and the output voltage of the phase C IGBTs is referred to herein as Vc. The double H-bridge configuration shown in FIG. 8 provides both isolation and reduction of the DC input voltage, Vlink, for the battery 808 and the field winding 802, although only voltage reduction is used for the field winding 802. During operation, the IGBTs may be switched to produce the waveforms shown in FIG. 9.

FIG. 9 is a graph of the output voltages of the Phase A, Phase B, and Phase C IGBTs. In the graph of FIG. 9, line 902 represents the voltage output, Vb+, of phase B. The voltage output of phase A or B is represented by the line 904 and referred to as Vj+, wherein j can equal A or B. The difference between Vb+ and Vj+ is the voltage in the primary winding of the transformer (transformer 804 or 810 depending on which phase is active) and is referred to herein as Vprim and represented by line 906. In an embodiment, the period, T, 908 of both output waveforms can be approximately 1/600 seconds. The time, ton, referred to by line 910, represents the amount of time that the corresponding IGBT is switched on and conducting output current to the transformer 804 or 810.

FIG. 10 is a graph of the expected output current superimposed over the output voltages of FIG. 9. In the graph of FIG. 10, the dashed line 1002 represents the current output, Ib+, of phase B. The current output of phase A or B is represented by the dashed line 1004 and referred to as Ij+, wherein j can equal A or B. The summation of Ib+ and Ij+ is the current in the primary winding of the transformer (804 or 810 depending on which phase is active) and is referred to herein as Iprim and represented by line 1006. Additionally, the shaded areas represent the current in freewheeling diode 208 of the module. In an embodiment, the characteristics of the current waveforms in the IGBTs 104 and the diodes 208 may be determined in order to provide a model for predicting the uneven power losses in the pair of IGBTs 104 of each phase. Based on the derived power loss model, the junction temperatures of the IGBTs 104 for each phase may be modeled.

FIG. 11 is a graph of the output current from a single H-bridge. The graph of FIG. 11 will be described in relation to FIGS. 1 and 8, wherein the output 112 (FIG. 1) may be coupled to the primary winding of the transformer 804 or 810 (FIG. 8). Given an H-bridge configuration such as the H-bridge 100 shown in FIG. 1, the average load current at the output 112 will equal the average current in the secondary winding of the transformer 804 or 810 and may be determined through measurement. Using the known average load current, the average current in the primary winding of the transformer can be obtain by the following equation:

$$Ipr\_average = (Iload\_av/n) + Imagn \qquad \text{eq. 4.1}$$

In the above equation, Ipr_average represents the average current in the primary winding of the transformer 804 or 810, n equals the turns ratio of the transformer, and Imagn represents the magnetizing current of the transformer 804 or 810. In an embodiment, n is approximately 2.875 for the transformer 810 corresponding to the battery 808 and n is approximately 6.33 for the transformer 804 corresponding to the field winding 802. Further, the magnetizing current, Imagn, may be approximately 30 amperes for both transformers 804 and 810. The average current in the primary winding of the transformer 804 or 810 is shown in FIG. 11 by line 1102.

Furthermore, for a single period, T, the average current in the primary winding of the transformer, Ipr_average, will be divided between the two phases of the H-bridge, yielding I_phase 1_average, represented by line 1104, and I phase_2 average, represented by line 1106. Thus, the average current for a single phase over an entire period, T, will equal one half of Ipr_average, which is referred to a Ik and represented by line 1108. Further, the actual shape of the current waveform for a single phase is shown by lines 1108 and 1110, where line 1108 represents the current in the IGBT 104 and line 1110 represents the current in the diode 208. The current waveform for phase A and Phase C of the double H-bridge 200 is described further below, in reference to FIGS. 12-15.

FIG. 12A is a graph of the current waveform for a phase A or phase C IGBT 104. As shown in FIG. 12A, the current waveform may include a first portion 1202, characterized by current that rises at rate, a, and a second portion 1204 characterized by a current that rises at rate, b. The rates, a and b, may be obtained using the following equations:

$$a = di/dt = Vdc/[Lleak] \qquad \text{eq. 4.2}$$

$$b = di/dt = Vdc/[Lleak + Lmagn \| Lload*n^2] \qquad \text{eq. 4.3}$$

In the above equations, Lleak represents the leakage inductance of the primary winding of the transformer 804 (approximately 29 uH) or 810 (approximately 23 uH), Lmagn is the magnetizing inductance of the transformer 804 (approximately 26 mH) or 810 (approximately 4.9 mH), Lload is the inductance of the load seen by the transformer 804 (approximately 0.22H) or 810 (approximately 1 mH), and n is the turns ratio of the transformer 804 or 810 (see FIG. 8). An example of the rates, a and b, computed for the phase C IGBTs corresponding to the battery 808 are shown in table 25. An example of rates, a and b, computed for the phase A IGBTs corresponding to the field winding 802 are shown in table 26.

TABLE 25

Battery

| Ibatt (A) | Vdc (V) | a (A/s) = Vdc/Lleak Prim [A/sec] | b (A/s) = Vdc/Lb [A/sec] | a/b |
|---|---|---|---|---|
| 225 | 250 | 10995294.01 | 80875.96 | 135.95 |
| 380 | 400 | 17592470.42 | 129401.54 | 135.95 |
| 380 | 500 | 21990588.03 | 161751.93 | 135.95 |
| 380 | 800 | 35184940.85 | 258803.08 | 135.95 |
| 380 | 900 | 39583058.45 | 291153.47 | 135.95 |
| 380 | 1000 | 43981176.06 | 323503.85 | 135.95 |
| 380 | 1100 | 48379293.66 | 355854.24 | 135.95 |
| 380 | 1200 | 52777411.27 | 388204.62 | 135.95 |
| 380 | 1300 | 57175528.87 | 420555.01 | 135.95 |
| 380 | 1500 | 65971764.08 | 485255.78 | 135.95 |

TABLE 26

Field

| Ifield (A) | Vfield (V) = 0.161 * Ifield | Vdc (V) | a (A/s) = Vdc/Lleak Prim [A/sec] | b(A/s) = Vdc/Lb [A/sec] | a/b |
|---|---|---|---|---|---|
| 125 | 20.13 | 250 | 8611780.92 | 9752.48 | 883.04 |
| 200 | 32.20 | 400 | 13778849.47 | 15603.96 | 883.04 |
| 325 | 52.33 | 700 | 24112986.57 | 27306.93 | 883.04 |
| 400 | 64.40 | 875 | 30141233.21 | 34133.67 | 883.04 |
| 400 | 64.40 | 1300 | 44781260.76 | 50712.88 | 883.04 |
| 125 | 20.13 | 1500 | 51670685.50 | 58514.86 | 883.04 |

Figure 12B:
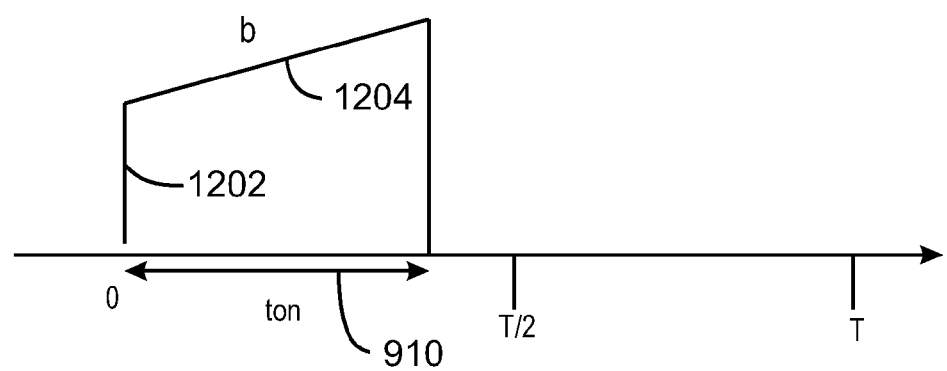

Based on the results for the rates, a and b, shown in tables 25 and 26 it can be appreciated that for all values of the link voltage, Vdc, 102 (FIG. 8), a is much greater than b. Accordingly, the current waveform shown in FIG. 12A can be simplified to the current waveform shown in FIG. 12B. As shown in FIG. 12B, the slope of the first portion 1202 is assumed to be infinite.

FIGS. 13A-C are graphs showing current waveforms for the IGBTs 104 and diodes 208 of a phase B. With reference to FIG. 10, Iprim, represented by line 1006 shows the current in the primary winding of either phase A or phase C, depending on which phase is being activated. Because phase B is common, it will be appreciated that the +ve portion of Iprim flows through the B+ IGBT and the −ve portion of Iprim flows through the B− IGBT. The shape of the current in phase B can be described in FIGS. 13A-C.

As shown in FIG. 13A, at the time that the IGBT is switched on (t=0) the current in the IGBT rises to Ix 1302. During the on time of the IGBT 104, ton, the current in the IGBT 104 rises to Iy 1304 at rate b. After the IGBT 104 is switched off at time, ton 910, the current is in the IGBT 104 falls to zero and the current in the diode 208 rises to Iy 1304. The current in the diode then falls to zero at the rate, −b, and reaches zero after the passage of time t3, which is referred to by line 1306. The average current through the IGBT of phase B can be determined using the following equation:

$$IBave = Io*ton + Iod*[\text{time that diode of other phases conduct}] \qquad \text{eq. 4.4}$$

In the above equation, IBave is the average current through phase B, Io is the average of Ix & Iy, which is the average current in IGBTs in phase A or C during ton. Iod is the average current though the diode in phase A or C, during the time the diode is on. In both cases, this current also goes through the IGBT of phase B.

Since the falling rate di/dt of −b is fixed, there are three possible scenarios for the shape of the diode current. As used herein, t3 equals the half period, T/2, minus the time that the IGBT is on, ton. Further, tf (referred to by line 1308) is defined as the time that it would take for Iy (initial current of the diode) to diminish to zero, and equals Iy/b. The time t4 (not shown) is defined as the time during t3 that the diode carries current. Further, tz (not shown) is defined as the magnitude of the current in the diode at the time that the other IGBT 104 in the dual IGBT is switched on. The first scenario is shown in FIG. 13A, which shows the case wherein the diode current reaches zero at the half period, T/2. In other words, t4 equals t3 equals tf. At T/2 the other IGBT 104 in the dual IGBT is switched on. In the scenario shown in FIG. 13A, there is no remaining current in the diode at the time that the other IGBT 104 in the dual IGBT switched on. In other words, tz equals 0. Further, it will be noticed that that Ipr_diode becomes max at tf=t3.

FIG. 13B shows a second scenario for the diode current, wherein tf is less than t3. In the scenario shown in FIG. 13B t4 equals tf and Iz equals zero. Thus, for both phases A and C, the contribution of the IGBT current to Ipr_av may be determined according to the following formula:

$$Ipr\_av\_igbt = Io * ton * f \quad \text{eq. 4.5}$$

For both phases A and C, the contribution of the diode current to Ipr_av may be determined according to the following formula:

$$Ipr\_av\_diode = Iod * tf * f \quad \text{eq. 4.6}$$

The average current though the diode can be determining using the following equation:

$$Iod = (Iy + Iz)/2 = Iy/2 \quad \text{eq. 4.7}$$

FIG. 13C shows a third scenario for the diode current, wherein tf is greater than t3. In the scenario shown in FIG. 13C, t4 equals t3 and Iz is a non-zero value which represents the current remaining at the end of T/2, which is the current that will be switched off. For both phases A and C, the contribution of the IGBT current to Ipr_av may be determined according to equation 4.5 above. In the scenario shown in FIG. 13C, the average current though the diode can be determining using the following equation:

$$Iod = (Iy + Iz)/2 \rightarrow Iz = 2 * Iod - Iy \text{ where } Iz > 0 \quad \text{eq. 4.8}$$

In the scenario shown in FIG. 13C, for both phases A and C, the contribution of the diode current to Ipr_av may be determined according to the following formula:

$$Ipr\_av\_diode = Iod * t3 * f = [Iy - b * t3/2] * t3 * f \quad \text{eq. 4.9}$$

Based on the three scenarios described above, it can be appreciated that if tf is less than or equal to t3 then t4 equals tf. Further, if the Phase B IGBTs are switching OFF at zero current, there will be no switching OFF losses and the Phase A or phase C diodes have no Err losses.

From equation 4.1 above it can be appreciated that if the desired current, Iload_av, is known, the value Ipr_average can be calculated. Half of Ipr_average will come from one phase (50% on). Therefore, $$Ipr\_av/2 = Ik = Ipr\_av\_igbt + Ipr\_av\_diode \quad \text{eq. 4.10}$$

Further, the current, Iy, can also be expressed as a function of Io, as shown in the equation below:

$$Iy = Io + b * (ton/2) \quad \text{eq. 4.11}$$

With regard to Ipr_av_diode, if tf is less than or equal to t3, equations 4.6 and 4.7 yield:

$$Ipr\_av\_diode = (Iy/2) * tf * f \quad \text{eq. 4.12}$$

If tf is greater than, equation 4.9 yields:

$$Ipr\_av\_diode = (Iy - b * t3/2) * t3 * f \quad \text{eq. 4.13}$$

Since Iy is a function of Io and by definition Iy−b*tf=0, the following equation can be obtained:

$$tf = Iy/b = [Io + (ton/2)]/b$$

The equation above has two unknowns, Io and ton, so it cannot be solved in the form shown above. However, if tf>=t3 that indicates that ton is large enough, in combination with the level of Ix and the rate b, that there is not enough t3 time (T/2−ton) for the current through the diode to die off before the half period expires. This is clearly the case of low-voltage, high-current operation and t4=t3. On the other hand, if tf<t3 that indicates that ton is not large enough, in combination with the level of Ix and the rate b (and therefore Iy), that there is enough t3 time (T/2−ton) for the current through the diode to die off before the half period expires. This is clearly the case of high-voltage operation and t4=tf.

It will also be appreciated that for t4=t3 (case of tf>=t3) the calculation of Ipr_av_diode is very accurate. To resolve the issue of the two unknowns in identifying Ipr_av_diode (and from there Io), for t4=tf (case of tf<t3) the value, Iod, may be slightly overestimated, which will result in slightly overestimating Ipr_av_diode. By using t4=min (t3, tf) in the calculation of Iod=Iy−b*t4/2 it can be ensured that the duration of Iod is correct. So, the only overestimation is in estimating Io (and therefore level of Iod). By approximating t4=t3, the calculation of Ipr_av_diode will be very accurate when tf>=t3, and slightly overestimated when tf<t3. So, t4+t3 is used when estimating Io. This yields the following equations:

$$tf = t3 = t4 = T/2 - ton = 1/(2*f) - ton \quad \text{eq. 4.14}$$

$$ton = (Vprim/Vdc) * 0.5/fr \quad \text{eq. 4.15}$$

$$Vprim = Vload * n \quad \text{eq. 4.16}$$

In an exemplary embodiment, Vload_batt=80V, T/2=1/1200 sec (fr=600 Hz) and Vload field may be computed according to the following equation:

$$Vload\_field = 0.161 \text{ Ohms} * Ifield \quad \text{eq. 4.16a}$$

Thus, knowing the levels of Ifield and Ibatt in the loads, equation 4.16a can be used to find the Vload_field or Vload_batt=80V may be used. Using these values through equation 4.15, ton can be determined for both battery and field excitation cases. Given that Iy=Io+b*ton/2 and also also Iy=Iod+b*t4/2 yields:

$$Iod = Io + (b/2) * (ton - t4) \quad \text{eq. 4.17}$$

Using equation 4.14:

$$Iod = Io + (b/2) * [ton - 1/(2*f) + ton] \rightarrow Iod = Io - (b/2) * [(1/(2*f) - 2*ton] \quad \text{eq. 4.18}$$

From equations 4.5, 4.9, and 410:

$$0.5 * Ipr\_av = Ik = Io * ton * f + Iod * t4 * f$$

Substituting tf from equations 4.18 and 4.14 yields:

$$0.5 * Ipr\_av = Ik = Io * ton * f + [Io - (b/2)] * [(1/(2*f) - 2*ton] * [1/(2*f) - ton] * f \quad \text{eq. 4.19}$$

Referring back to equation 4.3, it is known that:

$$b = Vdc/[Lleak + Lmagn\|Lload * n^2]$$

From equation 4.1:

$$Ipr\_average = (Iload\_av/n) + Imagn$$

Thus, equation 4.19 has only one unknown, Io. Manipulating the expression and solving for Io yields:

$$Ik = f*\{[Io/(2*f)] - (b/2))*[(1/(2*f) - 2*ton]*[(1/(2*f) - ton]\} \rightarrow Ik = Io/(2) - (b*f)*[(1/(2*f) - 2*ton]*[(1/(2*f) - ton] \rightarrow Io = 2*Ik + b*f*[(1/(2*f) - 2*ton]*[(1/(2*f) - ton] \quad \text{eq. 4.20}$$

Battery Charging Example

Equation 4.2 can be used to determine values for Ix and Iy (FIGS. 13A-C) using the steady state spec values for the battery charging circuit, which includes the battery 808 (FIG. 8). Exemplary values for the battery charging circuit are shown below in Table 27.

TABLE 27

| Ibatt (A) | Vdc (V) | Iprim aver = Ibatt/n + Imagn | 0.5 Iprim = Ik | a (A/s) = Vdc/ Lleak Prim | b(A/s) = Vdc/ Lb |
|---|---|---|---|---|---|
| 300 | 1500 | 134.35 | 67.17 | 65971764 | 485255.8 |
| 300 | 1300 | 134.35 | 67.17 | 57175529 | 420555.0 |
| 300 | 875 | 134.35 | 67.17 | 38483529 | 283065.9 |
| 380 | 700 | 162.17 | 81.09 | 30786823 | 226452.7 |
| 380 | 400 | 162.17 | 81.09 | 17592470 | 129401.5 |
| 225 | 300 | 108.26 | 54.13 | 13194353 | 97051.16 |
| 225 | 250 | 108.26 | 54.13 | 10995294 | 80875.96 |

In table 27, Ibatt is the average battery current and Vdc is the link voltage 102. Additionally, the calculations shown in table 27 use a battery voltage, Vload_batt, of 80 Volts, frequency of 600 Hz, and a transformer turns ratio, n, of 2.875 for the transformer 810. Using these values, values for a and b were calculated as shown in table 27. Using the values for a and b shown in Table 27, the values shown in table 28 can be determined.

Based on the values from table 28, it will be noticed that as Vlink becomes higher, ton becomes smaller, and t3 becomes larger. Also, for the higher Vlink values, t3>tf and t4=t3. Thus, for these higher Vlink levels, Iz becomes zero, since the diode current dies off before the half period expires. Since t4=tf<t3 for the higher Vlink levels, t4+ton<half period=0.0008333 sec. Additionally, the peak Iy values, where the IGBT switches OFF, are large (284 A @ 1500V). To verify the accuracy of Io, ton, Iod, and t4, from the tables above, these values may be used to estimate the average load current (Isec_av), as shown below in table 29.

TABLE 29

| Ibatt (A) | Vdc (V) | Io | ton | I igbt aver = Io * ton * f | t4 | I diode aver = Iod * t4 * f | I prim aver = 2 * (sum Iigbt aver + Idiode ave) | Isec aver = (Iprim aver − 30) * n |
|---|---|---|---|---|---|---|---|---|
| 300 | 1500 | 253.0378 | 1.3E−04 | 19.400 | 5.853E−04 | 49.878 | 138.5554 | 312.10 |
| 300 | 1300 | 227.54182 | 1.5E−04 | 20.129 | 6.148E−04 | 47.684 | 135.6244 | 303.67 |
| 300 | 875 | 175.58301 | 2.2E−04 | 23.077 | 6.143E−04 | 44.097 | 134.3478 | 300.00 |
| 380 | 700 | 183.89489 | 2.7E−04 | 30.211 | 5.595E−04 | 50.876 | 162.1739 | 380.00 |
| 380 | 400 | 158.73668 | 4.8E−04 | 45.637 | 3.542E−04 | 35.450 | 162.1739 | 380.00 |
| 225 | 300 | 103.22859 | 6.4E−04 | 39.571 | 1.944E−04 | 14.559 | 108.2609 | 225.00 |
| 225 | 250 | 105.99634 | 7.7E−04 | 48.758 | 6.667E−05 | 5.372 | 108.2609 | 225.00 |

As discussed above, whenever t3>tf=t4 (cases of Vlink=1300V and 1500V above) Iod can be overestimated slightly. This results in a slight overestimation of the Ibatt=Isec_av, shown above in table 29. In all other cases (cases of Vlink 250V to close to 1300V) the estimations are very accurate.

Field Excitation Example

Equation 4.2 can be used to determine values for Ix and Iy (FIGS. 13A-C) using the steady state values for the field excitation circuit, which includes the field winding 802 (FIG. 8). Exemplary values for the battery charging circuit are shown below in Table 30.

TABLE 30

| Ifield (A) | Vfield(V) = 0.161 * Ifield | Vdc (V) | Vprim aver = Vload * n | I igbt/diode aver = .5 Iprim = Ik | a (A/s) = Vdc/ Lleak Prim | b (A/s) = Vdc/Lb |
|---|---|---|---|---|---|---|
| 125 | 20.125 | 1500 | 127.46 | 24.87 | 51670685 | 58514.86 |
| 400 | 64.4 | 1300 | 407.87 | 46.58 | 44781261 | 50712.88 |
| 400 | 64.4 | 875 | 407.87 | 46.58 | 30141233 | 34133.67 |

TABLE 28

| ton = (Vprim/ Vdc) * 0.5/fr | Io = 2 * Ik + b * f * ((1/(2 * f)) − 2 * ton) * ((1/(2 * f)) − ton) | Iy = Io + b * ton/2 | Ix = Io − b * ton/2 | t3 = T/2 − ton | tf = Iy/b | if tf <= t3 t4 = tf if tf > t3 t4 = t3 t4 | Iod = Iy − b * t4/2 | (Io * ton + Iod * tf) * f * 2 = 2 * Ik for half period | t4 + ton | Iz = Iod − b * t4/2 |
|---|---|---|---|---|---|---|---|---|---|---|
| 1.278E−04 | 253.0 | 284.0 | 222.0 | 7.06E−04 | 5.85E−04 | 5.85E−04 | 142.0 | 138.6 | 0.0007131 | 0 |
| 1.474E−04 | 227.5 | 258.5 | 196.5 | 6.86E−04 | 6.15E−04 | 6.15E−04 | 129.3 | 135.6 | 0.0007622 | 0 |
| 2.190E−04 | 175.6 | 206.6 | 144.6 | 6.14E−04 | 7.30E−04 | 6.14E−04 | 119.6 | 134.3 | 0.0008333 | 32.70 |
| 2.738E−04 | 183.9 | 214.9 | 152.9 | 5.60E−04 | 9.49E−04 | 5.60E−04 | 151.5 | 162.2 | 0.0008333 | 88.19 |
| 4.792E−04 | 158.7 | 189.7 | 127.7 | 3.54E−04 | 1.47E−03 | 3.542E−04 | 166.8 | 162.2 | 0.0008333 | 143.91 |
| 6.389E−04 | 103.2 | 134.2 | 72.2 | 1.94E−04 | 1.38E−03 | 1.944E−04 | 124.8 | 108.3 | 0.0008333 | 115.36 |
| 7.667E−04 | 106.0 | 137.0 | 75.0 | 6.67E−05 | 1.69E−03 | 6.667E−05 | 134.3 | 108.3 | 0.0008333 | 131.61 |

TABLE 30-continued

| Ifield (A) | Vfield(V) = 0.161 * Ifield | Vdc (V) | Vprim aver = Vload * n | I igbt/diode aver = .5 Iprim = Ik | a (A/s) = Vdc/ Lleak Prim | b (A/s) = Vdc/Lb |
|---|---|---|---|---|---|---|
| 325 | 52.325 | 700 | 331.39 | 40.66 | 24112987 | 27306.93 |
| 200 | 32.2 | 400 | 203.93 | 30.79 | 13778849 | 15603.96 |
| 175 | 28.175 | 300 | 178.44 | 28.82 | 10334137 | 11702.97 |
| 125 | 20.125 | 250 | 127.46 | 24.87 | 8611781 | 9752.48 |

In table 30, I_av_field is the average current in the field winding and Vdc is the link voltage 102. Additionally, the calculations shown in table 30 use a battery voltage, Vload_batt, of 80 Volts, frequency of 600 Hz, and a transformer turns ratio, n, of 6.33 for the transformer 804 (FIG. 8). Using these values, values for a and b were calculated, as shown in table 30. Using the values for a and b shown in Table 30, the values shown in table 31 can be determined.

TABLE 31

| t2 = (Vprim/Vdc) * 0.5/fr = ton | Io = 2 * Ik + b * f * ((1/(2 * f)) − 2 * ton) * ((1/(2 * f)) − ton) | Iy = Io + b * ton/2 | Ix = Io − b * ton/2 | t3 = T/2 − ton | tf = Iy/b | t4 (if tf <= t3, t4 = tf if tf > t3, t4 = t3) | Iod = Iy − b * t4/2 | (Io * ton + Iod * tf) * f * 2 = 2 * Ik for half period | t4 + ton | Iz = Iod − b * t4/2 |
|---|---|---|---|---|---|---|---|---|---|---|
| 7.081E−05 | 68.25 | 70.33 | 66.2 | 7.6E−04 | 1.2E−03 | 7.6E−04 | 48.02 | 49.74 | 0.0008333 | 25.708 |
| 0.0002614 | 98.56 | 105.19 | 91.9 | 5.7E−04 | 2.1E−03 | 5.7E−04 | 90.69 | 93.16 | 0.0008333 | 76.188 |
| 0.0003884 | 93.67 | 100.30 | 87.0 | 4.4E−04 | 2.9E−03 | 4.4E−04 | 92.71 | 93.16 | 0.0008333 | 85.116 |
| 0.0003945 | 81.63 | 87.02 | 76.2 | 4.4E−04 | 3.2E−03 | 4.4E−04 | 81.03 | 81.32 | 0.0008333 | 75.038 |
| 0.0004248 | 61.52 | 64.83 | 58.2 | 4.1E−04 | 4.2E−03 | 4.1E−04 | 61.64 | 61.58 | 0.0008333 | 58.457 |
| 0.0004956 | 57.26 | 60.16 | 54.4 | 3.4E−04 | 5.1E−03 | 3.4E−04 | 58.18 | 57.63 | 0.0008333 | 56.206 |
| 0.0004248 | 49.70 | 51.77 | 47.6 | 4.1E−04 | 5.3E−03 | 4.1E−04 | 49.78 | 49.74 | 0.0008333 | 47.786 |

Based on the values from tables 30 and 31, it will be noticed that, since Lb is large (25.63 mH), the rate b is small for all the operating range of Vlink. This can also be seen from the relative values of Ix, Io, Iy (close together). Because b is small, tf>t3 for all the operating range of Vlink. Thus, t4 is always greater than t3 unless the desired field current is too low, and therefore ton becomes very short. To verify the accuracy of Io, ton, Iod, and t4, from the tables above, these values may be used to estimate the average load current (Isec_av), as shown below in table 32.

in tables 29 to 32, a computer model may be constructed to estimate values for ton_batt, Ipr_av_batt, ton_f and Ipr_av_f. The estimated values for ton_batt, Ipr_av_batt, ton_f and Ipr_av_f represent information known by the H-bridge controller, thus, the computer model may be used for non-real time estimations. Specifically, Vdc and the estimated values for ton_batt, Ipr_av_batt, ton_f and Ipr_av_f, may be used to estimate values for the phase current parameters Ix_B, Iss_B, Iz_B, Ix_batt, Iy_batt, Iz_batt, t4_batt, Id_batt (Ido), Iss_batt, Ix_f, Iy_f, Iz_f, t4_f, Id_f (Ido), and Iss_f, using equations derived above (and repeated in the Tables 28 to 32). The phase current parameters may then be used to determine power loss estimates for the IGBTs 104.

FIG. 14 is a graph of the current and voltage waveform used to estimate power losses in the phase A and phase C IGBTs and diodes. At switching ON, the IGBT losses will be calculated from Ix using Eon(Ix)]. At switching OFF, the IGBT losses will be calculated from Iy using Eoff(Iy). During ON, the IGBT losses will be calculated using parameters as a function of Iss, where Iss=Io (from eq. 4.20) using Vce(Iss). Using Phase A as an example, the IGBT power loss, IGBT Pss, during the on period can be found using the following equation:

$$IGBT\ Pss\ PoA = IssA * Vce(IssA)$$

In the above equation, PoA is the power loss during ton, and PoA is zero during the rest of the period. Thus, for the full period average power:

TABLE 32

| Ifield (A) | Vdc (V) | Io | ton | I igbt aver = Io * ton * f | t4 | I diode aver = Ido * t4 * f | I prim aver = 2 * (sum Iigbt aver + Idiode ave) | Isec aver = (Iprim aver − 30) * n |
|---|---|---|---|---|---|---|---|---|
| 125 | 1500 | 68.255 | 7E−05 | 2.900 | 7.6E−04 | 21.969 | 49.736842 | 125.00 |
| 400 | 1300 | 98.560 | 3E−04 | 15.461 | 5.7E−04 | 31.118 | 93.157895 | 400.00 |
| 400 | 875 | 93.672 | 4E−04 | 21.832 | 4.4E−04 | 24.747 | 93.157895 | 400.00 |
| 325 | 700 | 81.634 | 4E−04 | 19.324 | 4.4E−04 | 21.334 | 81.315789 | 325.00 |
| 200 | 400 | 61.516 | 4E−04 | 15.682 | 4.1E−04 | 15.108 | 61.578947 | 200.00 |
| 175 | 300 | 57.257 | 5E−04 | 17.028 | 3.4E−04 | 11.787 | 57.631579 | 175.00 |
| 125 | 250 | 49.698 | 4E−04 | 12.669 | 4.1E−04 | 12.200 | 49.736842 | 125.00 |

As shown in table 32, since tf always larger than t3, there is no error in estimating Iod and, therefore, no error in estimating I_av_field. Using the values for Vbatt, Vdc (=Vlink), Ibatt (=I_av_batt) and If (=I_av_field) and using equations shown $$PssA = IssA * Vce(IssA) * tonA * fr\ [\text{Watts}]$$

IGBT $PswA$: energy/pulse=[Eon(Ix_A)+Eoff(Iy_A)]
and $fr$=pulses per sec→$PswA$ = [Eon(Ix_A)+Eoff (Iy_A)]*fr[joules/sec=Watts]

The power loss for the phase A and Phase C diodes at Reverse Recovery, may be calculated from Iz using Err(Iz). During ON the diode losses may be calculated using parameters as function of Ido, where Ido={(Iz+Iy)/2} using Err (Ido). Using Phase A as an example:

Diode $Pd=VfA(IdA)*IdA*(t4\_A)*fr$

Diode $PrrA=ErrA(IzA)*fr$

FIG. 15 is a graph of the current and voltage waveform used to estimate power losses in the phase B (common) IGBTs and diodes. At switching ON the IGBT losses will be calculated using:

$Ix\_B=Ix\_f+Ix\_batt$

At switching OFF the IGBT losses will be calculated from:

$Iz\_B=Iz\_f+Iz\_batt$

During ON (steady state), the losses will be calculated from the average value of blocks 5, 6, 7 and 8 shown in FIG. 15. Taking into account that the average currents through the two transformers 804 and 810 pass through phase B for T/2:

$Iss\_B=Ipr\_av\_batt+Ipr\_av\_f$

Using the equation above, the switching off losses for the phase B IGBTs, IGBT Poff, may be computed using the following formula:

IGBT $Poff=fr*EoffB(Iz\_B)$

The switching off losses for the phase B IGBTs, IGBT Pon, may be computed using the following formula:

IGBT $Pon=fr*EonB(Ix\_B)$

The steady state losses (on-state) for the phase B IGBTs, IGBT Pss, may be computed using the following formula:

IGBT $Pss=IssB*Vce(IssB)*0.5$, where $(0.5=(T/2)/T)$

Furthermore, in phase B, each IGBT 104 is ON for the full half cycle. Thus, there is no current through the diodes of phaseB and, therefore, no losses associated with the diodes in phase B.

Double H-Bridge Optimization

Based on the equations described in relation to FIGS. 15 and 16 and the heat sink parameters described in equations 3.30 to 3.34, a computer model for the full thermal behavior of the double H-bridge may be constructed. The computer model may be used to analyze the thermal characteristics of the double H-bridge to determine whether the power-handling capability of the double H-bridge meets the performance dictated by the specifications of the traction vehicle or other electrical system in question. Exemplary performance characteristics desired for a double H-bridge are shown below in tables 33 and 34. Table 33 shows exemplary specifications for the General Electric Company EVOLUTION® locomotives for maximum steady state operating conditions. Table 34 shows exemplary specifications for the EVOLUTION locomotives for maximum transient conditions.

TABLE 33

Thermal Rating (steady state) for EVOLUTION locomotives:
Thermal Rating (steady state) Guidlines

| | VdcLink | | | | | | |
|---|---|---|---|---|---|---|---|
| | 250 V | 300 V | 400 V | 700 V | 875 V | 1300 V | 1500 V |
| Ifield | 125 A | 175 A | 200 A | 325 A | 400 A | 400 A | 125 A |
| Ibattery | 225 A | 225 A | 380 A | 380 A | 300 A | 300 A | 300 A |

TABLE 34

Max Load (current limit) transient conditions for EVOLUTION locomotives
Max Load (current limit) Guidlines

| | VdcLink | | | | | | |
|---|---|---|---|---|---|---|---|
| | 250 V | 300 V | 400 V | 700 V | 875 V | 1300 V | 1500 V |
| Ifield | 125 A | 175 A | 200 A | 450 A | 450 A | 450 A | 450 A |
| Ibattery | 225 A | 380 A | 380 A | 380 A | 380 A | 380 A | 380 A |

The computer model for the full thermal behavior of the double H-bridge can be used to determine junction temperatures, Tj, of the IGBTs 104 based on any specifications. As an example, the specifications of EVOLUTION locomotives are shown in tables 33 and 34. In this particular example, it can be considered that the junction temperature, Tj, of the IGBTs 104 may be allowed to reach up to 130 Degr C. (BT used is Tj=150 degr C.) when operating at 49 Degr C. ambient (Tair=49 Degr C.+pre-heat from consist 5 Degr C.+pre-heat from blower/plenum 7° C.=61° C.). This will allow maximum thermal cycling of 130 Degr C.−61 Degr C.=69 Degr C. which will not restrict the long life of the device. Furthermore, for the present modeling, the H-bridge can be configured to provide a basis for comparing the improved double H-bridge of the present embodiments to a sub-optimal double H-bridge configuration. Specifically, the double H-bridge may be configured such that Phase A is used to power the battery 808 and Phase C is used to power the field winding 802. Using the thermal rating guidelines of table 33 as input, the computer model provides the junction temperatures, shown in table 35, for the sub-optimal double H-bridge design.

TABLE 35

Using as inputs the Thermal Rating (steady state) Guidlines

| Vbatt = 80 V | | Tair = 61 degr C. | | | field | batt | | | | | | |
|---|---|---|---|---|---|---|---|---|---|---|---|---|
| Vlink | SCFM | If | Ibatt | PB | PC | PA | TBhs | TChs | TAhs | TjB | TjC | TjA |
| 1500 | 198 | 125 | 300 | 637.15 | 462.24 | 963.00 | 98.73 | 92.83 | 114.37 | 112.86 | 102.54 | 133.84 |
| 1500 | 198 | 125 | 250 | 627.08 | 460.81 | 861.22 | 96.34 | 91.97 | 110.82 | 109.51 | 101.64 | 128.91 |
| 1300 | 198 | 400 | 300 | 820.39 | 590.94 | 781.31 | 107.16 | 98.34 | 107.52 | 124.38 | 110.75 | 123.93 |
| 875 | 198 | 400 | 300 | 720.09 | 428.15 | 593.91 | 100.93 | 89.08 | 96.20 | 116.05 | 98.07 | 108.68 |
| 700 | 198 | 325 | 380 | 739.62 | 330.30 | 626.64 | 101.30 | 85.15 | 97.21 | 116.83 | 92.09 | 110.37 |
| 400 | 113 | 200 | 380 | 589.39 | 195.03 | 485.37 | 104.40 | 91.48 | 102.16 | 116.77 | 95.56 | 112.35 |
| 300 | 85 | 175 | 225 | 384.86 | 156.99 | 278.68 | 95.70 | 88.17 | 89.98 | 103.78 | 91.47 | 95.83 |
| 250 | 71 | 125 | 225 | 350.55 | 129.49 | 254.35 | 95.96 | 88.63 | 89.92 | 103.32 | 91.34 | 95.26 |
| | | Ph C | PhA | | | | | | | | | |

It can be appreciated from table 35 that for Vlink=Vdc=1500, the junction temperature, TjA, for the double H-Bridge exceeds the desired maximum temperature of 130 Degr C. Using the current limit (transient maximum conditions) of table 34 as input, the computer model provides the junction temperatures shown in table 36.

TABLE 36

Using as inputs the Max Load (current limit) transient conditions

| Vbatt = 80 V | | Tair = 61 deg C. | | 600 Hz | | | | | | | | |
|---|---|---|---|---|---|---|---|---|---|---|---|---|
| Vlink | SCFM | If | Ibatt | PB | PC | PA | TBhs | TChs | TAhs | TjB | TjC | TjA |
| 1500 | 198 | 450 | 380 | 1023.6 | 721.00 | 1041.5 | 118.48 | 107.39 | 122.51 | 139.98 | 122.53 | 144.38 |
| 1500 | 198 | 450 | 240 | 855.84 | 814.50 | 851.11 | 109.79 | 104.55 | 112.22 | 127.76 | 119.55 | 130.1 |
| 1500 | 198 | 125 | 260 | 636.06 | 461.09 | 874.13 | 96.8 | 92.14 | 111.52 | 110.16 | 101.82 | 129.88 |
| 1300 | 198 | 450 | 380 | 956.38 | 631.94 | 886.81 | 114.44 | 101.84 | 113.51 | 134.52 | 115.11 | 132.13 |
| 1300 | 198 | 125 | 380 | 703.98 | 404.03 | 884.93 | 99.94 | 90.15 | 111.66 | 114.72 | 98.63 | 130.25 |
| 1000 | 198 | 450 | 380 | 903.17 | 508.64 | 783.57 | 110.89 | 95.27 | 107.02 | 129.86 | 105.95 | 123.47 |
| 875 | 198 | 450 | 380 | 873.71 | 458.83 | 717.43 | 109.05 | 92.38 | 103.08 | 127.40 | 102.01 | 118.14 |
| 700 | 198 | 450 | 380 | 824.41 | 389.88 | 627.14 | 106.06 | 88.33 | 97.70 | 123.37 | 96.52 | 110.87 |
| 400 | 113 | 200 | 380 | 589.39 | 195.03 | 485.37 | 104.4 | 91.48 | 102.16 | 116.77 | 95.58 | 112.35 |
| 300 | 85 | 175 | 380 | 548.42 | 159.30 | 432.07 | 108.78 | 95.81 | 104.15 | 120.30 | 99.16 | 113.22 |
| 250 | 71 | 125 | 225 | 350.55 | 129.49 | 254.35 | 95.96 | 88.63 | 89.92 | 103.32 | 91.34 | 95.26 |
| | | Ph C | PhA | | | | | | | | | |

Based on the data above it can be seen that, if the ambient air temperature is high, the junction temperatures, TjA and TjB, for Vlink equal to 1300V or above, may exceed the desired junction temperature limit of 130 Degr C. In response to exceeding the junction temperature guideline of 130 Degr C., the double H-bridge controller may be configured to de-rate the current supplied to the load, as described further below in relation to FIGS. 23 & 24. Based on the data from tables 35 and 36 de-rating may occur in the following situations: At Vlink=1500V and If=450 A, the double H bridge can pass up to 240 A battery current without de-rating. At Vlink=1500V and If =125 A, the double H bridge can pass up to 260 A battery current without de-rating. At Vlink=1300V and Ibattery=380 A, the double H bridge can pass up to 125 A field current without de-rating. Furthermore, Vlink=1000V is the maximum voltage at which the double H-bridge can meet the desired performance characteristics while operating at high ambient air temperature. The results shown in tables 35 and 36 may be better understood in reference to FIG. 16.

FIG. 16 is a block diagram of a double H-bridge with a cooling unit. As shown in FIG. 16, the double H-bridge includes dual IGBT modules 302 coupled to a heatsink 306, each dual IGBT module 1600 corresponding to one of phase A 202, phase B 204, or phase C 206. The cooling unit includes one or more fans 1602 that provide a flow of cooling air 1604 to the dual IGBTs 1600 through a plenum 1606. For the junction temperature results shown in tables 35 and 36, phase A was modeled as providing power to the battery charging circuit and phase B was modeled as providing power to the field exciter.

As shown in FIG. 16, the cooling unit also includes a vein 1608 configured to direct air flow toward the dual IGBT modules 1600. Due to this configuration, phase C 206 receives the most air and phase A 202 receives the least air. This results in that the total effective Rth of Phase A being the largest of the three phases and the total effective Rth of Phase C being the smallest of the three phases. Furthermore, based on the data of tables 35 and 36 it can be seen that the power loss of the battery (PA) is the largest one in the cases wherein the double H-bridge design exceeds the junction temperature guideline of 130 Degr C. Thus, the largest power is applied on the heat sink by the phase with the largest Rth. In accordance with embodiments, the thermal capability of the double H-bridge may be improved if the phase with the smallest Rth (Phase C) is used to control the battery charger part of the double H-Bridge and the phase with the largest Rth (Phase A) is used to control the field excitation. In other words, the thermal capability of the double H-bridge may be improved by exchanging the phases that control Ibatt and Ifield. The thermal model used to determine junction temperatures can be altered accordingly. Using the thermal rating (steady state) specifications of table 33 as input to the thermal model for the improved double H-bridge design, the junction temperatures shown in table 37 can be computed.

TABLE 37

After the Exchange

| Vbatt = 80 V | | Tair = 61 degr C. | | | batt | field | | | | | | |
|---|---|---|---|---|---|---|---|---|---|---|---|---|
| Vlink | SCFM | If | Ibatt | PB | PC | PA | TBhs | TChs | TAhs | TjB | TjC | TjA |
| 1500 | 198 | 125 | 300 | 667.91 | 920.63 | 462.36 | 101.95 | 109.49 | 92.91 | 116.18 | 128.82 | 102.62 |
| 1300 | 198 | 400 | 300 | 822.79 | 778.96 | 591.78 | 108.5 | 105.18 | 98.78 | 125.78 | 121.54 | 111.21 |
| 875 | 198 | 400 | 300 | 721.86 | 592.7 | 427.42 | 102.09 | 95.06 | 88.52 | 117.24 | 107.51 | 97.49 |
| 700 | 198 | 325 | 380 | 742.87 | 625.26 | 328.72 | 103.38 | 95.88 | 83.46 | 118.98 | 109.01 | 90.36 |
| 400 | 113 | 200 | 380 | 595.9 | 487.35 | 191.81 | 110.1 | 104.91 | 83.88 | 122.61 | 115.15 | 87.91 |
| 300 | 85 | 175 | 225 | 387.06 | 281.04 | 154.88 | 99.08 | 94.57 | 81.2 | 107.21 | 100.47 | 84.46 |
| 250 | 71 | 125 | 225 | 532.97 | 257.58 | 127.78 | 100.23 | 95.75 | 80.26 | 107.64 | 101.16 | 92.94 |
| | | PhA | Ph C | | | | | | | | | |

As shown in table 37, by operating the battery charger in phase C and the field exciter in Phase A, the junction temperatures for all of the phases is below the 130 Degr C. junction temperature guideline. Furthermore, from the table 37 it can be seen that in the new double H-bridge design, TjA is always less than TjB and TjC. Thus, ventilation and thermal protection techniques used in the double H-bridge may be based only on phase B and phase C.

Estimating Junction Temperatures in a Double H-Bridge

FIG. 17 is a block diagram of a double H-bridge configured to providing real-time heatsink temperature readings. As shown in FIG. 17, the double H-bridge 200 can include a temperature sensor 1700, such as a thermistor, disposed in the heatsink 306. In an embodiment, a single temperature sensor 1700 may be disposed in the heatsink between the phase B and phase C dual IGBTs 302. Temperature readings from the temperature sensor 1700 may be sent to a system controller 1702 of the double H-bridge 200. Based on the temperature sensor readings, the system controller 1702 may compute junction temperatures for the phase A and phase B dual IGBTs. In this way, the system controller 1702 can determine whether the junction temperatures are within the specified temperature guidelines for reliable operation. If the junction temperatures exceed the specified temperature guidelines, the system controller 1702 may take steps to protect the IGBTs, such as by de-rating the command signals to the dual IGBTs to provide reduced output current. Techniques for determining the junction temperatures for each phase based on the temperature readings of the single thermistor may be better understood with reference to the FIG. 17.

FIG. 18 is a flow diagram of the heat flow in the double H-bridge during operation. As shown in FIG. 18, the temperature sensor, represented by point 1802, is heated by 3 different sources, PA, PB, and PCA, where PA, PB, and PC is the total power of phases A, B, and C, respectively. The temperature difference between the temperature at the thermistor 1802 (TS) and the temperature of the cooling air (Tair) may be determined using the following equation:

$$TSair = dTS\_B + dTS\_C + dTS\_A = PB*RSairB + PC*RSairC + PA*RSairA \quad \text{eq. 5.1}$$

In the above equation, TSair represents the temperature difference between the temperature at the thermistor (sensor) position (TS) 1802 and the temperature of the cooling air (Tair), and PB*RSairB, PC*RSairC and PA*RSairA are the contributions of phase B, C, and A to the Sensor Temperature (TS) minus Tair. From equation 5.1, the value of TSair can be examined for different test configurations. In the test configuration shown in FIG. 4A, where PB=PC=PA=Pph:

$$TSair\_inv = Pph*(RSairB + RSairC + RSairA) \rightarrow TSair\_inv/Pph = RSairB + RSairC + RSairA$$

In the above equation, TSair_inv represents the temperature at the sensor position 1802 minus Tair in the test with the configuration of FIG. 4A. Based on the equation above, the overall thermal resistance between the temperature sensor position and the ambient air (RSair_inv) may be determined from the following equation:

$$RSair\_inv = RSairB + RSairC + RSairA \quad \text{eq. 5.2}$$

In the test configuration shown in FIG. 4C, where PC=PA=Pph, and PB=0 (only phase A and C powered):

$$TSair\_AC = Pph*(RSairC + RSairA) \rightarrow Tsair\_AC/Pph = RSairC + RSairA$$

In the above equation, TSair_AC represents the temperature at the sensor position 1802 minus Tair in the test with the configuration of FIG. 4C (phase A and C powered). Based on the equation above, the overall thermal resistance between the temperature sensor position and the ambient air (RSair_AC) may be determined from the following equation:

$$Rsair\_AC = RSairC + RSairA \quad \text{eq. 5.3}$$

In the test configuration shown in FIG. 4B, where PC=PB=Pph, and PA=0 (only phases B and C powered):

$$TSair\_BC = Pph*(RSairC + RSairB) \rightarrow TSair\_BC/Pph = RSairC + RSairB$$

In the above equation, TSair_BC represents the temperature at the sensor position 1802 minus Tair in the test with the configuration of FIG. 4B (phases B and C powered). Based on the equation above, the overall thermal resistance between the temperature sensor position and the ambient air (RSair_BC) may be determined from the following equation:

$$RSair\_BC = RSairC + RSairB \quad \text{eq. 5.4}$$

Combining equations 5.2 to 5.4, the parameters for equation 5.1 can be determined and are shown below.

$$RSairB = RSair\_inv - RSair\_AC \quad \text{eq. 5.5}$$

$$RSairA = RSair\_inv - RSair\_BC \quad \text{eq. 5.6}$$

$$RSairC = RSair\_BC - RSairB \quad \text{eq. 5.7}$$

$$RSairC = RSair\_AC - RSairA \quad \text{eq. 5.8}$$

For each of the test configurations shown in FIGS. 4A-4C, thermal measurements can be taken using thermocouples on top of the temperature sensor 1700. Using the measured thermal data from the temperature sensor 1700, the thermal resistances between the sensor to the ambient air can be determined for each test configuration, using the following equation:

$$RSair\_config = (TS - Tair)/Pphase \text{ for this configuration}$$

In the above equation, RSair_config is the thermal resistance between the temperature sensor and the ambient air for a particular test configuration. Exemplary RSair_config values for each test configuration, are shown below in tables 39-41.

TABLE 39

RSair_inv

| SCFM | 200 | 100 | 50 | RSair_inv |
|---|---|---|---|---|
| 200 | 0.033011569 | 0.032218474 | 0.026652874 | 0.0326150 |
| 150 | 0.041474515 | 0.040874333 | 0.042228344 | 0.0415257 |
| 100 | 0.057020609 | 0.056650175 | 0.05483086 | 0.0561672 |
| 60 |  | 0.087608562 | 0.086559569 | 0.0870841 |
| 35 |  | 0.130332261 | 0.134432142 | 0.1323822 |
| 0 |  | not equalized | 0.743645188 | 0.7436452 |

TABLE 40

RSair_BC (B and C powered only)

| RSair_BC | B, C powered only | | | |
|---|---|---|---|---|
| SCFM | 200 A | 100 A | 50 A | Rsair_BC |
| 200 | 0.030392574 | 0.029387758 | 0.027528435 | 0.029102922 |
| 150 | 0.038050568 | 0.036970489 | 0.035380293 | 0.03680045 |
| 100 | 0.049850757 | 0.04898972 | 0.047155326 | 0.048665268 |
| 60 |  | 0.073300021 | 0.070869149 | 0.072084585 |
| 35 |  | 0.108184258 | 0.107245004 | 0.107714631 |
| 0 |  |  | 0.586357568 | 0.586357568 |

TABLE 41

RSair_CA (A and C powered)

| RSair_CA | A, C powered | | | |
|---|---|---|---|---|
|  | RSair_hb_CA | | | |
| SCFM | 200 A | 100 A | 50 A | RSair_CA |
| 200 | 0.024150006 | 0.023149978 | 0.019766947 | 0.022355644 |
| 150 | 0.030000751 | 0.028165746 | 0.027038393 | 0.02840163 |

TABLE 41-continued

RSair_CA (A and C powered)

| RSair_CA | A, C powered | | | |
|---|---|---|---|---|
|  | RSair_hb_CA | | | |
| SCFM | 200 A | 100 A | 50 A | RSair_CA |
| 100 | 0.039189 | 0.03797098 | 0.034115662 | 0.037092004 |
| 60 |  | 0.058636565 | 0.054883517 | 0.056760041 |
| 35 |  | 0.09096046 | 0.084651701 | 0.08780608 |
| 0 |  |  | 0.464896274 | 0.464896274 |

Since RSair represents the thermal resistance between the temperature 1700 sensor and the cooling air, the thermal resistance between the case of the IGBT and the heatsink, Rth_ch, of the grease 308 is not a factor in computing the above values. Thus, the correction factor of 0.009° C./W is not subtracted from the values. Using the RSair values from tables 39-41 and applying equations 5.5 to 5.8, values for RSairB, RSairC, and RSairC1, and Rsair_A may be obtained, as shown below in table 42.

TABLE 42

| SCFM | RSair_B = RSair_inv − RSair_AC | RSair_A = RSair_inv − RSair_BC | RSair_C1 = RSair_BC − RSair_B | RSair_C = RSair_AC − RSair_A |
|---|---|---|---|---|
| 200 | 0.0102594 | 0.0035121 | 0.0188435 | 0.0188435 |
| 150 | 0.0131241 | 0.0047253 | 0.0236763 | 0.0236763 |
| 100 | 0.0190752 | 0.0075019 | 0.0295901 | 0.0295901 |
| 60 | 0.0303240 | 0.0149995 | 0.0417606 | 0.0417606 |
| 35 | 0.0445761 | 0.0246676 | 0.0631385 | 0.0631385 |
| 0 | 0.2787489 | 0.1572876 | 0.3076087 | 0.3076087 |
|  |  |  |  | same result |

To verify the above method and results, the average power for each phase may be taken from the test data, in order to estimate TS-Tair (Est TS-Tair). The TS-Tair estimates may be compared with the test measured values of TS-Tair (Test_TS-Tair) that are based of the temperature sensor 1700, as shown below in table 43.

TABLE 43

| INVERTER | (200 A and 100 A) | | | Test Data Test_TS − Tair | test results RSair_inv | PX(min) of Pphase PA(min) * Rsair_inv | RSairA * PA est TS_A | RSairB * PB est TS_B | RSairC * PC est TS_C | SUM Est TS − Tair |
|---|---|---|---|---|---|---|---|---|---|---|
| SCFM | AV PA | AV PB | AV PC |  |  |  |  |  |  |  |
| 200 | 630.27 | 630.44 | 632.56 | 20.8 | 0.032615 | 20.55625605 | 2.2135708 | 6.467922 | 11.91967 | 20.60117 |
| 60 | 246.03 | 246.56 | 247.3 | 21.6 | 0.08708 | 21.42429240 | 3.6903222 | 7.476691 | 10.32738 | 21.49440 |

| CA powered | (200 A and 100 A) | | | Test_TS − Tair | | PC(min) * Rsair_CA | est TS_A | est TS_B | est TS_C | Est TS − Tair |
|---|---|---|---|---|---|---|---|---|---|---|
| SCFM | AV PA | AV PB | AV PC |  | Rsair_CA |  |  |  |  |  |
| 200 | 632.78 | 0 | 629.92 | 15.2 | 0.0223556 | 14.08226727 | 2.2223862 | 0 | 11.86993 | 14.09231 |
| 60 | 247.33 | 0 | 247.77 | 14.5 | 0.05676 | 14.06342520 | 3.7098215 | 0 | 10.34701 | 14.05684 |

| BC powered | (200 A and 100 A) | | | Test_TS − Tair | | PX(min) * Rsair_inv | est TS_A | est TS_B | est TS_C | Est TS − Tair |
|---|---|---|---|---|---|---|---|---|---|---|
| SCFM | AV PA | AV PB | AV PC |  | Rsair_inv |  |  |  |  |  |
| 200 | 0 | 631.23 | 632.59 | 19.2 | 0.0291029 | 18.41020351 | 0 | 6.476027 | 11.92024 | 18.39627 |
| 60 | 0 | 103.58 | 104.04 | 7.4 | 0.0720846 | 7.499681784 | 0 | 3.140962 | 4.344768 | 7.485731 |

In addition to the three test configurations shown in FIGS. 3A-C, test data were also collected for the test configuration shown in FIG. 4D, wherein the current through Phase B splits 50%-50% when it passes through the other two phases. The RSair values, RSairB, RSairA, and RSairC1, from table 42 are shown below in table 44.

TABLE 44

| SCFM | RSairB = RSair_inv − RSair_AC | RSairA = RSair_inv − RSair_BC | RSairC1 = RSair_BC − RSairB |
|---|---|---|---|
| 200 | 0.0102594 | 0.0035121 | 0.0188435 |
| 60 | 0.030324 | 0.014999 | 0.041761 |

Using the above values for RSairB, RSairA, and RSairC1, estimated values for TS-Tair (Est TS-Tair) may be computed and compared to measured values for TS-Tair (Test_TS-Tair) based on temperature data gathered from the sensor 1700 for the test configuration of FIG. 4D. Exemplary results are shown below in table 45.

TABLE 45

| 100-50-50 | (200 A and 100 A) | | | Test Data Test_TS − | test results | PX (min) of Pphase PA (min) * | RSairA * PA | RSairB * PB | RSairC * PC | SUM Est TS − |
|---|---|---|---|---|---|---|---|---|---|---|
| SCFM | AV PA | AV PB | AV PC | Tair | Rsair_inv | Rsair_inv | est TS_A | est TS_B | est TS_C | Tair |
| 200 | 243.230 | 627.97 | 248.946 | 12.5 | NA | NA | 0.854246 | 6.4425404 | 4.691022 | 11.99 |
| 60 | 245.483 | 648.65 | 250.502 | 34.5 | NA | NA | 3.682124 | 19.669618 | 10.46110 | 33.81 |

Based on the data shown in tables 43 and 45, it will be appreciated that the method described herein provides an accurate prediction of the delta sensor Temperature (TS-Tair). Accordingly, the derived values for RSairB, RSairA, and RSairC may be used in determining the junction temperatures of the IGBTs based on the temperature sensor reading, as described further below. In an embodiment, Upper Specification Limits (USLs) may be derived for the thermal resistance values RSairB, RSairA, and RSairC. From equations 5.5, 5.6, and 5.7 it can be appreciated that the USLs for RSairB, RSairC and RSairA will depend on the USL's of RSair_inv, RSair_AC and RSair_BC. To determine the USL values for RSair_inv, RSair_AC and RSair_BC, values of RSair_inv, RSair_AC and RSair_BC were computed as discussed above, using six additional double H-bridge devices. The data gathered from these tests is shown below in tables 47, 49, and 51.

TABLE 47

| | | RSair_inv | | | |
|---|---|---|---|---|---|
| SCFM | | 200 | 100 | 50 | Rsair_inv |
| 200 | S1 | 0.033011569 | 0.032218474 | 0.026652874 | 0.03261502 |
| 150 | S2 | 0.036732436 | 0.036769253 | 0.034668714 | 0.03605680 |
| 100 | S3 | 0.034199689 | 0.032248306 | 0.029707583 | 0.03205186 |
| 60 | S4 | 0.036543014 | 0.036066996 | 0.03397417 | 0.03552806 |
| 35 | S5 | 0.035988094 | 0.036365532 | 0.03455658 | 0.03563674 |
| 0 | S6 | 0.037171053 | 0.036365532 | 0.036180573 | 0.03657239 |

TABLE 49

| | | RSair_BC | | | |
|---|---|---|---|---|---|
| RSair_BC SCFM | | 200 | 100 | 50 | Rsair_BC |
| 200 | S1 | 0.030392574 | 0.029387758 | 0.027528435 | 0.02910292 |
| 150 | S2 | 0.030892073 | 0.029163511 | 0.024774019 | 0.02827653 |
| 100 | S3 | 0.031175347 | 0.030122238 | 0.025411277 | 0.02890295 |
| 60 | S4 | 0.030627623 | 0.02958748 | 0.023763399 | 0.02799283 |
| 35 | S5 | 0.032299222 | 0.031504322 | 0.028070774 | 0.03062477 |
| 0 | S6 | 0.031042792 | 0.02982247 | 0.026687318 | 0.02918419 |

TABLE 51

| | | RSair_CA | | | |
|---|---|---|---|---|---|
| RSair_CA SCFM | | 200 | 100 | 50 | Rsair_CA |
| 200 | S1 | 0.024150006 | 0.023149978 | 0.019766947 | 0.022356 |
| 150 | S2 | 0.022408928 | 0.021706019 | 0.017528 | 0.020548 |

TABLE 51-continued

| | | RSair_CA | | | |
|---|---|---|---|---|---|
| RSair_CA SCFM | | 200 | 100 | 50 | Rsair_CA |
| 100 | S3 | 0.022526434 | 0.021490945 | 0.019240927 | 0.021086 |
| 60 | S4 | 0.022393 | 0.021638007 | 0.017024725 | 0.020352 |
| 35 | S5 | 0.022958567 | 0.022227875 | 0.021483666 | 0.022223 |

In tables 47, 49, and 51, the labels S1, S2, S3, S4, S5, and S6 represent the data gathered for the different double H-bridges used in the tests. The part-to-part variation of these parameters between different double H-bridges can be described using statistical analysis. For example, the data shown in tables 47, 49, and 51 can be input into a statistical modeling package, such as Minitab®, to obtain the mean ($\mu$) and standard deviation ($\sigma$) of RSair_inv, RSair_AC and RSair_BC at an air flow rate of 200 SCFM. The statistical data for these parameters is shown below in table 52.

TABLE 52

| Variable | N | Mean | Median | TrMean | StDev | SE Mean |
|---|---|---|---|---|---|---|
| RSair_inv | 6 | 0.03474 | 0.03558 | 0.03474 | 0.00191 | 0.00078 |
| RSair_AC | 6 | 0.02901 | 0.02900 | 0.02901 | 0.00092 | 0.00038 |
| RSair_BC | 6 | 0.02127 | 0.02108 | 0.02127 | 0.00084 | 0.00034 |

Using the statistical process outlined above in relation to tables 22 and 23, the mean and standard deviation for each RSair_config at 200 SCFM can be used to compute the corresponding USLs, using the following equation:

$$Z = (USL - \mu)/\sigma$$

Using Z=3 and solving for the USL provides:

$$USL = \sigma * 3 + \mu$$

An example calculation of the USL of RSair_inv is shown below in tables 53 and 54.

TABLE 53

| statistical results from the 6 samples | | $Z * \sigma o + \mu o$ | $\mu o /$ RSair_inv200 SCFM | USL/RSair_inv200 SCFM | $\sigma o$/RSair_inv 200SCFM |
|---|---|---|---|---|---|
| $\mu o$ | $\sigma o$ | USL for Z = 3 | K1 | K2 | K3 |
| 0.03474 | 0.00191 | 0.04047 | 1.065153367 | 1.240839285 | 0.058561973 |

TABLE 54

| SCFM | RSair_inv | RSair_inv * K1 $\mu$ | RSair_inv * K2 USL RSair_inv | RSair_inv * K3 $\sigma$ | (USL - $\mu$)/$\sigma$ Z |
|---|---|---|---|---|---|
| 200 | 0.032615 | 0.0.3474 | 0.040470 | 0.0019100 | 3 |
| 150 | 0.041526 | 0.04423 | 0.051527 | 0.0024318 | 3 |
| 100 | 0.056167 | 0.05983 | 0.069694 | 0.0032893 | 3 |
| 60 | 0.087084 | 0.09276 | 0.108057 | 0.0050998 | 3 |
| 35 | 0.132382 | 0.14101 | 0.164265 | 0.0077526 | 3 |
| 0 | 0.743645 | 0.79210 | 0.922744 | 0.0435493 | 3 |

Using the same procedure for RSair_Ac and RSair_BC, the results shown below in table 55 were obtained.

TABLE 55

| SCFM | USL RSair_inv | USL RSair_AC | USL RSair_BC |
|---|---|---|---|
| 200 | 0.040470 | 0.0237900 | 0.0292860 |
| 150 | 0.051527 | 0.0302239 | 0.0370320 |
| 100 | 0.069694 | 0.0394719 | 0.0489714 |
| 60 | 0.108057 | 0.0604018 | 0.0725380 |
| 35 | 0.164265 | 0.0934398 | 0.1083922 |
| 0 | 0.922744 | 0.4947244 | 0.5900462 |

The USLs for RSairB, RSairC, RSairA can be computed based on the USLs for RSair_inv, RSair_AC, and RSair_BC shown in tables 55 and using equations 5.5-5.7. From equation 5.5, the USL for RSairB can be determined, as shown below in table 56.

TABLE T56

| | RSairB = RSair_inv - Rsair_AC | | |
|---|---|---|---|
| SCFM | USL RSair_inv | USL RSair_AC | USL RSairB |
| 200 | 0.040470 | 0.0237900 | 0.016680 |
| 150 | 0.051527 | 0.0302239 | 0.021303 |
| 100 | 0.069694 | 0.0394719 | 0.030223 |
| 60 | 0.108057 | 0.0604018 | 0.047656 |
| 35 | 0.164265 | 0.0934398 | 0.070825 |
| 0 | 0.922744 | 0.4947244 | 0.428020 |

From equation 5.7, the USL for RSairB can be determined, as shown below in table 57.

TABLE T57

| | RSairC - RSairB | | |
|---|---|---|---|
| SCFM | USL RSair_BC | USL RSairB | USL RSairC |
| 200 | 0.0292860 | 0.016680 | 0.012606 |
| 150 | 0.0370320 | 0.021303 | 0.015729 |
| 100 | 0.0489714 | 0.030223 | 0.018749 |

TABLE T57-continued

| | RSairC - RSairB | | |
|---|---|---|---|
| SCFM | USL RSair_BC | USL RSairB | USL RSairC |
| 60 | 0.0725380 | 0.047656 | 0.024883 |
| 35 | 0.1083922 | 0.070825 | 0.037567 |
| 0 | 0.5900462 | 0.428020 | 0.162026 |

From equation 5.6, the USL for RSairA can be determined, as shown below in table 58.

TABLE T58

| | RSair_inv - RSairBC | | |
|---|---|---|---|
| SCFM | USL RSair_inv | USL RSair_BC | USL RSairA |
| 200 | 0.040470 | 0.0292860 | 0.011184 |
| 150 | 0.051527 | 0.0370320 | 0.014495 |
| 100 | 0.069694 | 0.0489714 | 0.020723 |
| 60 | 0.108057 | 0.0725380 | 0.035519 |
| 35 | 0.164265 | 0.1083922 | 0.055873 |
| 0 | 0.922744 | 0.5900462 | 0.332698 |

Applying regression techniques to the data shown in tables 56-58, regression equations that describe RSairA, RSairB, and RCairC as a function of air flow rate may be obtained. Applying curve fitting techniques to the data shown in table 56 yields:

$$RSairB = 0.0115 + 0.3845*EXP(-SCFM/13.23) + 0.066*EXP(-SCFM/78.6) \qquad \text{eq. 5.9}$$

Applying curve fitting techniques to the data shown in table 57 yields:

$$RSairC = 6.47E-3 + 0.1406*EXP(-SCFM/16.23) + 0.0257*EXP(-SCFM/139.8) \qquad \text{eq. 5.10}$$

Applying curve fitting techniques to the data shown in table 58 yields:

$$RSairA = 7.14E\text{-}3 + 0.301 * EXP(-SCFM/13.93) + 0.044 * EXP(-SCFM/83.67) \qquad \text{eq. 5.11}$$

In an embodiment, thermal capacitances between the temperature sensor position TS (1802) and the temperature of the cooling air (Tair) may be determined and are referred to herein as CSair_A, CSair_B, and CSair_C. First, from the average test data for 150 SCFM shown in table 58:

TABLE 59

Thermal Capacitances (CSair B, CSair C, CSair A)

| SCFM | RSair_inv test | RSair_AC test | RSair_BC test | RSair_B = RSair_inv − RSair_AC | RSair_A = RSair_inv − RSair_BC | RSair_C1 = RSair_BC − RSair_B | RSair_C = RSair_AC − RSair_A |
|---|---|---|---|---|---|---|---|
| 150 | 0.0415257 | 0.02840163 | 0.03680045 | 0.0131241 | 0.0047253 | 0.0236763 | 0.0236763 |

For the test configuration of FIG. 4C (phase A and C powered):

$$Po * ZSair\_CA = Po * [RSairC \| (1/CCs)] + RSairA \| (1/CCs)$$

and Zsair_CA=Rsair_CA∥(1/CCAs), then:

$$\frac{RSair\_CA}{RSair\_CA * CSair\_CA * S + 1} =$$

$$\frac{RSair\_C}{RSair\_C * CSair\_C * S + 1} + \frac{RSair\_A}{RSair\_A * CSair\_A * S + 1}$$

If the time constants RSair_C*CSair_C=RSair_A*CSair_A are equal to $\tau_0$, then:

$$\frac{RSair\_CA}{RSair\_CA * CSair\_CA * S + 1} = \frac{RSair\_C + RSair\_A}{\tau_0 * S + 1}$$

From the above, since RSair_C+RSair_A=0.0236763+ 0.0047235=0.02839998=RSair_CA, it can be confirmed that the time constant, $\tau_0$, is the same for Rsair_CA, RSair_C, and RSair_A. Similarly, for the test configuration of FIG. 4B (phase B and C powered), RSair_C+RSair_B=0.0236763+ 0.0131241=0.0368004=RSair_BC. Thus, $\tau_0$ is the same for Rsair_BC, RSair_C, and RSair_B. Similarly for test configuration shown in FIG. 4A, RSair_C+RSair_B+ RSair_A=0.0236763+0.0131241+ 0.0047235=0.0415239=RSair_inv. Accordingly, it can be seen that $\tau_0$ is the same for RSair_inv, RSair_C, RSair_B, and RSair_A for the same air flow.

To test the assumption that $\tau_0$ is the same for RSair_inv, RSair_C, RSair_B, and Rsair_A, the thermal capacitances for C and A powered, B and C powered and B, C and A (inverter) powered can be determined by collecting test data for each of the test configurations shown in FIGS. 14A-C. From the test data for each of the test configurations, a cooling curve may be plotted for 150 SCFM, 200 A of TS_XX minus Tinl, where TS_XX is the temperature of the sensor for a particular test configuration "XX," and Tinl is the temperature of the cooling inlet air. From the cooling curve, the following thermal time constants may be obtained:

$$\tau\_inv = 196 \text{ sec}$$

$$\tau\_BC = 190 \text{ sec}$$

$$\tau\_CA = 186 \text{ sec}$$

The value TS_XX−Tinl may be estimated using the following equation:

$$TS\_XX\text{-}Tinl = (\text{starting temperature} - \text{ending temperature}) * \exp(-t/\tau) + \text{ending temperature}$$

The estimated value for TS_XX−Tinl may then be compared it with the test data, as shown in FIGS. 19A-C.

FIGS. 19A-C are graphs of the estimated TS_XX−Tinl and the actual measured TS_XX−Tinl over time for various testing configurations. FIG. 19A shows estimated and measured values for the test configuration of FIG. 4B (phases B and C powered). FIG. 19B shows estimated and measured values for the test configuration of FIG. 4B (phases C and A powered). FIG. 19C shows estimated and measured values for the test configuration of FIG. 4A (phases A, B, and C powered). It can be appreciated from the graphs of FIGS. 19A-C that the estimated values for TS_XX−Tinl are a very close approximation for the actual measured values.

Using the average of the thermal time constants shown above, (196 sec, 190 sec, 186 sec) provides:

$$\tau\_inv = \tau\_BC = \tau\_CA = \tau\_A = \tau\_B = \tau\_C = 190 \text{ sec}$$

And taking into account that t=Rth*Cth, the thermal capacitances can be calculated using the average test data for 150 SCFM from table 59, as shown below:

$$CSair\_B = 190/0.0131241 \rightarrow CSair\_B = 14{,}477 \text{ J/degr C.} \qquad \text{eq. 5.12}$$

$$CSair\_A = 190/0.0047253 \rightarrow CSair\_A = 40{,}209 \text{ J/degr C.} \qquad \text{eq. 5.13}$$

$$CSair\_C = 190/0.0236763 \rightarrow CSair\_C = 8{,}025 \text{ J/degr C.} \qquad \text{eq. 5.14}$$

Based on the above data, it will be appreciated that the affect of the thermal capacity of phase A on the change of temperature of the Sensor is much weaker than the affect of the thermal capacity from phases B and C, since the thermistor is situated between phases B and C.

The thermal resistances and thermal capacitances derived above can be used to determine thermal impedances for ZSairA, ZSairB, and ZSairC. In an embodiment, the thermal impedances may be used to generate a computer model for determining the junction temperatures of the IGBTs 104 based on the reading from the temperature sensor.

To determine the junction temperatures, the temperature difference between the temperature sensor 1700 and each phase's case may be determined. As discussed above, TA=heatsink temperature hot spot under device in phase A, TB=heatsink temperature hot spot under device in phase B, and TC=heatsink temperature hot spot under device in phase C. TA, TB, and TC can be determined according to the equations 3.1, 3.2, and 3.3 using RCA=RAC=0. Accordingly:

$$TA = PA * RA + PC * RAC + Tair$$

$$TB = PB * RB + PC * RBC + Tair$$

$$TC = PC * RC + PB * RBC + PA * RCA + Tair$$

In the above equations, PA, PB, PC are the power loss through both IGBTs and diodes in phase A, B, C respectively. Furthermore, the thermal resistance parameters RA, RB, RC, RCA, and RCB may be determined based on the air flow rate, using equations 3.30 to 3.34. The summary of the USLs for these parameters is shown in table 24.

Equations for TA, TB, and TC may be derived using Tsensor. The values for TA, TB, and TC derived using Tsensor are referred to herein as TAS, TBS and TCS, respectively. Based on the description provided herein, it is known that:

$$TB = TSair + Tair + TBS = PB*RB + PC*RBC + Tair$$

$$TSair = RSairA*PA + RSairB*PB + RSairC*PC$$

Combining these equations yields:

$$TBS = (RB-RSairB)*PB + (RBC-RSairC)*PC - RSairA*PA$$

The contribution of PB to phase B may be expressed as:

$$RB - RSairB = RB\_BS \quad \text{eq. 5.15}$$

The contribution of PC to phase B from phase C may be expressed as:

$$RBC - RSairC = RC\_BCS \quad \text{eq. 5.16}$$

Thus, the equation for TBS may be expressed as:

$$TBS = RB\_BS*PB + RC\_BCS*PC - RSairA*PA \quad \text{eq. 5.17}$$

Similarly, with regard to TCS, it is known, based on the description provided herein, that:

$$TC = TSair + Tair + TCS = = PC*RC + PB*RCB + PA*RCA + Tair$$

Thus, TCS becomes:

$$TCS = (RCB - RSairB)*PB + (RC - RSairC)*PC + (RCA - RSairA)*PA \text{ and if}$$

The contribution of PB to phase C from phase B may be expressed as:

$$(RCB - RSairB) = RB\_CBS \quad \text{eq. 5.18}$$

The contribution of PC to phase C may be expressed as:

$$(RC - RSairC) = RC\_CS \quad \text{eq. 5.19}$$

The contribution of PA to phase C from phase A may be expressed as:

$$(RCA - RSairA) = RA\_CAS \quad \text{eq. 5.20}$$

Thus, the equation for TBS may be expressed as:

$$TCS = RB\_CBS*PB + RC\_CS*PC + RA\_CAS*PA \quad \text{eq. 5.21}$$

Similarly, with regard to TAS, it is known, based on the description provided herein, that:

$$TA = TSair + Tair + TAS = = PA*RA + PC*RAC + Tair$$

$$TSair = RSairA*PA + RSairB*PB + RSairC*PC$$

Combining these equations yields:

$$TAS = (RA - RSairA)*PB + (RBC - RSairC)*PC - RSairB*PB$$

The contribution of PA to phaseA may be expressed as:

$$(RA - RSairA) = RA\_AS \quad \text{eq. 5.22}$$

The contribution of PC to phaseA from phase C may be expressed as:

$$(RBC - RSairC) = RA\_ACS \quad \text{eq. 5.23}$$

Thus, the equation for TAS may be expressed as:

$$TAS = RA\_AS*PA + RA\_ACS*PC - RSairB*PB \quad \text{eq. 5.24}$$

To validate the equations 5.17, 5.21, and 5.24 shown above, the test values for RCA, RCB, RC, RB, RA, RSairB, RSairA, and RSairC, may be used to obtain values for RB_BS, RC_BCS, RC_CS, RB_CBS, RA_CAS, RA_AS, and RA_ACS, as shown below in tables 62 and 63.

TABLE 62

| | | | | | | | | |
|---|---|---|---|---|---|---|---|---|
| From Raw Data (Not USLs) | | | | | | | | |
| SCFM | RSairB = RSair_inv − RSair_AC | RSairA = RSair_inv − RSair_BC | RSairC1 = RSair_BC − RSairB | RCA | RCB | RC | RB | RA |
| 200 | 0.0102594 | 0.0035121 | 0.0188435 | 0.006491 | 0.003035 | 0.038707 | 0.047219 | 0.050155 |
| 60 | 0.030324 | 0.014999 | 0.041761 | 0.019869 | 0.015395 | 0.070647 | 0.088079 | 0.100536 |

TABLE 63

| | | | | | | | |
|---|---|---|---|---|---|---|---|
| New Parameters from Raw Data (not USLs) | | | | | | | |
| SCFM | RB_BS | RC_BCS | RC_CS | RB_CBS | RA_CAS | RA_AS | RA_ACS |
| 200 | 0.0369596 | −0.0158085 | 0.019863 | −0.007224 | 0.002979 | 0.04664 | −0.01581 |
| 60 | 0.0577550 | −0.0263656 | 0.028886 | −0.014929 | 0.004870 | 0.08554 | −0.02637 |

Based on equations 5.17, 5.21, and 5.24, estimated values for TAS, TBS, and TCS may be obtained and compared to measured test results, as shown below in tables 64-69. Specifically, tables 64 and 65 show estimated and measured values for the test configuration shown in FIG. 4B (phases B and C powered with equal current). Tables 66 and 67 show estimated and measured values for the test configuration shown in FIG. 4A (all phases powered with equal current). Tables 68 and 69 show estimated and measured values for the test configuration shown in FIG. 4D (full current in phase B, half current in phases A and C).

TABLE 64

| | | | | | |
|---|---|---|---|---|---|
| BC Powered only | | | | | |
| SCFM/A | AV PA | AV PB | AV PC | test TS-Tair | Est TS-Tair |
| 200/200 | 0 | 631.23 | 632.59 | 19.2 | 18.40 |
| 60/100 | 0 | 245.37 | 246.26 | 18 | 17.72 |

TABLE 65

| SCFM | AV PA | test_TS − Tair | Est TS − Tair | est TXS | G + 0.009 * PX | TEST dTXS | Tair | ESTIM TX | TEST TX |
|---|---|---|---|---|---|---|---|---|---|
| 200 |  |  |  |  |  |  |  |  |  |
| 60 |  |  |  |  |  |  |  |  |  |

| SCFM | AV PB | test_TS − Tair | Est TS − Tair | est TBS = RB_BS * PB + RC_BCS * PC − RSairA * PA | G + 0.009 * PX | TEST dTXS | Tair | ESTIM TX | TEST TX |
|---|---|---|---|---|---|---|---|---|---|
| 200 | 631.23 | 19.2 | 18.40 | 13.32969521 | 19.01 | 18.2 | 30.8 | 68.21 | 68.2 |
| 60 | 245.37 | 18 | 17.72 | 7.677500757 | 9.89 | 9.6 | 30.2 | 57.81 | 57.9 |

| SCFM | AV PC | test_TS − Tair | Est TS − Tair | estTCS = RB_CBS * PB + RC_CS * PC + RA_CAS * PA | G + 0.009 * PX | TEST dTXS | Tair | ESTIM TX | TEST TX |
|---|---|---|---|---|---|---|---|---|---|
| 200 | 632.59 | 19.2 | 18.40 | 8.005179368 | 13.70 | 12.9 | 30.8 | 62.89 | 62.9 |
| 60 | 246.3 | 18 | 17.72 | 3.451595277 | 5.67 | 5.4 | 30.2 | 53.59 | 53.7 |

TABLE 66

A, B, C powered with equal current

| SCFM | AV PA | AV PB | AV PC | Test_TS-Tair | Est TS-Tair |
|---|---|---|---|---|---|
| 200 | 630.35 | 630.42 | 632.55 | 20.8 | 20.60 |
| 60 | 246 | 246.52 | 247.29 | 21.6 | 21.49 |

TABLE 67

| SCFM | AV PA | test_TS − Tair | Est TS − Tair | est TAS = RA_AS * PA + RA_ACS * PC − RSairB * PB | G + 0.009 * PX | TEST dTAS | Tair | ESTIM TA (case) | TEST TA (case) |
|---|---|---|---|---|---|---|---|---|---|
| 200 | 630.35 | 20.8 | 20.60 | 12.93394 | 18.61 | 19.6 | 29.9 | 69.11 | 70.3 |
| 60 | 246 | 21.6 | 21.49 | 7.04657 | 9.26 | 9.6 | 30.7 | 61.45 | 61.9 |

| SCFM | AV PB | test_TS − Tair | Est TS − Tair | est TBS = RB_BS * PB + RC_BCS * PC − RSairA * PA | G + 0.009 * PX | test dTBS | Tair | ESTIM TB (case) | TEST TB (case) |
|---|---|---|---|---|---|---|---|---|---|
| 200 | 630.42 | 20.8 | 20.60 | 11.08653844 | 16.76 | 15.4 | 29.9 | 67.26 | 66.3 |
| 60 | 246.52 | 21.6 | 21.49 | 4.027944833 | 6.25 | 6.9 | 30.7 | 58.44 | 59.3 |

| SCFM | AV PC | test_TS − Tair | Est TS − Tair | estTCS = RB_CBS * PB + RC_CS * PC + RA_CAS * PA | G + 0.009 * PX | test dTCS | Tair | ESTIM TC (case) | TEST TC (case) |
|---|---|---|---|---|---|---|---|---|---|
| 200 | 632.55 | 20.8 | 20.60 | 9.887986614 | 15.58 | 15.4 | 29.9 | 66.08 | 66.1 |
| 60 | 247.29 | 21.6 | 21.49 | 4.660926233 | 6.89 | 6.9 | 30.7 | 59.08 | 59.1 |

TABLE 68

100-50-50 case

| SCFM | AV PA | AV PB | AV PC | Test_TS − Tair | RSairA | RSairB | RSairC | Est TS − Tair |
|---|---|---|---|---|---|---|---|---|
| 200 | 243.13 | 628.00 | 248.82 | 12.40 | 0.003512 | 0.010259 | 0.01884 | 11.98544 |
| 60 | 244.56 | 650.18 | 250.81 | 34.50 | 0.014999 | 0.030324 | 0.04176 | 33.85831 |

TABLE 69

| SCFM | AV PA | test_TS – Tair | Est TS – Tair | est TAS = RA_AS * PA + RA_ACS * PC – RSairB * PB | G + 0.009 * PX | TEST dTAS | Tair | ESTIM TA (case) | TEST TA (case) |
|---|---|---|---|---|---|---|---|---|---|
| 200 | 243.13 | 12.4 | 11.99 | 0.96392 | 3.15 | 4.1 | 31.2 | 46.34 | 47.5 |
| 60 | 244.56 | 34.5 | 33.86 | −5.41001 | −3.21 | −1.02 | 31 | 61.65 | 64.7 |

| SCFM | AV PB | test_TS – Tair | Est TS – Tair | est TBS = RB_BS * PB + RC_BCS * PC – RSairA * PA | G + 0.009 * PX | test dTBS | Tair | ESTIM TB (case) | TEST TB (case) |
|---|---|---|---|---|---|---|---|---|---|
| 200 | 628 | 12.4 | 11.99 | 18.42326 | 24.08 | 21.4 | 31.2 | 67.26 | 65 |
| 60 | 650.18 | 34.5 | 33.86 | 27.27011 | 33.12 | 31.6 | 31 | 97.98 | 97 |

| SCFM | AV PC | test_TS – Tair | Est TS – Tair | estTCS = RB_CBS * PB + RC_CS * PC + RA_CAS * PA | G + 0.009 * PX | test dTCS | Tair | ESTIM TC (case) | TEST TC (case) |
|---|---|---|---|---|---|---|---|---|---|
| 200 | 248.82 | 12.4 | 11.99 | 1.12978 | 3.37 | 4.4 | 31.2 | 46.55 | 48 |
| 60 | 250.81 | 34.5 | 33.86 | −1.27066 | 0.99 | 4.89 | 31 | 65.84 | 70.3 |

Based on the data provided above, it can be seen that the estimated values for TA, TB, and TC are very close to the measured temperature values. Further, USL values and regression equations may be developed for the parameters RB_BS, RC_BCS, RB_CBS, RC_CS, RA_CAS, RA_AS, RA_CAS. As before, the USL values for these parameters can be used to avoid over-estimating these parameters and, thus, to avoid underestimating the junction temperatures.

The USL values for RCA, RA, RC, RBC, and RB are shown above in table 24. The USL values for RSairA, RSairB, and RSairC are shown above in tables 57-58. The USL values for RCA, RA, RC, RBC, RB, RSairA, RSairB, and RSairC can be used to determine USL values for RB_BS, RC_BCS, RB_CBS, RC_CS, RA_CAS, RA_AS, RA_CAS using equations 5.15, 5.16, 5.18, 5.19, 5.20, 5.22, and 5.23. For example, equation 5.15 can be used to obtain the USL values for RB_BS as shown below in table 71.

TABLE 71

RB_BS = RB – RSairB

| SCFM | USL RB | USL RSairB | USL RB_BS |
|---|---|---|---|
| 200 | 0.050850 | 0.016680 | 0.034170 |
| 150 | 0.057547 | 0.021303 | 0.036244 |
| 100 | 0.071985 | 0.030223 | 0.041763 |
| 60 | 0.094386 | 0.047656 | 0.046730 |
| 35 | 0.128310 | 0.070825 | 0.057485 |
| 0 | 0.458063 | 0.428020 | 0.030044 |

Equation 5.16 can be used to obtain the USL values for RC_BCS as shown below in table 72.

TABLE 72

RC_BCS = RBC – RSairC

| SCFM | USL RBC | USL RSairC | USL RC_BCS |
|---|---|---|---|
| 200 | 0.006450 | 0.012606 | −0.006156 |
| 150 | 0.013248 | 0.015729 | −0.002481 |
| 100 | 0.020643 | 0.018749 | 0.001894 |

TABLE 72-continued

RC_BCS = RBC – RSairC

| SCFM | USL RBC | USL RSairC | USL RC_BCS |
|---|---|---|---|
| 60 | 0.034592 | 0.024883 | 0.009709 |
| 35 | 0.064947 | 0.037567 | 0.027380 |
| 0 | 0.738187 | 0.162026 | 0.576161 |

Equation 5.18 can be used to obtain the USL values for RB_CBS as shown below in table 73.

TABLE 73

RB_CBS = RCB – RSairB

| SCFM | USL RBC | USL RSairB | USL RB_CBS |
|---|---|---|---|
| 200 | 0.006450 | 0.016680 | −0.010230 |
| 150 | 0.013248 | 0.021303 | −0.008054 |
| 100 | 0.020643 | 0.030223 | −0.009580 |
| 60 | 0.034592 | 0.047656 | −0.013064 |
| 35 | 0.064947 | 0.070825 | −0.005878 |
| 0 | 0.738187 | 0.428020 | 0.310167 |

Equation 5.19 can be used to obtain the USL values for RC_CS as shown below in table 74.

TABLE 74

RC_CS = RC – RSairC

| SCFM | USL RC | USL RSairC | USL RC_CS |
|---|---|---|---|
| 200 | 0.044130 | 0.012606 | 0.031524 |
| 150 | 0.051292 | 0.015729 | 0.035563 |
| 100 | 0.067135 | 0.018749 | 0.048386 |
| 60 | 0.085785 | 0.024883 | 0.060902 |
| 35 | 0.111029 | 0.037567 | 0.073462 |
| 0 | 0.379574 | 0.162026 | 0.217548 |

Equation 5.20 can be used to obtain the USL values for RA_CAS as shown below in table 75.

TABLE 75

RA_CAS = RCA − RSairA

| SCFM | USLRCA | USL RSairA | USL RA_CAS |
|---|---|---|---|
| 200 | 0.008750 | 0.011184 | −0.002434 |
| 150 | 0.011584 | 0.014495 | −0.002911 |
| 100 | 0.016271 | 0.020723 | −0.004452 |
| 60 | 0.026626 | 0.035519 | −0.008893 |
| 35 | 0.042483 | 0.055873 | −0.013390 |
| 0 | 0.283475 | 0.332698 | −0.049223 |

Equation 5.22 can be used to obtain the USL values for RA_AS as shown below in table 76.

TABLE 76

RA_AS = RA − RSairA

| SCFM | USL RA | USL RSairA | USL RA_AS |
|---|---|---|---|
| 200 | 0.055510 | 0.011184 | 0.044326 |
| 150 | 0.064519 | 0.014495 | 0.050024 |
| 100 | 0.084447 | 0.020723 | 0.063724 |
| 60 | 0.112248 | 0.035519 | 0.076729 |
| 35 | 0.139661 | 0.055873 | 0.083788 |
| 0 | 0.477457 | 0.332698 | 0.144759 |

Equation 5.23 can be used to obtain the USL values for RA_ACS as shown below in table 77.

TABLE 77

RA_ACS = RBC − RSairC

| SCFM | USL RBC | USL RSairC | USL RA_ACS |
|---|---|---|---|
| 200 | 0.006450 | 0.012606 | −0.006156 |
| 150 | 0.013248 | 0.015729 | −0.002481 |
| 100 | 0.020643 | 0.018749 | 0.001894 |
| 60 | 0.034592 | 0.024883 | 0.009709 |
| 35 | 0.064947 | 0.037567 | 0.027380 |
| 0 | 0.738187 | 0.162026 | 0.576161 |

In an embodiment, regression techniques may be applied to the USL values obtained for the above parameters. Using the example data shown in tables 71 to 77 above, the following regression equations may be obtained.

$$RB\_BS = 0.0312 + 0.0693 * EXP(-SCFM/24.88) + 0.022 * EXP(-SCFM/99.5) \quad \text{eq. 5.25}$$

$$RC\_BCS = -2.66E-2 + 0.5682 * EXP(-SCFM/10.37) + 0.0396 * EXP(-SCFM/302) \quad \text{eq. 5.26}$$

$$RB\_CBS = -0.00929 + 0.31975 * EXP(-SCFM/7.8) \quad \text{eq. 5.27}$$

$$RC\_CS = 0.0299 + 0.0895 * EXP(-SCFM/59.1) + 0.087 * EXP(-SCFM/13.5) \quad \text{eq. 5.28}$$

$$RA\_CAS = -2.19E-3 - 0.0418 * EXP(-SCFM/18) - 0.018 * EXP(-SCFM/46.29) \quad \text{eq. 5.29}$$

$$RA\_AS = 4.63E-02 + 0.1356 * EXP(-SCFM/57) - 0.0358 * EXP(-SCFM/84.5) \quad \text{eq. 5.30}$$

$$RA\_ACS = -1.84E-2 + 0.0338 * EXP(-SCFM/200.6) + 0.5032 * EXP(-SCFM/11.4) \quad \text{eq. 5.31}$$

With regard to the thermal capacitances, for a thermal timing constant, $\tau$, equal to 190 seconds at 150 SCFM and the test data, the data shown in table 78 can be provided.

TABLE 78

For SCFM = 150: $\tau$ = 190 sec

| | | RB_BS = RB − RSairB | | |
|---|---|---|---|---|
| RB | RSair_B | RB_BS | Cth = 190/Rth | |
| 0.053044 | 0.0131241 | 0.0399199 | 4760 | |
| | | RC_BCS = RBC − RSairC | | |
| RBC | RSairC | RC_BCS | Cth = 190/Rth | |
| 0.005823 | 0.0236763 | −0.0178533 | −10642 | 0 |
| | | RB_CBS = RCB − RSairB | | |
| RBC | RSairB | RB_CBS | Cth = 190/Rth | |
| 0.005823 | 0.0131241 | −0.0073011 | −26023 | 0 |
| | | RC_CS = RC − RSairC | | |
| RC | RSairC | RC_CS | Cth = 190/Rth | |
| 0.057398 | 0.0236763 | 0.0337217 | 5634 | |
| | | RA_CAS = RCA − RSairA | | |
| RCA | RSairA | RA_CAS | Cth = 190/Rth | |
| 0.008588 | 0.0047253 | 0.0038627 | 49188 | 0 |
| | | RA_AS = RA − RSairA | | |
| RA | RSairA | RA_AS | Cth = 190/Rth | |
| 0.057398 | 0.0047253 | 0.0526727 | 3607 | |
| | | RA_ACS = RBC − RSairC | | |
| RBC | RSairC | RA_ACS | Cth = 190/Rth | |
| 0.005823 | 0.0236763 | −0.0178533 | −10642 | 0 |

It will be appreciated from table 78 that although −ve Rth shows cooling affect, −ve Cth does not have physical meaning, so these Cth's are zero, denoting an immediate affect (Cth=0 j/degr C.). Further, although the RA_CAS, using test data on 150 SCFM appears as a small number, its USL's for all SCFM are negative numbers. Thus, CA_CAS should also be taken as ZERO. This will make the capacitances of the interphases between phases equal to ZERO. The thermal impedance function derived herein may be used to determine real-time junction temperatures. For example, the thermal impedance functions described above may be programmed into the system controller 1702 (FIG. 17).

FIG. 20 is a block diagram of a circuit for estimating junction temperatures of the IGBTs in a double H-bridge. Those of ordinary skill in the art will appreciate that the functional blocks and devices shown in FIG. 20 may include hardware elements including circuitry, software elements including computer code stored on a non-transitory, machine-readable medium or a combination of both hardware and software elements. Additionally, the functional blocks and devices of the junction temperature estimation circuit 2000 are but one example of functional blocks and devices that may be implemented in an exemplary embodiment of the invention. Those of ordinary skill in the art would readily be able to define specific functional blocks based on design considerations for a particular application.

The estimated junction temperatures may be used to control various aspects of the operation of the double H-bridge. In an embodiment, the applied load current may be modified based on the estimated junction temperatures, for example, by modifying the control signals used to drive the double H-bridge. In an embodiment, the estimated junction temperatures may be used in the process of controlling a traction motor, to which the double H-bridge is operably coupled for powering the motor. In an embodiment, the estimated junction temperatures may be used to control a cooling unit operably coupled to the double H-bridge. In an embodiment, the spatial, thermal, and/or electrical topology of the double H-bridge may be modified based on the estimated junction temperatures.

As shown in FIG. 20, the inputs to the junction temperature estimation circuit 2000 may include the powers for the IGBTs and diodes in each of the phases, the air flow rate, and the ambient temperature of the air. The output of the junction temperature estimation circuit 2000 may be the junction temperatures of the IGBTs of each of the phases. The junction temperature computations performed junction temperature estimation circuit 2000 may be based on the thermal impedance equations described above. In an embodiment, the junction temperature estimation circuit 2000 may include a switch 2002. In embodiments wherein FIG. 20 represents a block diagram of the real time estimation of the junction temperature of the IGBT's in the three different phases (TjA, TjB and TjC) by the microprocessor in a control logic card, this switch in the estimation logic may be performed by software. If the temperatures sensor 1700 is operating properly, the switch may be in position 1. If the temperature sensor 1700 is not operating properly, the switch may be in position 2.

In order to validate the results, TjB, TjC, TjA (denoted below as TjBS, TjCS and TjAS to indicate that results were obtained by estimating the sensor temperature) was estimated directly from Tair and compared to values obtained by estimating TSair and delta TBcase to Sensor, delta TCcase to Sensor and delta TAcase to Sensor. The results of the tests are shown below in table 79. For the test results shown in table 79, Vbatt=80 Volts and Tair=61 Degr C.

TABLE 79

Steady State Specifications with Vbatt = 80 V, Tair = 61 degr C.

| | | | | Calculation Directly from Tair | | | Estim. Tsens & TjS | | |
|---|---|---|---|---|---|---|---|---|---|
| Vlink | SCFM | Ifield | Ibatt | TjB | TjC | TjA | TjBS | TjCS | TjAS |
| 1500 | 198 | 125 | 300 | 116.16 | 126.31 | 100.72 | 115.96 | 129.41 | 102.34 |
| 1300 | 198 | 400 | 300 | 125.76 | 119.2 | 108.09 | 125.43 | 122.31 | 110.55 |
| 875 | 198 | 400 | 300 | 117.22 | 104.71 | 95.34 | 116.92 | 107.13 | 97.01 |
| 700 | 198 | 325 | 380 | 118.96 | 105.46 | 88.74 | 118.64 | 107.83 | 89.86 |
| 400 | 113 | 200 | 380 | 122.57 | 112.55 | 86.96 | 122.01 | 111.97 | 87.54 |
| 300 | 85 | 175 | 225 | 107.19 | 99.36 | 83.76 | 105.89 | 98.72 | 84.20 |
| 250 | 71 | 125 | 225 | 107.63 | 100.52 | 82.3 | 104.86 | 98.53 | 82.04 |

As can be seen from the data in table 79, the two sets of results are within a few degrees C., proving that the equations used to determine the junction temperatures provides a very good estimation of the thermal behavior of the double H-bridge converter. In an embodiment, the real-time, measured or estimated junction temperatures may be used by the double H-bridge controller to control the airflow rate of the double H-bridge's associated cooling unit.

The evolution of power electronic semiconductors has provided devices, such as IGBTs, with reduced power dissipation and increased junction temperature (Tj) capability. The latest generations of Isolating Gate Bipolar Transistors (IGBT's) have by far reduced power dissipation resulting in the ability to handle much more power. However, the improved power handling capabilities impose some additional constrains. As the upper temperature limit for operating the junction of the IGBT's increases, it also increases the thermal cycling of the device, which can result in reduced reliability long term over the long term absent additional safeguards.

Generally, there are two factors that restrict the thermal cycling capability of an IGBT, namely, the base plate soldering and the bond wires, both of which are subject to fatigue due to thermal cycling. The base plate soldering reliability depends, in part, on the material of the base plate. In an embodiment, the base plate soldering may use a metal matrix composite referred to as "AlSiC," which includes an aluminum matrix with silicon carbide particles and provides more thermal cycling durability. To increase the durability of the aluminum wires interconnecting the chips inside the IGBT package, the wires may be coated.

FIG. 21 is a block diagram of a system controller for a double H-bridge that controls the airflow rate based on an estimated amount of desired cooling. The double H-bridge controller, as referred to as the auxiliary logic controller (ALC), may calculate, in real time, the junction temperatures of the IGBTs it controls and determine a required level of cooling (in Standard Cubic Feet per Minute "SCFM")). The double H-bridge controller may determine a required level of cooling that will reduce thermal cycling and, thus, reduces thermal fatigue in the IGBT modules. The desired level of cooling may be passed from the individual double H-bridge controller (ALC) to the system controller which selects the greater required cooling level of all individual converters in the system, and uses this cooling level as the base to provide a command to the controller of the equipment blower that provides the air flow.

As shown in FIG. 21, the double H-bridge controller sends signals TBjc, dTCjc, PB, and PC to the system controller, where dTBjc=temperature difference of case B to air and dTCjc=temperature difference of case C to air.

The system controller, based on the signals received by the ALC, estimates the required effective thermal resistances between the heatsink underneath each phase and the cooling air, RB* and RC*. The values of RB* and RC* may be similar to, but slightly larger than, the RBt and RCt values described above, because RBt and RCt were derived directly from the test data by allowing a three-sigma tolerance (Z=3). In order to be compatible with the rest of the simulation, RB* and RC* are derived from the USLs of RB, RBC, RC and RCA which had their standard deviation enlarged with the use of statistical modeling, resulting in larger values for RB* and RC*.

From equation 3.1:

$$TB-Tair=dTB=RB^*PB+RBC^*PC+RBA^*PA$$

In equation 3.1, RBA equals zero, since there is no significant contribution of PA to dTB. Thus:

$$TB-Tair=dTB=RB^*PB+RBC^*PC$$

From equation 3.2:

$$TC-Tair=dTC=RC^*PC+RBC^*PB+RCA^*PA$$

The USL values for RCA, RA, RC, RBC, and RB are shown in table 24. In order to simplify the computations for RB*, since RB>>RBC, the power Po=max(PB,PC) may be used for estimating the desired RthB_ha (desired RB*). Applying this simplification yields:

$$TB-Tair=RB^{**}Po=RB^{*}Po+RBC^{*}Po=Po^{*}(RB+RBC)$$

Solving for RB* yields:

$$RB^{*}=RB+RBC \quad \text{eq. 7.1}$$

Accordingly:

$$RB^{**}Po=RB^{*}Po+RBC^{*}Po=Po^{*}(RB+RBC)$$

Similarly, for RC*, since PA<max(PB, PC), RC* may be simplified to:

$$RC^{*}=RC+RBC+RCA \quad \text{eq. 7.2}$$

USL values for RB* and RC* may be developed, and are shown below in tables 81 and 82.

TABLE T81

| eq. 7.2: RB* = RB + RBC | | | |
|---|---|---|---|
| SCFM | USL RB | USL RBC | USL RB* |
| 200 | 0.050850 | 0.006450 | 0.057300 |
| 150 | 0.057547 | 0.013248 | 0.070795 |
| 100 | 0.071985 | 0.020643 | 0.092628 |
| 60 | 0.094386 | 0.034592 | 0.128977 |
| 35 | 0.128310 | 0.064947 | 0.193258 |
| 0 | 0.458063 | 0.738187 | 1.196250 |

TABLE 82

| eq. 7.2: RC* = RC + RBC + RCA | | | | |
|---|---|---|---|---|
| SCFM | USL RC | USL RBC | USLRCA | USL RC* |
| 200 | 0.044130 | 0.006450 | 0.008750 | 0.059330 |
| 150 | 0.051292 | 0.013248 | 0.011584 | 0.076125 |
| 100 | 0.067135 | 0.020643 | 0.016271 | 0.104049 |
| 60 | 0.085785 | 0.034592 | 0.026626 | 0.147003 |
| 35 | 0.111029 | 0.064947 | 0.042483 | 0.218460 |
| 0 | 0.379574 | 0.738187 | 0.283475 | 1.401236 |

Based on the USL values from tables 81 and 82, it will be noticed that the USL values at the airflow rate of 0 SCFM appear to be out-liers. Regression equations describing the desired air flow rate as a function of RB* and RC* may be developed by applying regression techniques to the USL values for RC* and RB*. Applying such techniques to the exemplary USL data shown in tables 81 and 82 yields:

$$\text{req.SCFM}\_B=36.43+769.62^{*}\text{EXP}(-RB^{*}/0.037) \quad \text{eq. 7.3}$$

$$\text{reqSCFM}\_C=34.95+591.2^{*}\text{EXP}(-RC^{*}/0.0465) \quad \text{eq. 7.4}$$

In the above equations, SCFM_B, and SCFM_C are the airflow values desired for reliable operation of phase B and C, respectively. As shown in FIG. 21, the system controller may be configured to apply the regression equations shown above to control the airflow applied to the double H-bridges under its control.

The power dissipation of phase B or phase C may be referred to herein as PX, where X can equal B or C. The junction temperature of the phase A or phase B may be referred to herein as TjX, where X can equal A or B, and can be expressed as:

$$TjX=Tair+dTha+dTch+dTjc$$

In the above equation, dTha represents the temperature difference between the heat sink and the air, dTch represents the temperature difference between the IGBT case and the heat sink, and dTjc represents the temperature difference between the junction of the IGBT and its case. The parameters dTha and dTch can be expressed as follows:

$$dTha=PX^{*}RX^{*}$$

$$dTch=(PX/2)^{*}0.018=PX^{*}0.009$$

Thus, the equation for TjX can be expressed as:

$$TjX-Tair=PX^{*}RX^{*}+dTXjc+PX^{*}0.009 \quad \text{eq. 7.5}$$

Solving for RX* yields:

$$RX^{*}=[(TjX-Tair)-dTXjc]/PX-0.009 \quad \text{eq. 7.6}$$

Thus, the values of RB* and RC* can be computed based on the specified maximum thermal cycling guideline suitable for a particular application. In an embodiment, the max thermal cycling (TjX-Tair) in phase B may be specified to be approximately 64.5 degr C., and the max thermal cycling (TjX-Tair) in phase C may be specified to be approximately 68.5 degr C., which yields:

$$RB^{*}=(64.5-dTBjc)/PB-0.009 \quad \text{eq. 7.7}$$

$$RC^{*}=(68.5-dTCjc)/PC-0.009 \quad \text{eq. 7.8}$$

For explanation of the cycling levels used (64.5 and 68.5), see tables 84 and 85 below.

FIG. 21 represents the logic diagram, based on eq. 7.3, 7.4, 7.7 and 7.8, used in real time estimation of the required air flow (SCFM) by the double H-bridge for reliable operation. Running the junction temperature simulation for Vbatt=80V, Tair=61 degr C. (Tamb=49 degr C.) at the rating (steady state conditions) yields the junction temperatures shown below in table 83. Notice that the "air flow" in the table represents the maximum air flow that can be obtained at the specified values of Vlink.

TABLE 83

| Simulation for Vbatt = 80 V, Tair = 61 degr C. (Tamb = 49 degr C.) at the rating (steady state) conditions. | | | | | | | | | |
|---|---|---|---|---|---|---|---|---|---|
| Vlink dc Volts | Air Flow SCFM | Ibatt A | Ifield A | PB W | PC W | PA W | TjB °C./W | TjC °C./W | TjA °C./W |
| 1500 | 198 | 300 | 125 | 677.58 | 921.38 | 461.92 | 115.96 | 129.41 | 102.34 |
| 1300 | 198 | 300 | 400 | 882.19 | 779.72 | 590.54 | 125.43 | 122.31 | 110.54 |
| 700 | 198 | 380 | 325 | 742.36 | 624.08 | 328.25 | 118.64 | 107.83 | 89.86 |
| 400 | 113 | 380 | 200 | 595.23 | 485.1 | 191.65 | 122.01 | 111.97 | 87.54 |

From the above, the worst-case steady state operating combination of Vlink, Ifield and Ibattery, can be determined as shown in tables 84 and 85 below. Specifically, the worst-case steady state operating combination for phase B is shown in table 84, and the worst-case steady state operating combination for phase C is shown in table 85.

TABLE 84

For phase B:

| Vlink | Ifield | Ibattery | PB | TjB | TjB-Tair (cycling) |
|---|---|---|---|---|---|
| 1300 V | 400 A | 300 A | 882.19 W | 125.5 degr C. | 64.5 degr C. |

TABLE 85

For phase C:

| Vlink | Ifield | Ibattery | PC | TjC | TjC-Tair (cycling) |
|---|---|---|---|---|---|
| 1500 V | 125 A | 300 A | 921.38 W | 129.5 degr C. | 68.5 degr C. |

In the example provided above, at any point of operation where the phase B dissipation is PB and the thermal difference between TBj and case B is dTBjc, the RB* value given by equation 7.7 will provide thermal cycling less than or equal to 64.5 degr C. Similarly, at any point of operation where the phase C dissipation is PC and the thermal difference between TCj and case C is dTCjc, the RC* value given by equation 7.7 will provide thermal cycling less than or equal to 68.5 degr C.

As shown in FIG. 21, the parameter RB* may be used to determine the desired SCFM_B through eq. 7.3, and the parameter RC* may be used to determine the desired SCFM_C through eq. 7.4. The system controller may select the greater of the two values in order to provide the desired air flow for both the phases. As described above in relation to Table 17, phase A will always be cooler than phase C and phase B.

To test the strategy described above, the system of FIG. 21 may be computer modeled, for example, using Matlab. Modeling the system of FIG. 21 yielded the test results shown in table 86, which were obtained for the steady state guidelines in the full range of Tair:

In table 86, the second column from the left indicates the available air flow from the equipment blower. As shown in table 86, if reqSCFM>available SCFM, then the available air flow is applied. It can also be seen from the data in table 86 that the desired airflow (reqSCFM) computed using equations 7.7 and 7.3 will be identical up to Vlink=1300V. However, using these two equations above 1300V it will result in over-estimating the desired airflow. However, above 1300V the blower will be operated close to, or at, the maximum airflow available, in other words, 198 SCFM. Based on these observations, the system shown in FIG. 21 can be simplified, as shown in FIG. 22.

FIG. 22 is a block diagram of a system controller for a double H-bridge that controls the airflow rate based on an estimated amount of desired cooling. As shown in FIG. 22, the double H-bridge sends a single desired level of cooling (dTjc) and a single power (P). The double H-bridge includes logic for determining whether the values of dTjc and P will be based on phase B or phase C. For example, if PB is greater than PC, then dTjc and P are based on phase B. Otherwise, dTjc and P are based on phase C. Because the system controller receives on two signals from the double H-bridge controller, the system controller circuitry may be simplified as shown in FIG. 22.

To verify that the simplified system of FIG. 22 does not limit the capability of the double H-bridge, the system can be modeled at Vlink>=1300V, since it has been shown that below 1300V the two techniques provide identical results. The capability of the double H-bridge at 1300V, 1400V and 1500V was derived for an ambient air temperature of 20 degr C. (Tair=32 degr C.), and was based in the fact that thermal cycling above 68.5 degr C. is undesirable. Thus, the following test cases were modeled by fixing the max load of one of the two currents for the given Vlink, and re-adjusting the other one till the thermal cycling was approximately equal to 68.5 degr C. The above tests were repeated with original system

TABLE 86

100% for SFC REDUCTION

| | | phC | phA | | | | EVO_VENTILATION_012011.mdl | | | | |
|---|---|---|---|---|---|---|---|---|---|---|---|
| Vlink dc Volts | Avail. SCFM SCFM | Ibatt A | Ifield A | Tair °C. | TjB °C. | TjB – Tair °C. | reqSCFM (B) SCFM | TjC °C. | TjC – Tair °C. | reqSCFM (C.) SCFM | req SCFM SCFM |
| 1500 | 198 | 300 | 125 | 61 | 115.96 | 54.96 | 140.34 | 129.41 | 68.41 | 213.39 | 198 |
| 1500 | 198 | 300 | 125 | 50 | 103.57 | 53.57 | 133.41 | 116.97 | 66.97 | 208.01 | 198 |
| 1500 | 198 | 300 | 125 | 30 | 81.06 | 51.06 | 121.12 | 94.36 | 64.36 | 198.18 | 198 |
| 1500 | 198 | 300 | 125 | 10 | 60.01 | 50.01 | 108.82 | 73.21 | 63.21 | 188.26 | 188.26 |
| 1500 | 198 | 300 | 125 | −10 | 39.18 | 49.18 | 97.22 | 52.13 | 62.13 | 176.89 | 176.89 |
| 1500 | 198 | 300 | 125 | −40 | 11.97 | 51.97 | 100.70 | 22.57 | 62.57 | 163.60 | 163.6 |
| 1300 | 198 | 300 | 400 | 61 | 125.43 | 64.43 | 199.72 | 122.31 | 61.31 | 167.66 | 198 |
| 1300 | 198 | 300 | 400 | 50 | 114.06 | 64.06 | 191.49 | 111.22 | 61.22 | 163.81 | 191.49 |
| 1300 | 198 | 300 | 400 | 30 | 94.00 | 64.00 | 177.06 | 91.74 | 61.74 | 157.06 | 177.06 |
| 1300 | 198 | 300 | 400 | 10 | 74.04 | 64.04 | 162.89 | 72.41 | 62.41 | 149.62 | 162.89 |
| 1300 | 198 | 300 | 400 | −10 | 54.12 | 64.12 | 149.05 | 53.06 | 63.06 | 141.04 | 149.05 |
| 1300 | 198 | 300 | 400 | −40 | 24.35 | 64.35 | 129.87 | 25.05 | 65.05 | 128.74 | 129.87 |
| 700 | 198 | 380 | 325 | 61 | 123.90 | 62.90 | 169.73 | 112.52 | 51.52 | 114.84 | 169.73 |
| 700 | 198 | 380 | 325 | 50 | 112.83 | 62.83 | 162.86 | 101.79 | 51.79 | 111.55 | 162.86 |
| 700 | 198 | 380 | 325 | 30 | 92.75 | 62.75 | 150.55 | 82.45 | 52.45 | 105.69 | 150.55 |
| 700 | 198 | 380 | 325 | 10 | 72.73 | 62.73 | 139.04 | 63.19 | 53.19 | 100.12 | 139.04 |
| 700 | 198 | 380 | 325 | −10 | 52.73 | 62.73 | 128.70 | 43.94 | 53.94 | 94.68 | 128.7 |
| 700 | 198 | 380 | 325 | −40 | 23.01 | 63.01 | 115.22 | 16.76 | 56.76 | 91.21 | 115.22 |
| 400 | 113 | 380 | 200 | 61 | 123.05 | 62.05 | 109.66 | 113.07 | 52.07 | 75.32 | 109.66 |
| 400 | 113 | 380 | 200 | 50 | 112.07 | 62.07 | 105.32 | 102.55 | 52.55 | 73.44 | 105.32 |
| 400 | 113 | 380 | 200 | 30 | 92.13 | 62.13 | 97.65 | 83.46 | 53.46 | 70.11 | 97.65 |
| 400 | 113 | 380 | 200 | 10 | 72.20 | 62.20 | 90.73 | 64.34 | 54.34 | 67.02 | 90.73 |
| 400 | 113 | 380 | 200 | −10 | 52.27 | 62.27 | 84.75 | 45.20 | 55.2 | 64.08 | 84.75 |
| 400 | 113 | 380 | 200 | −40 | 22.58 | 62.58 | 77.15 | 17.25 | 57.25 | 61.71 | 77.15 | shown in FIG. 21 and the simplified system shown in FIG. 22. Results of the tests are shown in below in table 87.

As shown in table 88, at some instances above 1300V, when PB<PC, the simplified system will overestimate the

TABLE 87

The above was repeated with original method and the new proposed simplified method:

| | | phC | phA | | | | ORIGINAL | | | | |
|---|---|---|---|---|---|---|---|---|---|---|---|
| Vlink dc Volts | Avail. SCFM SCFM | Ibatt A | Ifield A | Tair °C. | TjB °C. | TjB – Tair °C. | reqSCFM (B) SCFM | TjC °C. | TjC – Tair °C. | reqSCFM (C.) SCFM | req SCFM SCFM |
| 1500 | 198 | 343 | 125 | 32 | 86.56 | 54.56 | 137.6 | 100.49 | 68.49 | 216.46 | 198 |
| 1400 | 198 | 380 | 270 | 32 | 94.61 | 62.61 | 183.76 | 100.45 | 68.45 | 209.55 | 198 |
| 1400 | 198 | 340 | 450 | 32 | 100.8 | 68.8 | 221.92 | 99.08 | 67.08 | 194.18 | 198 |
| 1300 | 198 | 365 | 450 | 32 | 100.45 | 68.45 | 221.15 | 96.32 | 64.32 | 182.54 | 198 |
| 1300 | 198 | 380 | 425 | 32 | 100.45 | 68.45 | 220.42 | 97.38 | 65.38 | 188.58 | 198 |

| | | phC | phA | | | | SIMPLIFIED | | | | |
|---|---|---|---|---|---|---|---|---|---|---|---|
| Vlink dc Volts | Avail. SCFM SCFM | Ibatt A | Ifield A | Tair °C. | TjB °C. | TjB – Tair °C. | TjC °C. | TjC – Tair °C. | reqSCFM (C.) SCFM | req SCFM SCFM | |
| 1500 | 198 | 343 | 125 | 32 | 86.56 | 54.56 | 100.49 | 68.49 | 232.14 | 198 | |
| 1400 | 198 | 380 | 270 | 32 | 94.61 | 62.61 | 100.45 | 68.45 | 223.27 | 198 | |
| 1400 | 198 | 340 | 450 | 32 | 100.8 | 68.8 | 99.08 | 67.08 | 22192 | 198 | |
| 1300 | 198 | 365 | 450 | 32 | 100.45 | 68.45 | 96.33 | 64.33 | 221.15 | 198 | |
| 1300 | 198 | 380 | 425 | 32 | 100.45 | 68.45 | 97.38 | 65.38 | 220.42 | 198 | |

Based on the results shown in table 27, it can be seen that there is no difference in the "capability" of the double H-bridge using either system. However, the simplified system would have computed a greater required air flow for the two cases in which PB<PC (first two rows). However, since the max available air flow rate in this example is 198 SCFM, the two systems behaved identically.

Additional tests cases, shown below in table 88, were conducted to determine whether the system of FIG. 22 will compute a greater desired air flow when PB<PC.

desired air flow rate, but at these high voltages the required air flow will generally be greater than the max available air flow rate of 198 SCFM. Examining different scenarios of Vlink=>1300V and PB<PC, the required air flow rates below 198 SCFM differed by less than 6-7 SCFM, which is insignificant. Additional tests were performed for the maximum (steady state) currents at a Vlink of 1500V, which are shown below in table 89.

TABLE 88

| | Avail. | phC | phA | | | | ORIGINAL | | | | |
|---|---|---|---|---|---|---|---|---|---|---|---|
| Vlink dc Volts | SCFM SCFM | Ibatt A | Ifield A | Tair °C. | TjB °C. | TjB – Tair °C. | reqSCFM (B) SCFM | TjC °C. | TjC – Tair °C. | reqSCFM (C.) SCFM | req SCFM SCFM |
| 1400 | 198 | 190 | 350 | 32 | 95.59 | 63.59 | 137.26 | 97.99 | 65.99 | 140.77 | 140.77 |
| | | | | | | | | | PB = 669.74 | < | PC = 693.72 |
| 1400 | 198 | 325 | 325 | 32 | 94.79 | 62.79 | 177.46 | 97.96 | 65.96 | 188.22 | 188.22 |
| | | | | | | | | | PB = 768.97 | < | PC = 846.98 |
| 1400 | 198 | 380 | 125 | 32 | 87.35 | 55.35 | 142.66 | 98.74 | 66.74 | 208.88 | 198 |
| | | | | | | | | | PB = 683.46 | < | PC = 916.29 |
| 1400 | 198 | 300 | 125 | 32 | 84.94 | 52.94 | 115.96 | 95.11 | 63.11 | 178 | 178 |
| | | | | | | | | | PB = 613.72 | < | PC = 813.84 |

| | Avail. | phC | phA | | | | SIMPLIFIED | | | | |
|---|---|---|---|---|---|---|---|---|---|---|---|
| Vlink dc Volts | SCFM SCFM | Ibatt A | Ifield A | Tair °C. | TjB °C. | TjB – Tair °C. | TjC °C. | TjC – Tair °C. | reqSCFM (C.) SCFM | req SCFM SCFM | |
| 1400 | 198 | 190 | 350 | 32 | 95.81 | 63.81 | 98.25 | 66.25 | 139.96 | 139.96 | |
| 1400 | 198 | 325 | 325 | 32 | 93.2 | 61.2 | 96.5 | 64.5 | 195.9 | 195.9 | |
| 1400 | 198 | 380 | 125 | 32 | 87.34 | 55.34 | 98.74 | 66.74 | 222.4 | 198 | |
| 1400 | 198 | 300 | 125 | 32 | 83.85 | 51.85 | 94.05 | 62.05 | 183.56 | 183.56 | |

TABLE 89

| | | phC | phA | | ORIGINAL | | | | | | |
|---|---|---|---|---|---|---|---|---|---|---|---|
| Vlink dc Volts | Avail. SCFM SCFM | Ibatt A | Ifield A | Tair °C. | TjB °C. | TjB – Tair °C. | reqSCFM (B) SCFM | TjC °C. | TjC – Tair °C. | reqSCFM (C.) SCFM | req SCFM SCFM |
| 1500 | 198 | 300 | 125 | 61 | 116 | 54.96 | 140.34 | 129.4 | 68.41 | 213.39 | 198 |
| | | phC | phA | | SIMPLIFIED | | | | | | |
| Vlink dc Volts | Avail. SCFM SCFM | Ibatt A | Ifield A | Tair °C. | TjB °C. | TjB – Tair °C. | | TjC °C. | TjC – Tair °C. | reqSCFM (C.) SCFM | req SCFM SCFM |
| 1500 | 198 | 300 | 125 | 61 | 116 | 54.96 | | 129.4 | 68.41 | 213.39 | 198 |

As shown in table 89, since required air flow rate, reqSCFM, is at the upper specification limit of 198 SCFM, there is no change in the TjB, TjB-Tair, TjC, TjC-Tair between the two techniques. Based on the tests described above it can be seen that the simplified system of FIG. 22 appears to perform identically to the system of FIG. 21 from 1300V and below. Additionally, above 1300V there is no significant difference between the two systems estimate of the desired air flow rate, req.SCFM.

Thermal Protection of IGBT of the Double H-Bridge

In embodiments, the system controller may be configured to thermally protect the IGBT's of the double H-bridge, in case of a system malfunction, such as failure of the blower providing the cooling air, air-leaks in the plenum, tunnel operation, and the like. For example, the load current may be de-rated as described below, to reduce thermal cycling.

As an example, under maximum steady state operating conditions in the double H-bridge, the maximum Tj-Tair may be specified as 68.5 degr C. This may occur, for example, at If=125 A, Ibatt=300 A, Tair=61 degr C. (Tamb=49 degr C.) at 1500 Vdc, TjC=129.41 degr C., and TChs=112.32 degr C. In this example, TChs is approximately 85% of TjC and it is measured by the temperature sensor 1700 (FIG. 17). Furthermore, an error tolerance of 1.5 degr C. may be specified to account for the tolerance of the temperature sensor 1700, which may be approximately 1.3%. Thus, the maximum cycling temperature used in this example will be 68.5+1.5=70 degr C. Thus, Tj=70+Tair. At the maximum Tair of 61 degr C., Tjmax=131 degr C. It will be appreciated that the values shown above are exemplary and may be adjusted according to an actual implementation, which may vary based on the geographical location of the system. For example, for countries with Tamb=55 degr C., Tair max=55+5+7=67 degr C., which yields a Tjmax of 137 degr C.

Based on the exemplary values provided above, the system may be configured such that de-rating on Tj does not start until Tj>=137 degr C. When Tj-Tair is greater than 70 degr C. (calc Tj>131 degr C.), ALC (Auxiliary Logic Controller) may issue an indication that the IGBTs are getting hot, and no further action will be taken until Tj-Tair=76 degr C. (Tj=137 degr C.). In an embodiment, this stage will be omitted for countries with Tamb=55 degr C.

In an embodiment, the thermal cycling capability of the IGBTs is 75,000 thermal cycles of delta Tj=71 degr C. and 30,000 cycles of deltaTj=86 degr C. However, it will be appreciated that embodiments of the present techniques may include IGBTs with different thermal capabilities. Based on the deltaTj=86 degr C. and Tair=61 degr C., the double H-bridge controller may be configured to stop pulsing at Tj=147 degr C. or Tj-Tair=86 degr C. This provides a de-rating range shown below:

137 degr C.<=Tj<147 degr C., size 10 degr C., or
76 degr C.<=Tj-Tair<86 degr C., size 10 degr C.

In another example, for countries with Tamb=55 degr C. the double H-bridge controller may be configured to stop pulsing at 147 degr C. and the max delta cycling will be Tj-Tair=80 degr C. Notice that the absolute USL for Tj=150 degr C. This provides a de-rating range shown below:

137 degr C.<=Tj<147 degr C., size 10 degr C., or
70 degr C.<=Tj-Tair<80 degr C., size 10 degr C.

Embodiments of the present techniques may be better understood with reference to FIGS. 23 and 24 below.

FIG. 23 is a block diagram of a control loop used to de-rate the load current, in accordance with embodiments. The control loop may be implemented in the system controller. As shown in FIG. 23, the load current (or power) may be de-rated by reducing the Ibatt command 2300, which is sent from the system controller to the double H-bridge controller (ALC). Independent of the application, from the level we start de-rating the Ibatt, there is a range of 10 degrees to try to control Tj within the above specified levels, before reaching Tj=147 degr C. triggering a protective turn-off of the double H-bridge. In an embodiment, the Ibatt command will be de-rated for Tj>137 degr C. For example, at Tj<137 degr C., no de-rating takes place and the new Ibatt command 2300 equals the original Ibatt command 2302. At Tj=137+δT degr C., the new Ibatt command 2300 equals 1−(δT/12) times the original Ibatt command 2302. At Tj slightly less than 147 degr C., the new Ibatt command 2300 equals 1−(δT/12) times the original Ibatt command 2302 (16.7% of the original Ibatt command 2302.) Additionally, since the control loop has a minimum Ibatt equal to 16.7% of original Ibatt command, the double H-bridge controller (ALC) may switch off the operation of the Double H-bridge when Tj>=147 degr C. in either phase A or phase B. Using Tj as the controlling parameter for determining de-rating may provide suitable protection against thermal cycling during tunnel operation, or other scenarios in which the ambient air temperature is highest than normal.

FIG. 24 is a block diagram of a control loop used to de-rate the load current, in accordance with embodiments. The control loop may be implemented in the system controller. As shown in FIG. 23, the load current (or power) may be de-rated by reducing the Ibatt command 2300, which is sent from the system controller to the double H-bridge controller (ALC). In the control loop of FIG. 24, the controlling parameter for determining de-rating is Tj-Tair rather than Tj alone. Using Tj-Tair may provide suitable protection against thermal cycling in cases where the cooling unit is not operating efficiently due, for example, to a malfunctioned of the cooling system or blocked fins, among others. In an embodiment of the control loop shown in FIG. 24, the Ibatt command will be de-rated for Tj-Tair>76 degr C. For example, at Tj-Tair<76 degr C., no de-rating is performed and the new Ibatt command 2300 equals the original Ibatt command 2302. At Tj-Tair slightly less than 86 degr C., the new Ibatt command 2300 will be de-rated to 1−(10/12) times the original Ibatt command (16.7% of original Ibatt command.) Additionally, since the control loop has a minimum Ibatt equal to 16.7% of the original Ibatt command, the double H-bridge controller (ALC) may switch off the operation of the double H-bridge when Tj-Tair>86 degr C. in either phase B or C.

FIG. 25 is a block diagram of a diesel-electric locomotive that may employ an double H-bridge according to an exemplary embodiment of the invention. The locomotive, which is shown in a simplified, partial cross-sectional view, is generally referred to by the reference number 2500. A plurality of traction motors, not visible in FIG. 25, are located behind drive wheels 2502 and coupled in a driving relationship to axles 2504. A plurality of auxiliary motors, not visible in FIG. 25, are located in various locations on the locomotive, and coupled with various auxiliary loads like blowers or radiator fans. The motors may be alternating current (AC) electric motors. The locomotive 2500 may include a plurality of electrical inverter circuits, such as the double H-bridge converters described above, for controlling electrical power to the motors. The electrical power circuits are at least partially located in an equipment compartment 2506. The control electronics for the inverters 208 and the field control 204 as well as other electronic components may be disposed on circuit boards held in racks in the equipment compartment 2506. The control circuits may include the double H-bridge controller (ALC) and system controller described above. Within the equipment compartment 2506, the high power IGBT semiconductor devices used in the power conversion may be mounted to air-cooled heat sinks 2508.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to illustrate embodiments of the invention, they are by no means limiting and are exemplary in nature. Other embodiments may be apparent upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "3$^{rd}$," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described control method, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An electronic device comprising:
   a heatsink;
   a first dual IGBT coupled to the heatsink and configured to provide electrical power to a field exciter;
   a second dual IGBT coupled to the heatsink and configured to provide electrical power to a battery;
   a third dual IGBT coupled to the heatsink and common to the field exciter and the battery;
   a single temperature sensor disposed in the heatsink;
   a cooling unit comprising a plenum and a variable source of air flow; and
   a controller configured to:
      receive a temperature reading from the single temperature sensor and, based on the temperature reading, determine desired levels of cooling for at least two of the dual IGBTs, wherein the desired levels of cooling are different from one another and an air flow rate provided by the cooling unit is determined based on the desired levels of cooling.

2. The electronic device of claim 1, wherein the controller is configured to estimate junction temperatures of the at least two of the dual IGBTs based, at least in part, on the temperature reading, and the desired levels of cooling are determined based, at least in part, on the junction temperatures.

3. The electronic device of claim 1, wherein the at least two of the dual IGBTs comprise at least the second and third dual IGBTs, and wherein the temperature sensor is disposed between the second and third dual IGBT in the heatsink, and the controller is configured to estimate junction temperatures of at least the second and third dual IGBTs based on the temperature reading, and the desired levels of cooling are determined based, at least in part, on the junction temperatures of at least the second and third dual IGBTs.

4. The electronic device of claim 1, wherein the controller is configured to estimate a power level of at least one of the dual IGBTs based, at least in part, on the desired load current and a time that the dual IGBT is commanded to switch on; and the desired level of cooling corresponding to the dual IGBT is based, at least in part, on the power level.

5. An electronic device comprising:
   a heatsink;
   a first dual IGBT coupled to the heatsink and configured to provide electrical power to a field exciter;
   a second dual IGBT coupled to the heatsink and configured to provide electrical power to a battery;
   a third dual IGBT coupled to the heatsink and common to the field exciter and the battery;
   a temperature sensor disposed in the heatsink;
   a cooling unit comprising a plenum and a variable source of air flow; and
   a controller configured to receive a temperature reading from the temperature sensor and, based on the temperature reading, determine a desired level of cooling for at least one of the dual IGBTs;
   wherein an air flow rate provided by the cooling unit is determined based on the desired level of cooling, and wherein the controller determines a first desired level of cooling for the second dual IGBT and a second desired level of cooling for the third dual IGBT and sends signals corresponding to the first desired level of cooling and the second desired level of cooling to a system controller that controls the air flow rate based, at least in part, on the signals.

6. The electronic device of claim 5, wherein the system controller computes a first desired air flow rate corresponding to the first desired level of cooling and a second desired air flow rate corresponding to the second desired level of cooling, and bases the air flow rate on the greater of the first desired air flow rate and the second desired air flow rate.

7. An electronic device comprising:
a heatsink;
a first dual IGBT coupled to the heatsink and configured to provide electrical power to a field exciter;
a second dual IGBT coupled to the heatsink and configured to provide electrical power to a battery;
a third dual IGBT coupled to the heatsink and common to the field exciter and the battery;
a temperature sensor disposed in the heatsink;
a cooling unit comprising a plenum and a variable source of air flow; and
a controller configured to:
receive a temperature reading from the temperature sensor and, based on the temperature reading, determine a first desired level of cooling and a first power level for the second dual IGBT and determine a second desired level of cooling and a second power level for the third dual IGBT; and
if the first power level is greater than the second power level, send signals corresponding to the first power level and the first desired level of cooling to the system controller, otherwise send signals corresponding to the second power level and the second desired level of cooling to the system controller, wherein the system controller controls the air flow rate based, at least in part, on the signals.

8. A power system for a vehicle comprising:
a double H-bridge comprising a heatsink, a first dual IGBT coupled to the heatsink and configured to provide electrical power to a field exciter, a second dual IGBT coupled to the heatsink configured to provide electrical power to a battery, and a third dual IGBT coupled to the heatsink and common to the field exciter and the battery charger;
a single temperature sensor disposed in the heatsink;
a cooling unit comprising a plenum and a variable source of air flow; and
a controller configured to:
receive a temperature reading from the single temperature sensor and, based on the temperature reading, determine desired levels of cooling for at least two of the dual IGBTs, wherein the desired levels of cooling are different from one another and an air flow rate provided by the cooling unit is determined based on the desired levels of cooling.

9. The power system of claim 8, wherein the controller is configured to estimate junction temperatures of the at least two of the dual IGBTs based, at least in part, on the temperature reading and the desired levels of cooling are determined based, at least in part, on the junction temperatures.

10. The power system of claim 8, wherein the at least two of the dual IGBTs comprise at least the second and third dual IGBTs, and wherein the temperature sensor is disposed between the second and third dual IGBT in the heatsink, and the controller is configured to estimate junction temperatures of at least the second and third dual IGBTs based on the temperature reading.

11. The power system of claim 8, wherein the controller is configured to estimate a power level of at least one of the dual IGBTs based, at least in part, on the desired load current and a time that the dual IGBT is commanded to switch on; and the desired level of cooling corresponding to the dual IGBT is based, at least in part, on the power level.

12. A power system for a vehicle comprising:
a double H-bridge comprising a heatsink, a first dual IGBT coupled to the heatsink and configured to provide electrical power to a field exciter, a second dual IGBT coupled to the heatsink configured to provide electrical power to a battery, and a third dual IGBT coupled to the heatsink and common to the field exciter and the battery charger;
a temperature sensor disposed in the heatsink;
a cooling unit comprising a plenum and a variable source of air flow; and
a controller configured to receive a temperature reading from the temperature sensor and, based on the temperature reading, determine a desired level of cooling for at least one of the dual IGBTs;
wherein an air flow rate provided by the cooling unit is determined based on the desired level of cooling, and wherein the controller determines a first desired level of cooling for the second dual IGBT and a second desired level of cooling for the third dual IGBT and sends signals corresponding to the first desired level of cooling and the second desired level of cooling to a system controller that controls the air flow rate based, at least in part, on the signals.

13. The power system of claim 12, wherein the system controller computes a first desired air flow rate corresponding to the first desired level of cooling and a second desired air flow rate corresponding to the second desired level of cooling, and bases the air flow rate on the greater of the first desired air flow rate and the second desired air flow rate.

14. The power system of claim 12, wherein the controller is configured to:
determine a first desired level of cooling and a first power level for the second dual IGBT;
determine a second desired level of cooling and a second power level for the third dual IGBT; and
if the first power level is greater than the second power level, send signals corresponding to the first power level and the first desired level of cooling to the system controller, otherwise send signals corresponding to the second power level and the second desired level of cooling to the system controller, wherein the system controller controls the air flow rate based, at least in part, on the signals.

* * * * *